(12) United States Patent
Olgado

(10) Patent No.: US 6,662,673 B1
(45) Date of Patent: Dec. 16, 2003

(54) LINEAR MOTION APPARATUS AND ASSOCIATED METHOD

(75) Inventor: Donald J. K. Olgado, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 205 days.

(21) Appl. No.: 09/684,500

(22) Filed: Oct. 6, 2000

Related U.S. Application Data

(63) Continuation-in-part of application No. 09/289,074, filed on Apr. 8, 1999, now Pat. No. 6,258,220.

(51) Int. Cl.[7] .......................... B25J 18/00; B21D 39/03; C25B 9/00
(52) U.S. Cl. ....................... 74/490.01; 29/428; 204/279
(58) Field of Search ................................ 204/198, 279; 29/792, 428, 701, 25.01; 74/490.01, 690.01; 414/744, 222.01, 729, 737

(56) References Cited

U.S. PATENT DOCUMENTS

| | | | |
|---|---|---|---|
| 3,727,620 A | 4/1973 | Orr ............................. | 134/95 |
| 3,770,598 A | 11/1973 | Creutz ...................... | 204/52 R |
| 4,027,686 A | 6/1977 | Shortes et al. ................ | 134/33 |
| 4,092,176 A | 5/1978 | Kozai et al. ................ | 134/186 |
| 4,110,176 A | 8/1978 | Creutz et al. ............. | 204/52 R |
| 4,113,492 A | 9/1978 | Sato et al. ...................... | 96/67 |
| 4,315,059 A | 2/1982 | Raistrick et al. ............ | 429/112 |
| 4,336,114 A | 6/1982 | Mayer et al. ............. | 204/52 R |
| 4,376,685 A | 3/1983 | Watson ...................... | 204/52 R |
| 4,405,416 A | 9/1983 | Raistrick et al. ............... | 204/68 |
| 4,428,815 A | 1/1984 | Powell et al. ................ | 204/297 |
| 4,435,116 A * | 3/1984 | Van Deberg ................ | 414/728 |
| 4,435,266 A | 3/1984 | Johnston ..................... | 204/276 |
| 4,489,740 A | 12/1984 | Rattan et al. ................ | 134/140 |
| 4,510,176 A | 4/1985 | Cuthbert et al. .............. | 427/82 |

(List continued on next page.)

FOREIGN PATENT DOCUMENTS

| | | | |
|---|---|---|---|
| DE | 3627560 A1 | 2/1988 | ............ B25J/13/08 |
| JP | 58182823 | 10/1983 | ......... H01L/21/288 |
| JP | 63118093 | 5/1988 | ............ C25D/5/18 |
| JP | 04131395 | 5/1992 | ............ C25D/5/34 |
| JP | 04280993 | 10/1992 | ............ C25D/5/18 |

(List continued on next page.)

OTHER PUBLICATIONS

PCT International Search Report dated Oct. 17, 2002.
Australian Patent Office Written Opinion from SG 9906158–2, Dated Mar. 5, 2002.
Graham, Kenneth A., *Electroplating Engineering Handbook*, 2nd Edition. (Copy not available to Applicant at this time) (No Date).

(List continued on next page.)

*Primary Examiner*—Donald R. Valentine
(74) *Attorney, Agent, or Firm*—Moser, Patterson & Sheridan, L.L.P.

(57) ABSTRACT

A guide apparatus comprising a plurality of guide linkages. Each one of the plurality of guide linkages comprises a pair of linkage members, each pair of the linkage members are rotatably connected about a guide pivot axis. The guide pivot axis of each guide linkage is arranged in a direction opposed to the direction of the guide pivot axis of the remainder of the guide linkages. In one aspect, each guide linkage is arranged between a robot platform or a cassette and a base such that extending each of the plurality of guide linkages acts to linearly displace the robot platform relative to the base while limiting tilting of the robot platform or the cassette. In another aspect a robot can extend its end effectors while limiting tilting of the end effectors.

31 Claims, 28 Drawing Sheets

U.S. PATENT DOCUMENTS

| | | | |
|---|---|---|---|
| 4,518,678 A | 5/1985 | Allen | 430/311 |
| 4,519,846 A | 5/1985 | Aigo | 134/15 |
| 4,543,033 A * | 9/1985 | Czermak et al. | 414/732 |
| 4,693,805 A | 9/1987 | Quazi | 204/192.22 |
| 4,732,785 A | 3/1988 | Brewer | 427/240 |
| 5,039,381 A | 8/1991 | Mullarkey | 204/47.5 |
| 5,055,425 A | 10/1991 | Leibovitz et al. | 437/195 |
| 5,092,728 A * | 3/1992 | Crabb et al. | 414/217 |
| 5,092,975 A | 3/1992 | Yamamura et al. | 204/198 |
| 5,100,502 A | 3/1992 | Murdoch et al. | 156/643 |
| 5,155,336 A | 10/1992 | Gronet et al. | 219/411 |
| 5,162,260 A | 11/1992 | Leibovitz et al. | 437/155 |
| 5,222,310 A | 6/1993 | Thompson et al. | 34/202 |
| 5,224,504 A | 7/1993 | Thompson et al. | 134/155 |
| 5,230,743 A | 7/1993 | Thompson et al. | 134/32 |
| 5,252,807 A | 10/1993 | Chizinsky | 219/390 |
| 5,256,274 A | 10/1993 | Poris | 205/123 |
| 5,259,407 A | 11/1993 | Tuchida et al. | 134/151 |
| 5,290,361 A | 3/1994 | Hayashida et al. | 134/2 |
| 5,316,974 A | 5/1994 | Crank | 437/190 |
| 5,328,589 A | 7/1994 | Martin | 205/289 |
| 5,349,978 A | 9/1994 | Sago et al. | 134/153 |
| 5,368,711 A | 11/1994 | Poris | 204/193 |
| 5,377,708 A | 1/1995 | Bergman et al. | 134/105 |
| 5,382,885 A | 1/1995 | Salcudean et al. | 318/568.11 |
| 5,415,890 A | 5/1995 | Kloiber et al. | 427/242 |
| 5,429,733 A | 7/1995 | Ishida | 204/224 R |
| 5,447,615 A | 9/1995 | Ishida | 204/224 R |
| 5,516,412 A | 5/1996 | Andricacos et al. | 204/224 R |
| 5,536,135 A * | 7/1996 | Robertson | 414/728 |
| 5,608,943 A | 3/1997 | Konishi et al. | 15/302 |
| 5,625,170 A | 4/1997 | Poris | 177/50 |
| 5,651,865 A | 7/1997 | Sellers | 204/192.13 |
| 5,705,223 A | 1/1998 | Bunkofske | 427/240 |
| 5,718,813 A | 2/1998 | Drummond et al. | 204/192.12 |
| 5,723,028 A | 3/1998 | Poris | 204/231 |
| 5,743,705 A * | 4/1998 | Eissfeller | 414/749 |
| 5,789,890 A * | 8/1998 | Genov et al. | 318/567 |
| 5,811,951 A | 9/1998 | Young | 318/568.2 |
| 5,975,834 A | 11/1999 | Ogawa et al. | 414/744.5 |
| 6,071,388 A | 6/2000 | Uzoh | 204/297 R |
| 6,093,291 A | 7/2000 | Izumi et al. | 204/224 R |

FOREIGN PATENT DOCUMENTS

| | | | | |
|---|---|---|---|---|
| JP | | 6017291 | 1/1994 | C25D/7/12 |
| WO | WO 97/12079 | | 4/1997 | C25D/5/02 |
| WO | WO 99/16111 | | 4/1999 | H01L/21/00 |
| WO | WO 99/25902 | | 5/1999 | C25B/13/00 |
| WO | WO 99/25903 | | 5/1999 | C25D/5/00 |
| WO | WO 99/25904 | | 5/1999 | C25D/5/02 |
| WO | WO 99/25905 | | 5/1999 | C25D/5/02 |
| WO | WO 99/26275 | | 5/1999 | |

OTHER PUBLICATIONS

Lucio Colombo, "Wafer Back Surface Film Removal," Central R&D, SGS–Thompson, Microelectronics, Agrate, Italy, 6 pages. (No Date).

Semitool©, Inc., "Metallization & Interconnect," 1998, 4 pages. (No Month).

PCT International Search Report dated Feb. 7, 2000.

Kenneth E. Pitney, "NEY Contact Manual," Electrical Contacts for Low Energy Uses, 1973. (No Month).

Verteq Online©, "Products Overview," 1996–1998, 5 pages. (No Month).

Laurell Technologies Corporation, "Two control configurations available–see *WS 400 OR WS–400Lite*." Oct. 19, 1998, 6 pages.

Peter Singer, "Tantalum, Copper and Damascene: The Future of Interconnects," Semiconductor International Jun., 1998, pp. cover, 91–92,94,96 & 98.

Peter Singer, "Wafer Processing," Semiconductor International, Jun. 1998, p. 70.

* cited by examiner

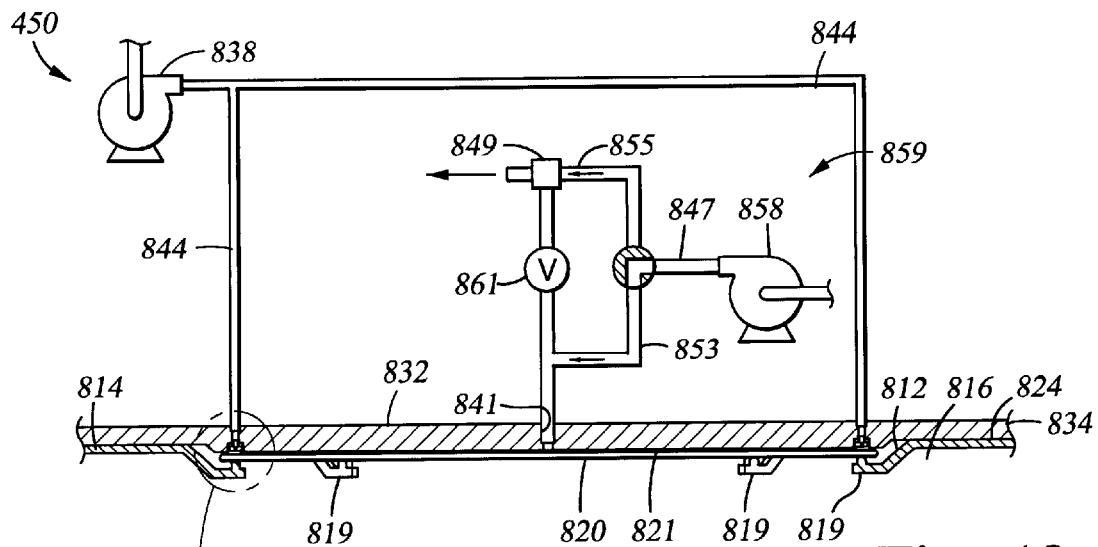
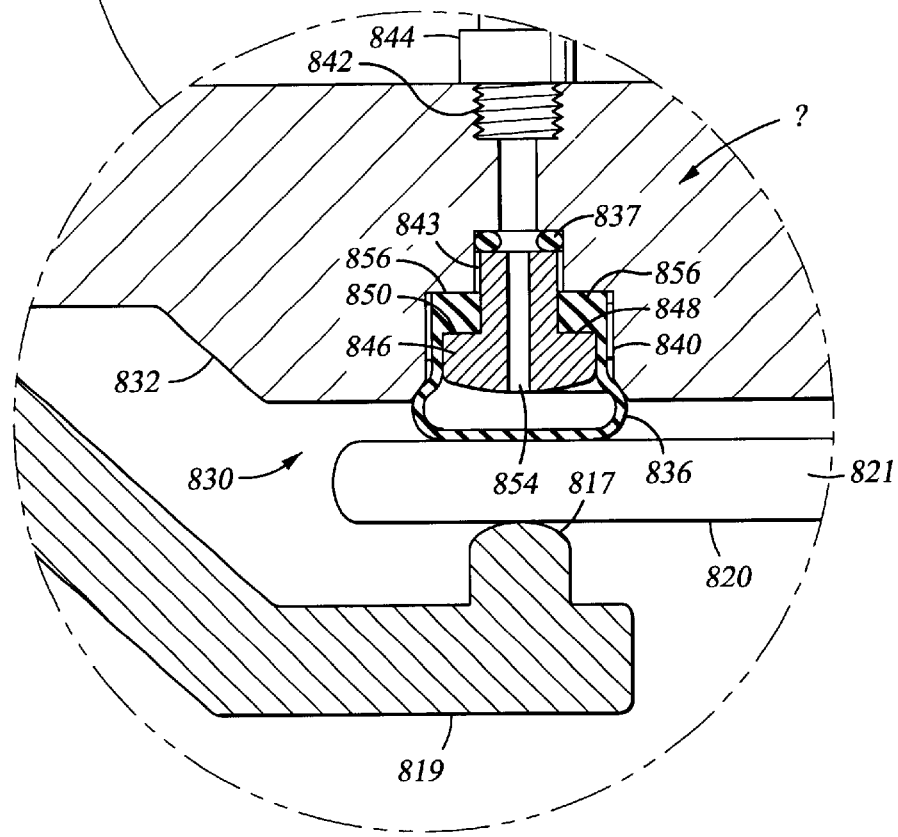
Fig. 12
Fig. 12A

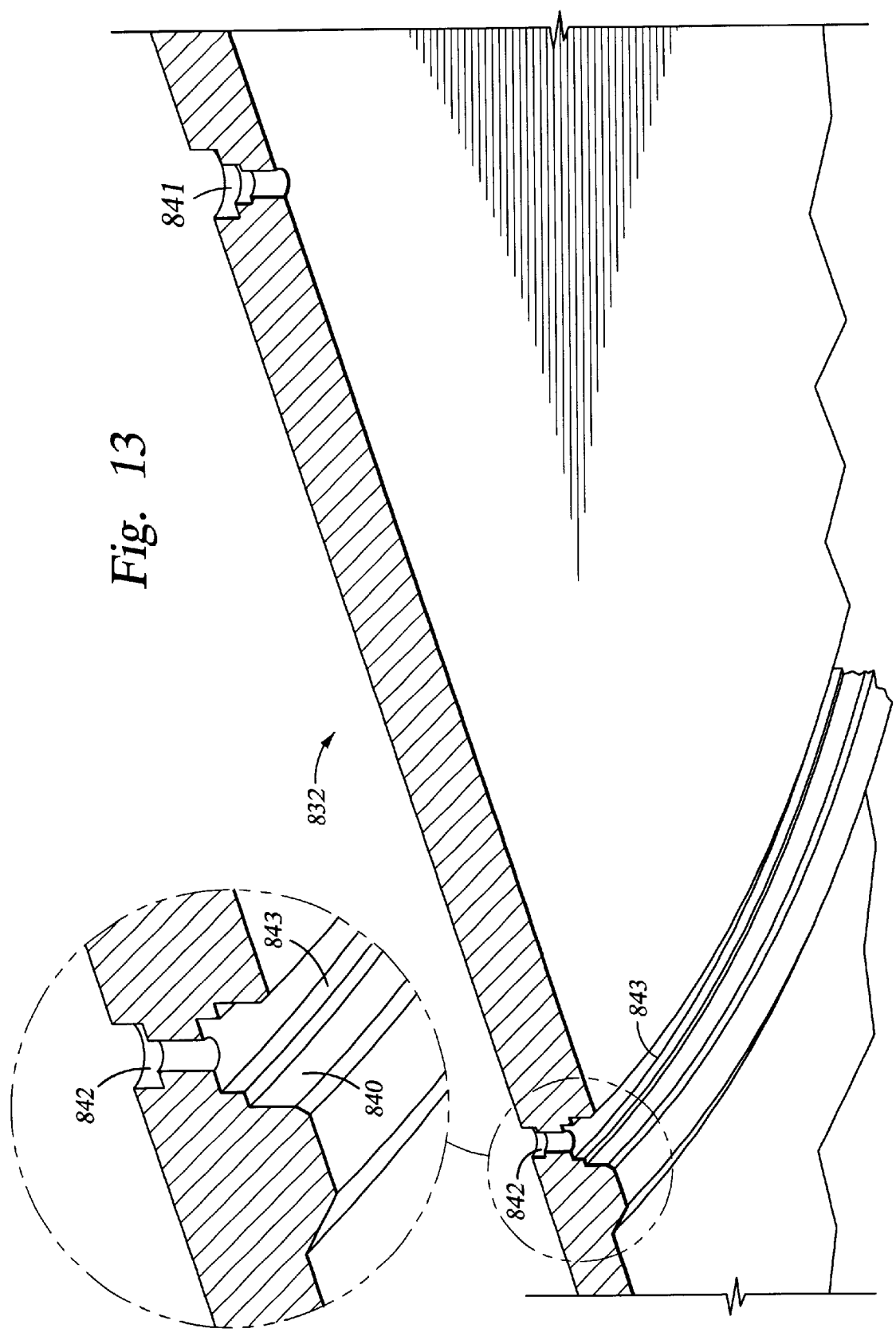

LINEAR MOTION APPARATUS AND ASSOCIATED METHOD

CONTINUATION PRIORITY STATEMENT

This is a continuation-in-part of prior parent U.S. patent application Ser. No. 09/289,074, filed Apr. 8, 1999 and entitled: "ELECTRO-CHEMICAL DEPOSITION SYSTEM" now U.S. Pat. No. 6,258,220.

BACKGROUND OF THE DISCLOSURE

1. Field of the Invention

The invention relates generally to a robot device lift. More particularly, the invention relates to a robot lift or a robot arm that displaces the robot while maintaining the substrate within a series of parallel planes.

2. Description of the Background Art

Substrates such as semiconductor wafers, substrates, or displays such as light emitting diode (LED) displays are processed to produce integrated circuits using a series of processes. These processes are often performed in a variety of process chambers. Other chambers known as metrology chambers are used to measure substrates. An assemblage of process or metrology chambers, or a combination of the two, served by a substrate transport robot in a non-linear configuration is known as a cluster tool. Each robot typically resides in a transfer chamber that is connected to each of the plurality of process chambers such that the robot can access semiconductor substrates in each of the process chambers.

Providing robot designs that can efficiently transfer substrates between, and within, multiple process chambers that are positioned in different orientations and vertical levels improves applicability of the robot over robot designs that are limited to transfer substrates only between process chambers positioned at the same vertical level.

End effectors, also known as robot blades, are configured to support substrates to provide for transfer of the substrates to/from the process cells. Linear motion of end effectors is one of the basic motions associated with robot travel. There are multiple elements that are desired to be linearly displaced in a semiconductor process chamber or cluster tool environment while allowing the end effector to follow a series of parallel planes. For example, robot lifts are provided that vertically displace a plate that a robot is mounted on, to a variety of different vertical positions as the robot is maintained in a substantially horizontal orientation. Load locks are often used to transfer semiconductor substrates between the interior and the exterior of a cluster tool, individual process chamber, or between different segments of a cluster tool. A cassette is integrated into the load lock and contains a plurality of vertically-spaced slots, a substrate can fit in each slot. The cassettes are typically displaced vertically to align different cassette slots with a robot end effector for loading or unloading of the substrates into the cassette slots.

Robot arms are used to linearly extend end effectors in certain applications. Linear adjustment of an end effector in a robot can be accomplished either by the robot linearly displacing its end effector, or by linearly displacing the platform on which the robot is mounted. In load locks, for example, the linear adjustment of the cassette slots can be accomplished by linearly adjusting the entire cassette. The mechanism that linearly adjusts the robot platform can be structurally similar to the mechanism that linearly adjusts the position of the cassette. A telescoping member is commonly used to linearly displace the robot base. Such telescoping members are typically relatively complex and expensive to construct, and suffer from production of a considerable amount of dirt, e.g., oil, grease, metal shavings, a variety of particulate matter, etc. The telescoping member is also likely to become misaligned after extended use due to its inherent structural complexity. In semiconductor applications, precision is very important during the robot transfer of substrates and other objects using robots, robot arms, and load locks. The precision of motion in robot applications often dictates the type of equipment that may be used to produce the robot motion.

Commonly used linear robot extension devices applied to semiconductor applications produce a considerable amount of dirt. Such linear robot extension devices often rely upon linear drive devices. The linear drive devices are configured with a sliding "car" that is constrained to follow a guide, and often uses gears to provide the motion. Such relative mechanical sliding/contacting motion requires an undesirable amount of lubricants to lubricate the contacting surfaces, the lubricants also produce an undesirable amount of dirt. Such dirt is especially undesirable in such a clean environment as semiconductor processing. Further, it is difficult to contain such dirt produced in prior art linear robot extension devices since the linear motor typically has an extended vertical travel path that is necessary to transfer substrates between vertically-spaced semiconductor applications. Accordingly, the extended vertical travel path allows the dirt to become distributed through the system.

Therefore, a need exists in the art for an apparatus or method that can linearly displace a robot and/or a cassette while limiting tilting of the robot/cassette. Such an apparatus or method should be configured to maintain as clean an environment as possible during use.

SUMMARY OF THE INVENTION

A method and associated apparatus includes a guide apparatus comprising a plurality of guide linkages. Each one of the plurality of guide linkages comprises a pair of linkage members, each pair of the linkage members are rotatably connected about a guide pivot axis. The guide pivot axis of each guide linkage is arranged in a direction opposed to the direction of the guide pivot axis of the remainder of the guide linkages. In one aspect, each guide linkage is arranged between a robot platform or a cassette and a base such that extending each of the plurality of guide linkages acts to linearly displace the robot platform relative to the base while limiting tilting of the robot platform or the cassette. In another aspect a robot can extend its end effectors while limiting tilting of the end effectors.

BRIEF DESCRIPTION OF THE DRAWINGS

The teachings of the present invention can be readily understood by considering the following detailed description in conjunction with the accompanying drawings, in which:

FIG. 12 is a cross sectional view of one embodiment of a substrate assembly;

FIG. 12A is an enlarged cross sectional view of the bladder area of FIG. 12;

FIG. 13 is a partial cross sectional view of a substrate holder plate;

Figure 1:
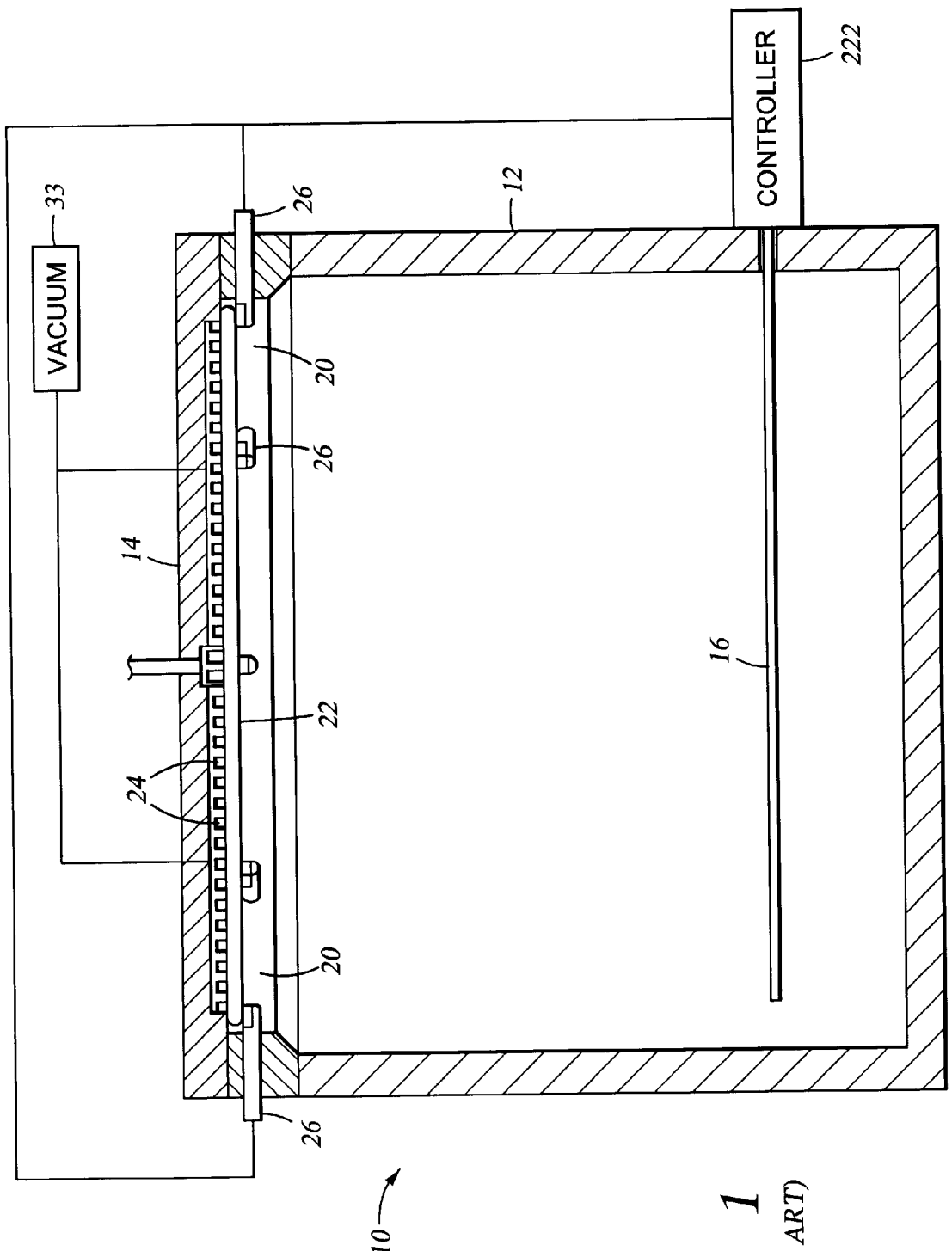
FIG. 1 is a cross sectional view of one embodiment of fountain plater.

The terms "below", "above", "bottom", "top", "up", "down", "upper", and "lower" and other positional terms used herein are shown with respect to the embodiments in the figures and may be varied depending on the relative orientation of the processing apparatus. To facilitate understanding, identical reference numerals have been used, where possible, to designate identical elements that are common to the figures.

DETAILED DESCRIPTION

After considering the following description, those skilled in the art will clearly realize that the teachings of the invention can be readily utilized in robotic systems. The following embodiments relate to a linearly extending substrate lift for a robot platform in which the robot platform is maintained in a level orientation. In one embodiment, the linearly extending substrate lift for a robot platform is applied to electroplating systems.

Metal electroplating, in general, can be achieved by a variety of techniques. One embodiment of series of processes that include electroplating requires initially depositing a diffusion barrier layer upon the substrate. A seed layer, typically deposited by physical vapor deposition, is deposited to establish a plating surface on the substrate on which metal can be deposited. A metal deposition film is then deposited by electroplating to thicken portions of the seed layer. The seed layer is typically formed from the same material as the subsequently deposited metal film layer, for example copper. Finally, the deposited layers can be planarized by another process, e.g., chemical mechanical polishing (CMP), to define a conductive interconnect feature. Deposition of a metal film by electroplating is accomplished by establishing a voltage/current level between the seed layer deposited on the substrate and a separate anode that is sufficient to deposit a desired amount of metal film onto the seed layer. Both the anode and the cathode are immersed in an electrolyte solution containing metal ions on the substrate to form metal film.

Figure 2:
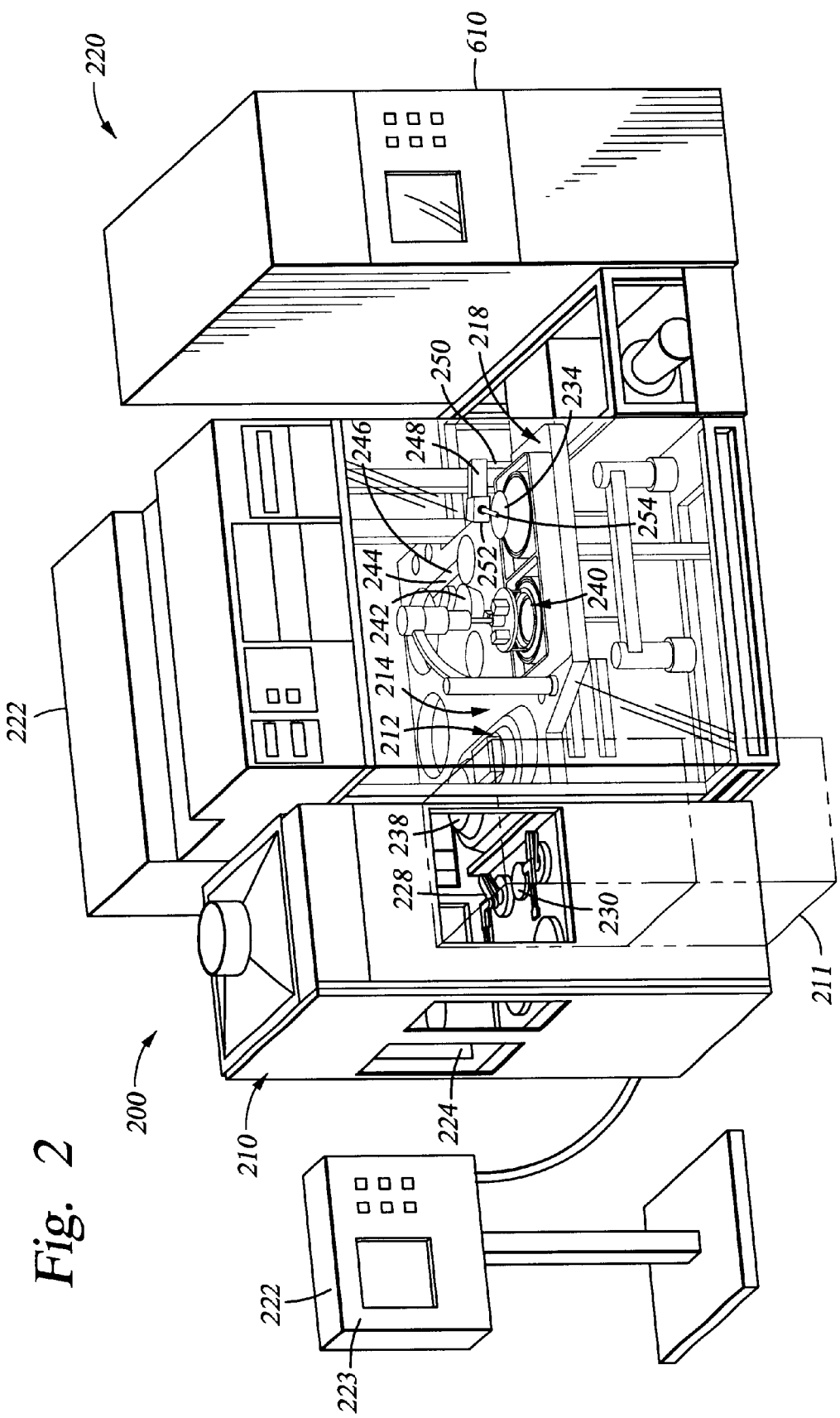
FIG. 2 is a perspective view of one embodiment of electroplating system platform.

An embodiment of a linearly extending substrate lift, as described below, is applied to an electroplating system platform 200 as shown in FIG. 2. The configuration and operation of the substrate lift is then detailed. Embodiments of drives associated with the substrate lift are then described. The application of the substrate lift is intended to be descriptive in nature and not limiting in scope. Any use of a linearly extending lift mechanism to lift a platform on which a robot or cassette is mounted is within the intended scope of certain embodiments of the substrate lift mechanism.

1. Electroplating System Configuration

FIG. 1 shows a cross sectional view of a simplified typical fountain plater 10 that is used in electroplating, and may be a component of a cluster tool. Generally, the fountain plater 10 includes an electrolyte cell 12 having a top opening, a substrate holder device 14 disposed above the electrolyte cell 12, an anode 16 disposed at a bottom portion of the electrolyte cell 12, and a contact ring 20 contacting the substrate 22. A plurality of grooves 24 are formed in the lower surface of the substrate holder device 14. A vacuum pump, not shown, is coupled to the substrate holder device 14 and communicates with the grooves 24 to create a vacuum condition capable of securing the substrate 22 to the substrate holder device 14 during processing. The contact ring 20 comprises a plurality of metallic or semi-metallic contacts 26 distributed about the peripheral portion of the substrate 22 to define a central substrate plating surface. Each contact 26 extends radially inwardly over a narrow perimeter portion of the substrate 22 and contacts a conductive seed layer of the substrate 22 at the tips of the contacts 26. A controller 222 or power supply, not shown, is attached to the contacts 26 thereby providing an electrical bias to the substrate 22. The substrate 22 is positioned above the cylindrical electrolyte cell 12 and electrolyte flow impinges perpendicularly on the substrate plating surface during operation of the electrolyte cell 12.

Figure 3:
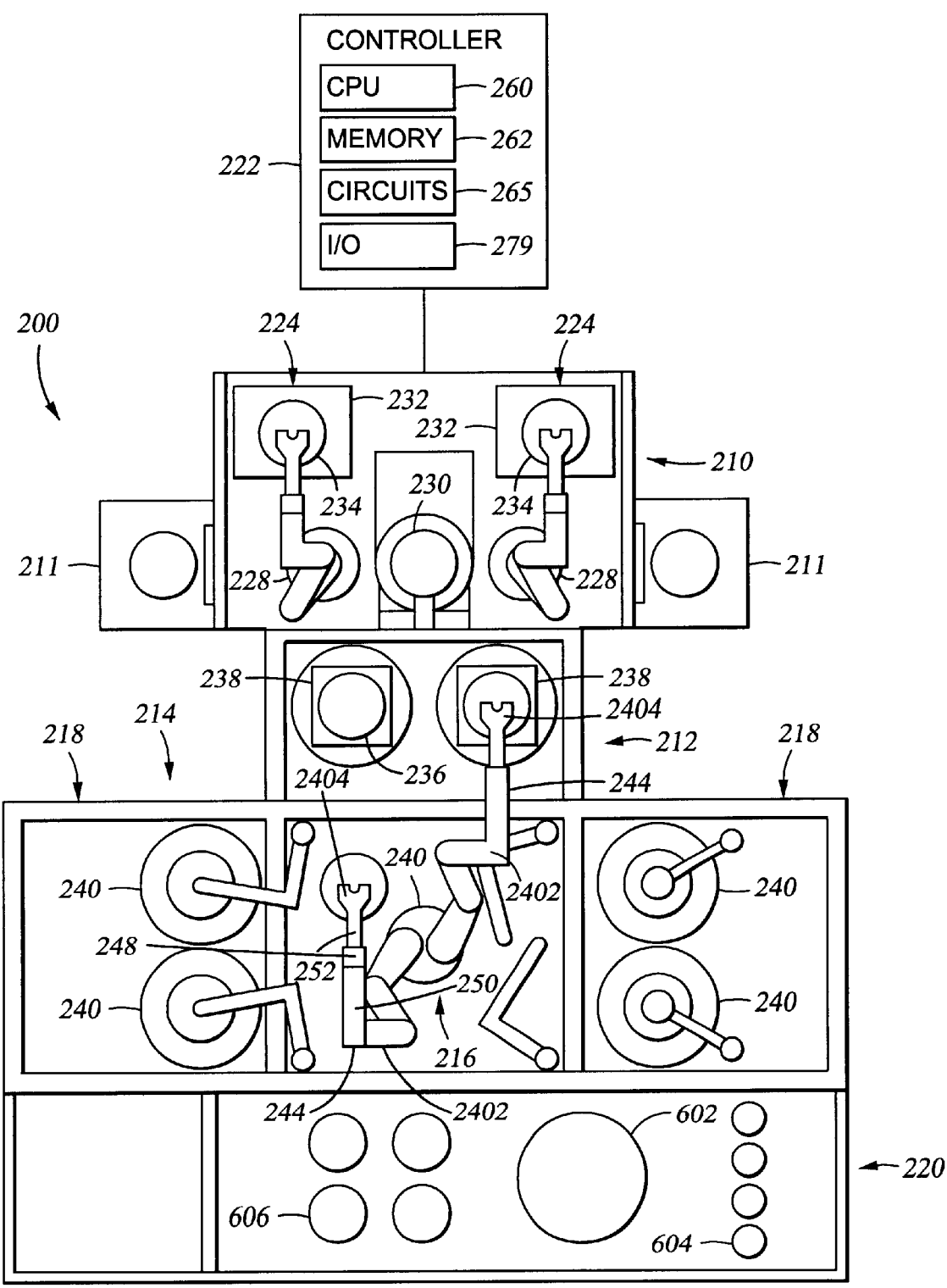
FIG. 3 is a schematic view of one embodiment of an electroplating system platform.

FIG. 2 is a perspective view of one embodiment of an electroplating system platform 200. FIG. 3 is a schematic view of one embodiment of an electroplating system platform 200. Referring to both FIGS. 2 and 3, the electroplating system platform 200 generally comprises a loading station 210, a thermal anneal chamber 211, a spin-rinse-dry (SRD) station 212, a mainframe 214, and an electrolyte replenishing system 220. Preferably, the electroplating system platform 200 is enclosed in a clean environment using panels made from such material as PLEXIGLAS® (a registered trademark of the Rohm and Haas Company of West Philadelphia, Pa.). The mainframe 214 generally comprises a mainframe transfer station 216 and a plurality of processing stations 218. Each processing station 218 includes one or more process cells 240. The electrolyte replenishing system 220 is positioned adjacent the electroplating system platform 200 and connected to the process cells 240 individually to circulate electrolyte used for the electroplating process. The electroplating system platform 200 also includes a control system 222, typically comprising a programmable microprocessor.

The loading station 210 preferably includes one or more substrate cassette receiving areas 224, one or more loading station transfer robots 228 and at least one substrate orientor 230. The number of substrate cassette receiving areas, loading station transfer robots 228 and substrate orientor included in the loading station 210 can be configured according to the desired throughput of the system. As shown for one embodiment in FIGS. 2 and 3, the loading station 210 includes two substrate cassette receiving areas 224, two loading station transfer robots 228 and one substrate orientor 230. A substrate cassette 232 containing substrates 234 is mounted within the substrate cassette receiving area 224 to introduce substrates 234 into the electroplating system platform. The loading station transfer robot 228 transfers substrates 234 between the substrate cassette 232 and the substrate orientor 230. The loading station transfer robot 228 comprises a typical transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal anneal chamber 211.

Figure 4:
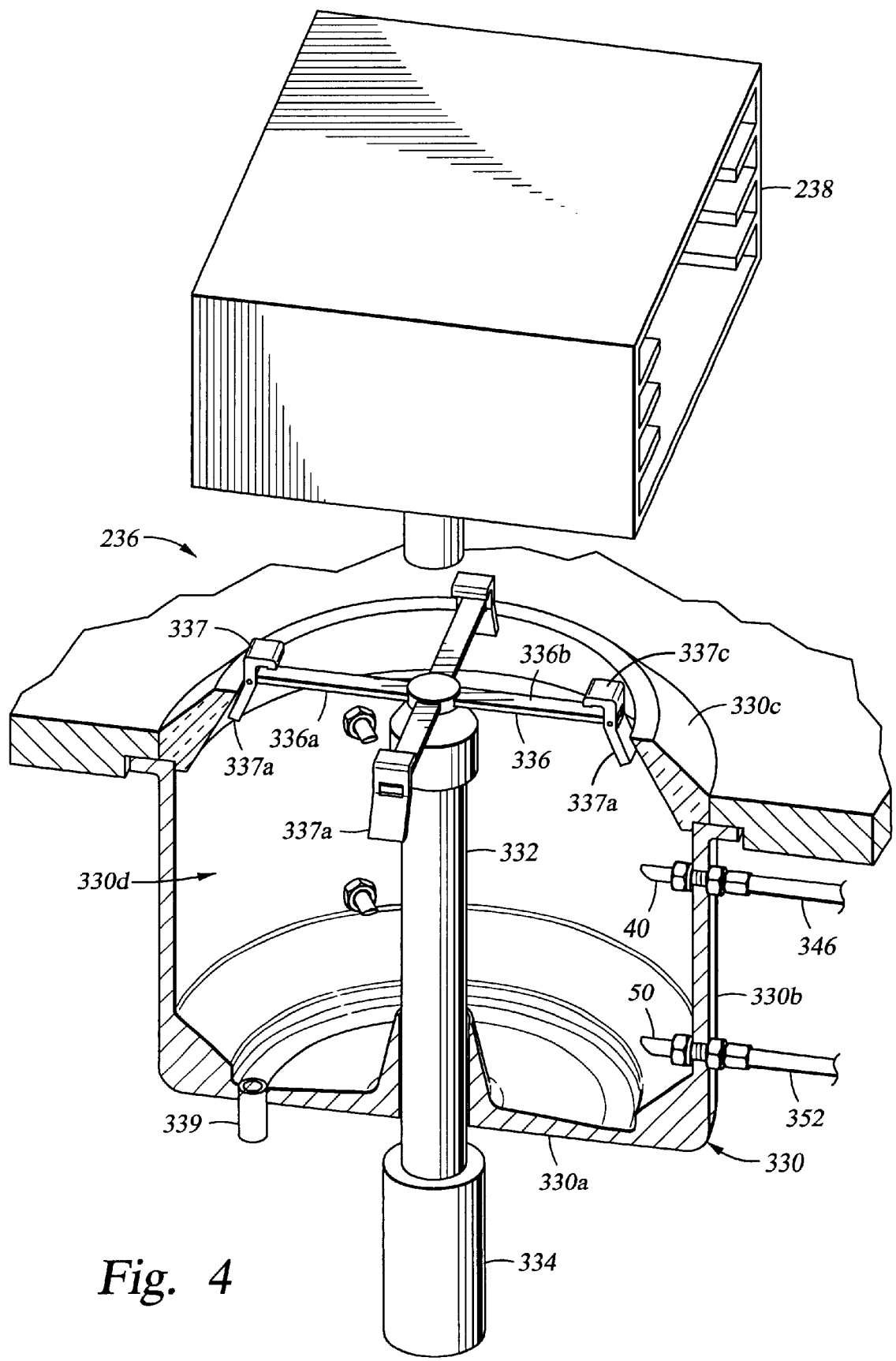
FIG. 4 is a schematic perspective view of one embodiment of a spin-rinse-dry (SRD) module, incorporating rinsing and dissolving fluid inlets.
Figure 5:
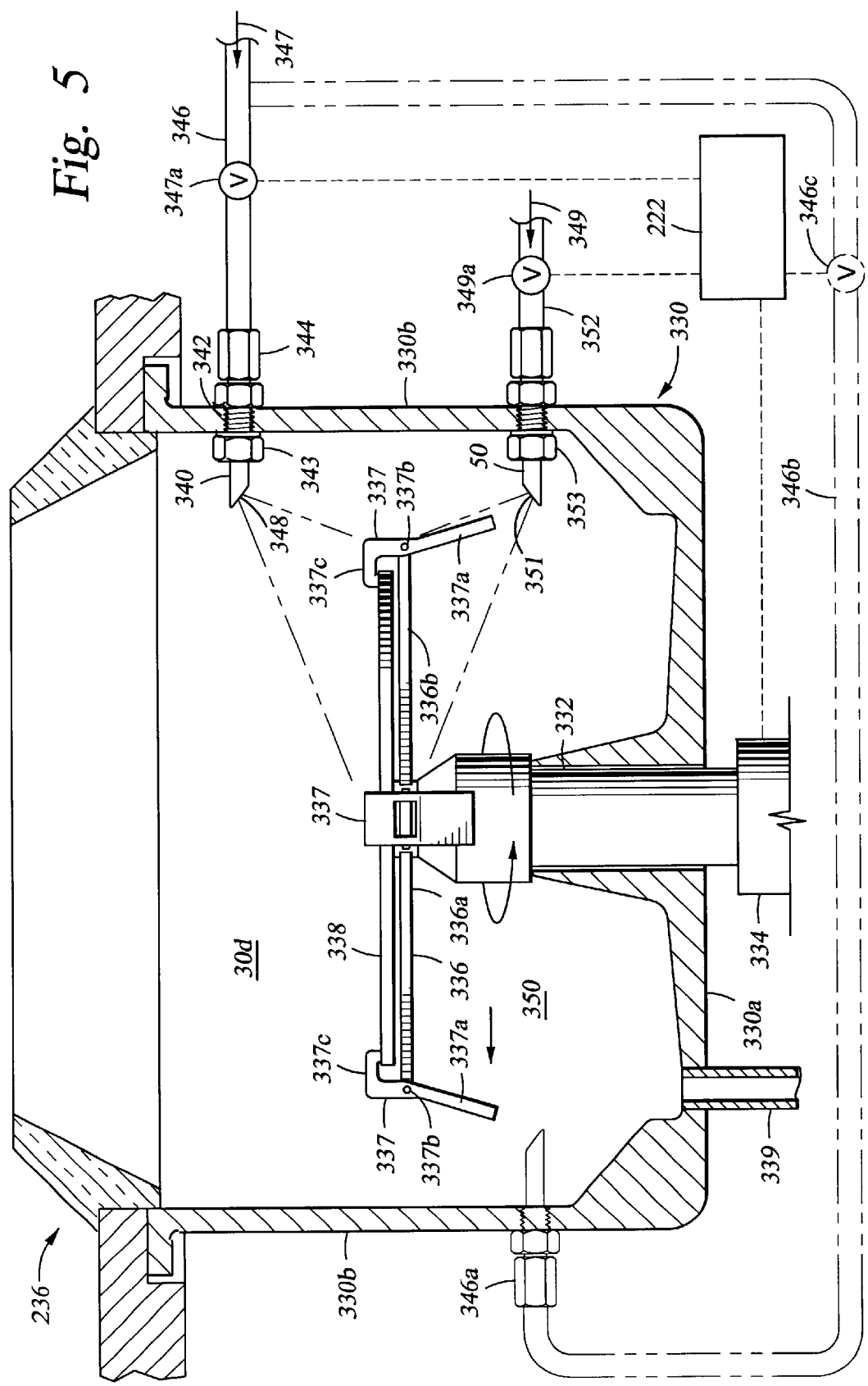
FIG. 5 is a side cross sectional view of the SRD module of FIG. 4 and shows a substrate in a processing position vertically disposed between fluid inlets.

FIG. 4 is a schematic perspective view of one embodiment of a spin-rinse-dry (SRD) module, incorporating rinsing and dissolving fluid inlets. FIG. 5 is a side cross sectional view of the SRD module of FIG. 4 and shows a substrate in a processing position vertically disposed between fluid inlets. Preferably, the SRD station 212 includes one or more SRD modules 236 and one or more substrate pass-through cassettes 238. Preferably, the SRD station 212 includes two SRD modules 236 corresponding to the number of loading station transfer robots 228, and a substrate pass-through cassette 238 is positioned above each SRD module 236. The substrate pass-through cassette 238 facilitates substrate transfers between the loading station 210 and the mainframe 214. The substrate pass-through cassette 238 provides access to and from both the loading station transfer robot 228 and a robot in the mainframe transfer station 216.

Referring to FIGS. 4 and 5, the SRD module 236 comprises a bottom 330a and a sidewall 330b, and an upper shield 330c which collectively define a SRD module bowl 330d, where the shield attaches to the sidewall and assists in retaining the fluids within the SRD module. Alternatively, a removable cover could also be used. A pedestal 336, located in the SRD module, includes a pedestal support 332 and a pedestal actuator 334. The pedestal 336 supports the substrate 338, shown in FIG. 5, on the pedestal upper surface during processing. The pedestal actuator 334 rotates the pedestal to spin the substrate and raises and lowers the pedestal as described below. The substrate may be held in place on the pedestal by a plurality of clamps 337. The clamps pivot with centrifugal force and engage the substrate preferably in the edge exclusion zone of the substrate. In one embodiment, the clamps engage the substrate only when the substrate lifts off the pedestal during the processing. Vacuum passages, not shown, may also be used as well as other holding elements. The pedestal has a plurality of pedestal arms 336a and 336b, so that the fluid through the second nozzle may impact as much surface area on the lower surface of the substrate as is practical. An outlet 339 allows fluid to be removed from the SRD module.

A first conduit 346, through which a first fluid 347 flows, is connected to a valve 347a. The conduit 346 may be hose, pipe, tube, or other fluid containing conduits. The valve 347a controls the flow of the first fluid 347 and may be selected from a variety of valves including a needle, globe, butterfly, or other valve types and may include a valve actuator, such as a solenoid, that can be controlled with a controller 222. The conduit 346 connects to a first fluid inlet 340 that is located above the substrate and includes a mounting portion 342 to attach to the SRD module and a connecting portion 344 to attach to the conduit 346. The first fluid inlet 240 is shown with a single first nozzle 348 to deliver the first fluid 347 under pressure onto the substrate upper surface. However, multiple nozzles could be used and multiple fluid inlets could be positioned about the inner perimeter of the SRD module. Preferably, nozzles placed above the substrate should be outside the diameter of the substrate to lessen the risk of the nozzles dripping on the substrate. The first fluid inlet 340 could be mounted in a variety of locations, including through a cover positioned above the substrate. Additionally, the nozzle 348 may articulate to a variety of positions using an articulating member 343, such as a ball and socket joint.

Similar to the first conduit and related elements described above, a second conduit 352 is connected to a control valve 349a and a second fluid inlet 350 with a second nozzle 351. The second fluid inlet 350 is shown below the substrate and angled upward to direct a second fluid under the substrate through the second nozzle 351. Similar to the first fluid inlet, the second fluid inlet may include a plurality of nozzles, a plurality of fluid inlets and mounting locations, and a plurality of orientations including using the articulating member 353. Each fluid inlet could be extended into the SRD module at a variety of positions. For instance, if the flow is desired to be a certain angle that is directed back toward the SRD module periphery along the edge of the substrate, the nozzles could be extended radially inward and the discharge from the nozzles be directed back toward the SRD module periphery.

The controller 222 could individually control the two fluids and their respective flow rates, pressure, and timing, and any associated valving, as well as the spin cycle(s). The controller 222 could be remotely located, for instance, in a control panel or control room and the plumbing controlled with remote actuators. An alternative embodiment, shown in dashed lines, provides an auxiliary fluid inlet 346*a* connected to the first conduit 346 with a conduit 346*b* and having a control valve 346*c*, which may be used to flow a rinsing fluid on the backside of the substrate after the dissolving fluid is flowed without having to reorient the substrate or switch the flow through the second fluid inlet to a rinsing fluid.

In one embodiment, the substrate is mounted with the deposition surface of the disposed face up in the SRD module bowl. As will be explained below, for such an arrangement, the first fluid inlet would generally flow a rinsing fluid, typically deionized water or alcohol. Consequently, the backside of the substrate would be mounted facing down and a fluid flowing through the second fluid inlet would be a dissolving fluid, such as an acid, including hydrochloric acid, sulfuiric acid, phosphoric acid, hydrofluoric acid, or other dissolving liquids or fluids, depending on the material to be dissolved. Alternatively, the first fluid and the second fluid are both rinsing fluids, such as deionized water or alcohol, when the desired process is to rinse the processed substrate.

In operation, the pedestal is in a raised position, shown in FIG. 4, and a robot, not shown, places the substrate, front side up, onto the pedestal. The pedestal lowers the substrate to a processing position where the substrate is vertically disposed between the first and the second fluid inlets. Generally, the pedestal actuator rotates the pedestal between about 5 to about 5000 rpm, with a typical range between about 20 to about 2000 rpm for a 200 mm substrate. The rotation causes the lower end 337*a* of the clamps to rotate outward about pivot 337*b*, toward the periphery of the SRD module sidewall, due to centrifugal force. The clamp rotation forces the upper end 337*c* of the clamp inward and downward to center and hold the substrate 338 in position on the pedestal 336, preferably along the substrate edge. The clamps may rotate into position without touching the substrate and hold the substrate in position on the pedestal only if the substrate significantly lifts off the pedestal during processing. With the pedestal rotating the substrate, a rinsing fluid is delivered onto the substrate front side through the first fluid inlet 340. The second fluid, such as an acid, is delivered to the backside surface through the second fluid inlet to remove any unwanted deposits. The dissolving fluid chemically reacts with the deposited material and dissolves and then flushes the material away from the substrate backside and other areas where any unwanted deposits are located. In a preferred embodiment, the rinsing fluid is adjusted to flow at a greater rate than the dissolving fluid to help protect the front side of the substrate from the dissolving fluid. The first and second fluid inlets are located for optimal performance depending on the size of the substrate, the respective flow rates, spray patterns, and amount and type of deposits to be removed, among other factors. In some instances, the rinsing fluid could be routed to the second fluid inlet after a dissolving fluid has dissolved the unwanted deposits to rinse the backside of the substrate. In other instances, an auxiliary fluid inlet connected to flow rinsing fluid on the backside of the substrate could be used to rinse any dissolving fluid residue from the backside. After rinsing the front side and/or backside of the substrate, the fluid(s) flow is stopped and the pedestal continues to rotate, spinning the substrate, and thereby effectively drying the substrate surface.

The fluid(s) is generally delivered in a spray pattern, which may be varied depending on the particular nozzle spray pattern desired and may include a fan, jet, conical, and other patterns. One spray pattern for the first and second fluids through the respective fluid inlets, when the first fluid is a rinsing fluid, is fan pattern with a pressure of about 10 to about 15 pounds per square inch (psi) and a flow rate of about 1 to about 3 gallons per minute (gpm) for a 200 mm substrate.

Certain embodiments of SRD systems could also be used to remove the unwanted deposits along the edge of the substrate to create an edge exclusion zone. By adjustment of the orientation and placement of the nozzles, the flow rates of the fluids, the rotational speed of the substrate, and the chemical composition of the fluids, the unwanted deposits could be removed from the edge and/or edge exclusion zone of the substrate as well. Thus, substantially preventing dissolution of the deposited material on the front side surface may not necessarily include the edge or edge exclusion zone of the substrate. Also, preventing dissolution of the deposited material on the front side surface is intended to include at least preventing the dissolution so that the front side with the deposited material is not impaired beyond a commercial value.

One method of accomplishing the edge exclusion zone dissolution process is to rotate the disk at a slower speed, such as about 100 to about 1000 rpm, while dispensing the dissolving fluid on the backside of the substrate. Inertia moves the dissolving fluid to the edge of the substrate and forms a layer of fluid around the edge due to surface tension of the fluid, so that the dissolving fluid overlaps from the backside to the front side in the edge area of the substrate. The rotational speed of the substrate and the flow rate of the dissolving fluid may be used to determine the extent of the overlap onto the front side. For instance, a decrease in rotational speed or an increase in flow results in a less overlap of fluid to the opposing side, e.g., the front side. Additionally, the flow rate and flow angle of the rinsing fluid delivered to the front side can be adjusted to offset the layer of dissolving fluid onto the edge and/or frontside of the substrate. In some instances, the dissolving fluid may be used initially without the rinsing fluid to obtain the edge and/or edge exclusion zone removal, followed by the rinsing/dissolving process.

The SRD module 236 is connected between the loading station 210 and the mainframe 214. The mainframe transfer station 216 includes a mainframe transfer robot 242. Preferably, the mainframe transfer robot 242 comprises a plurality of individual robot arms 244 that provides independent access of substrates in the processing stations 218 and the SRD stations 212. As shown in FIG. 3, the mainframe transfer robot 242 comprises two robot arms 244, corresponding to the number of process cells 240 per processing station 218. Each robot arm 244 includes a robot blade 246 for holding a substrate during a substrate transfer. Preferably, each robot arm 244 is operable independently of the other arm to facilitate independent transfers of substrates in the system. Alternatively, the robot arms 244 operate in a coordinated fashion such that one robot extends as the other robot arm retracts.

Preferably, the mainframe transfer station 216 includes a flipper robot 248 that facilitates transfer of a substrate from a face-up position on the robot blade 246 of the mainframe transfer robot 242 to a face down position for a process cell 240 that requires face-down processing of substrates. The flipper robot 248 includes a main body 250 that provides both vertical and rotational movements with respect to a vertical axis of the main body 250 and a flipper robot arm 252 that provides rotational movement along a horizontal plane along the flipper robot arm 252. Preferably, a vacuum suction gripper 254, disposed at the distal end of the flipper robot arm 252, holds the substrate as the substrate is flipped and transferred by the flipper robot 248. The flipper robot 248 positions a substrate 234 into the process cell 240 for face-down processing. The details of the electroplating process cell.

Figure 24:
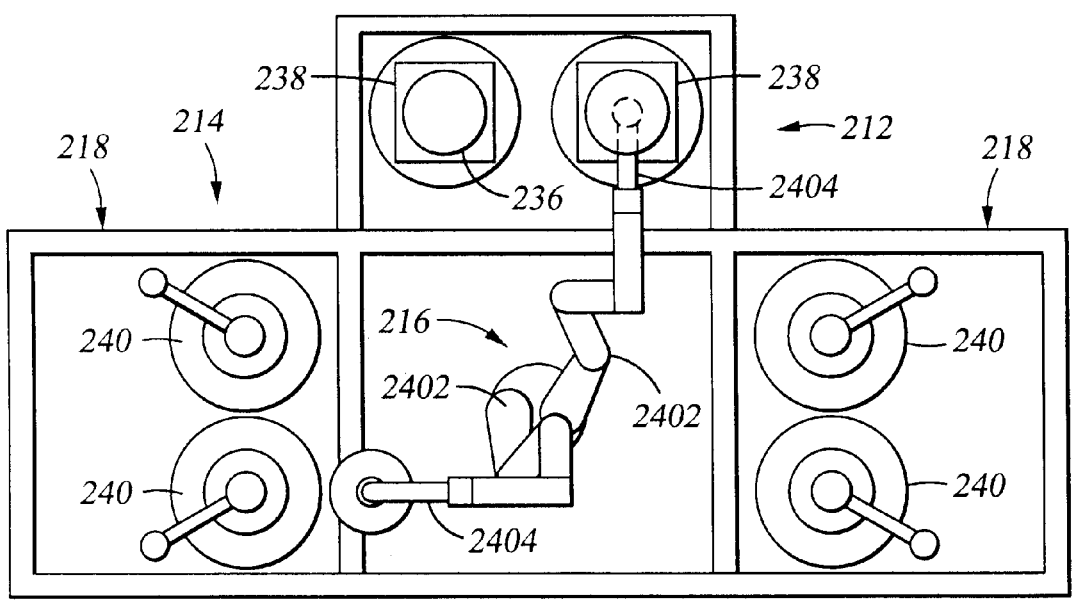
FIG. 24 is a top schematic view of a mainframe having a flipper robot incorporated therein.

FIG. 24 is a top schematic view of a mainframe transfer robot having a flipper robot incorporated therein. The mainframe transfer robot 242 serves to transfer substrates between different stations attached the mainframe station, including the processing stations 218 and the SRD stations 212. The mainframe transfer robot 242 includes a plurality of robot arms 2402, two are shown, and a flipper robot end effector 2404 is attached as an end effector for each of the robot arms 2402. Flipper robots are generally known in the art and can be attached as end effectors for substrate handling robots, such as model RR701, available from Rorze Automation, Inc., located in Milpitas, Calif. The main transfer robot 242 having a flipper robot as the end effector is capable of transferring substrates between different stations attached to the mainframe as well as flipping the substrate being transferred to the desired surface orientation, i e., substrate processing surface being face-down for the electroplating process. Preferably, the mainframe transfer robot 242 provides independent robot motion along the X-Y-Z axes by the robot arm 2402 and independent substrate flipping rotation by the flipper robot end effector 2404. By incorporating the flipper robot end effector 2404 as the end effector of the mainframe transfer robot, the substrate transfer process is simplified because the step of passing a substrate from a mainframe transfer robot to a flipper robot is eliminated.

Figure 6:
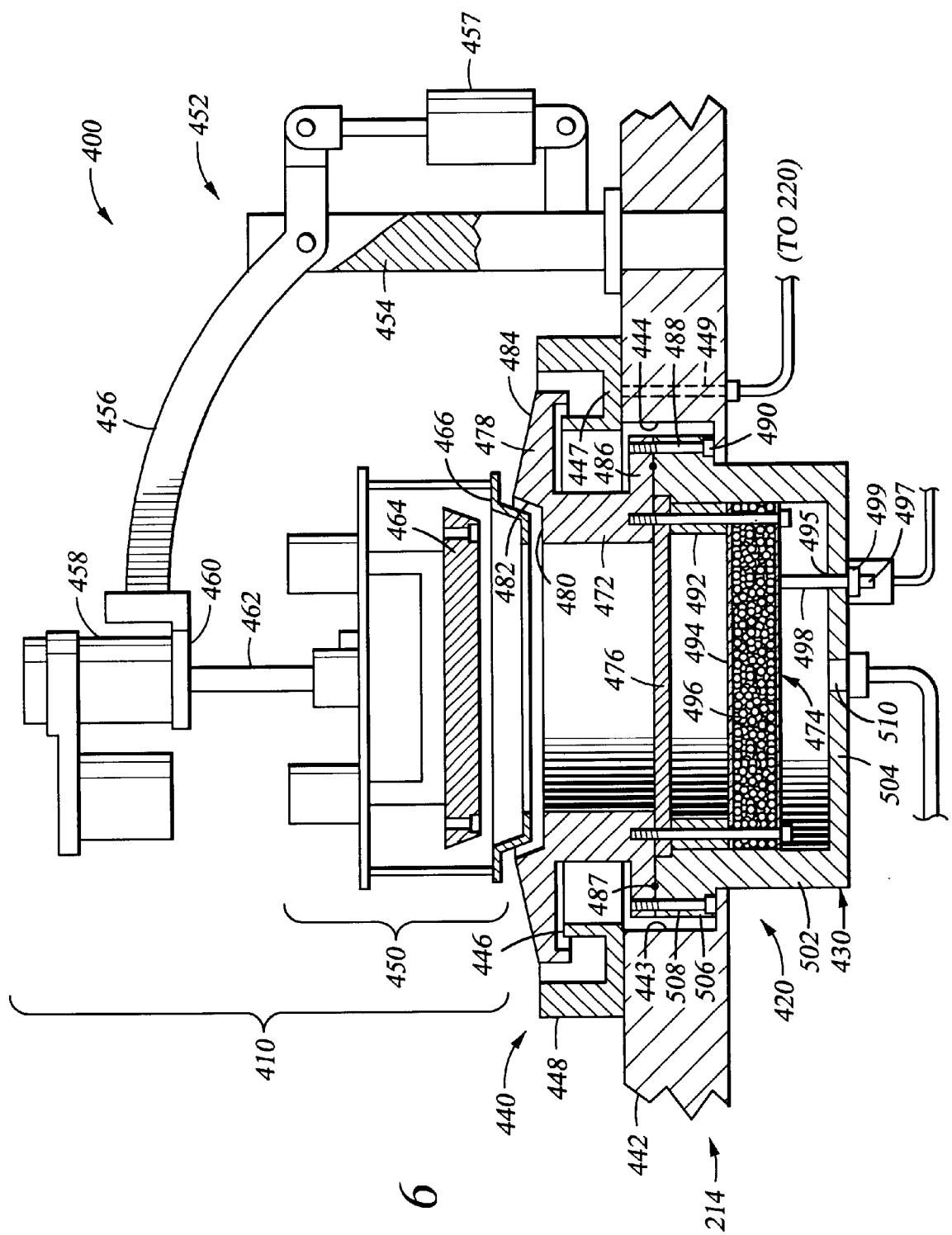
FIG. 6 is a cross sectional view of one embodiment of an electroplating process cell.

FIG. 6 is a cross sectional view of an electroplating process cell 400. The electroplating process cell 400 as shown in FIG. 6 is one embodiment of electroplating process cell 240 as shown in FIGS. 2 and 3. The process cell 400 generally comprises a head assembly 410, a process kit 420 and an electrolyte collector 440. Preferably, the electrolyte collector 440 is secured onto the body 442 of the mainframe 214 over an opening 443 that defines the location for placement of the process kit 420. The electrolyte collector 440 includes an inner wall 446, an outer wall 448 and a bottom 447 connecting the walls. An electrolyte outlet 449 is disposed through the bottom 447 of the electrolyte collector 440 and connected to the electrolyte replenishing system 220, shown in FIG. 2, through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process kit 420 to provide the spacing required to remove and/or replace the process kit 420 from the electroplating process cell 400. When the cantilever arm actuator 457 is extended, the cantilever arm 456 moves the head assembly 410 toward the process kit 420 to position the substrate in the head assembly 410 in a processing position.

The head assembly 410 generally comprises a substrate holder assembly 450 and a substrate assembly actuator 458. The substrate assembly actuator 458 is mounted onto the mounting plate 460, and includes a head assembly shaft 462 extending downwardly through the mounting plate 460. The lower end of the head assembly shaft 462 is connected to the substrate holder assembly 450 to position the substrate holder assembly 450 in a processing position and in a substrate loading position.

Figure 7:
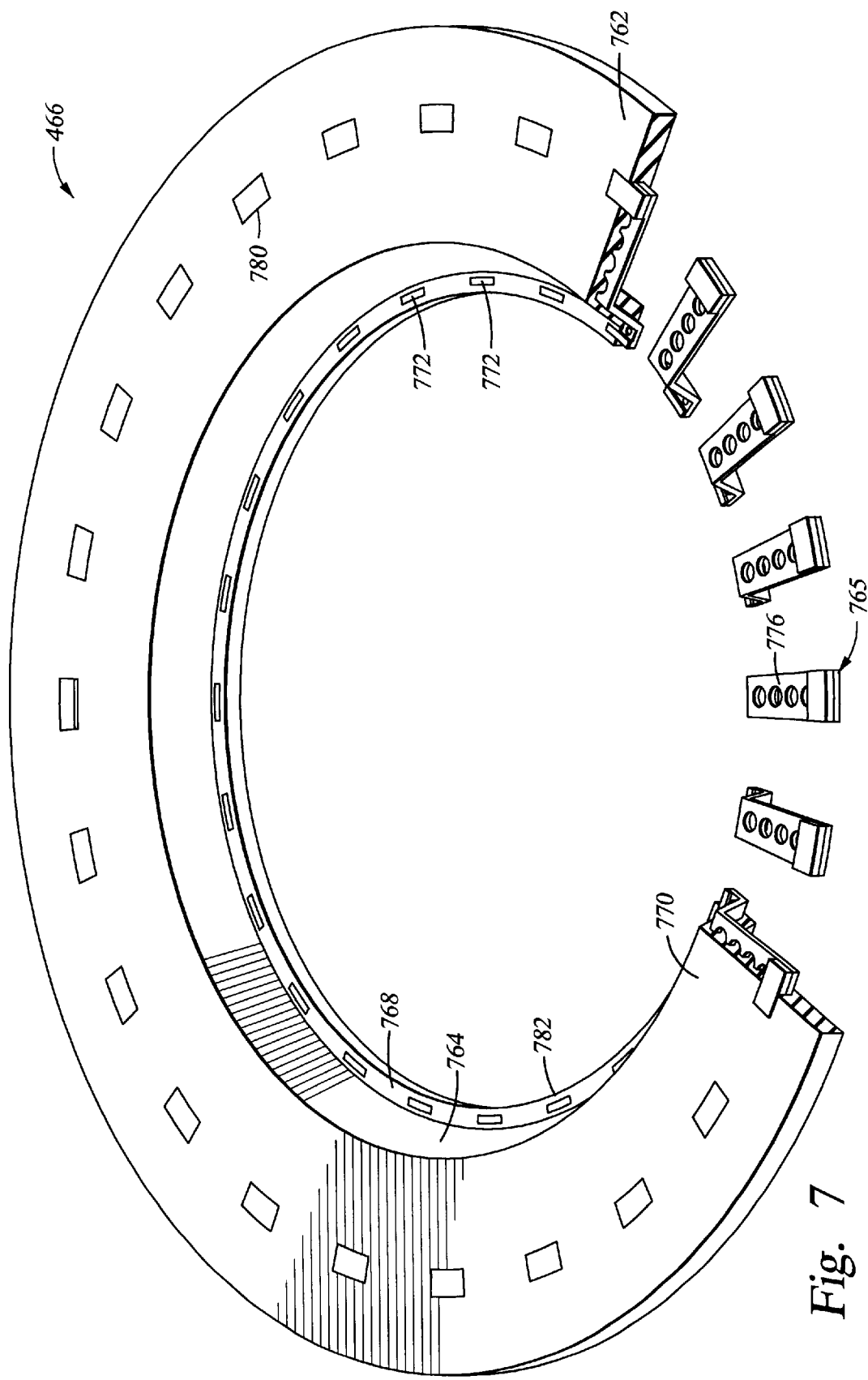
FIG. 7 is a partial cross sectional perspective view of a cathode contact ring.

The substrate holder assembly 450 generally comprises a substrate holder 464 and a cathode contact ring 466. FIG. 7 is a cross sectional view of one embodiment of a cathode contact ring 466. In general, the contact ring 466 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

Referring now to FIG. 7 in detail, the contact ring 466 generally comprises a plurality of conducting members 765 at least partially disposed within an annular insulative body 770. The insulative body 770 is shown having a flange 762 and a downward sloping shoulder portion 764 leading to a substrate seating surface 768 located below the flange 762 such that the flange 762 and the substrate seating surface 768 lie in offset and substantially parallel planes. Thus, the flange 762 may be understood to define a first plane while the substrate seating surface 768 defines a second plane parallel to the first plane wherein the shoulder 764 is disposed between the two planes. However, contact ring design shown in FIG. 7 is intended to be merely illustrative. In another embodiment, the shoulder portion 764 may be of a steeper angle including a substantially vertical angle so as to be substantially normal to both the flange 762 and the substrate seating surface 768. Alternatively, the contact ring 466 may be substantially planar thereby eliminating the shoulder portion 764. However, for reasons described below, a preferred embodiment comprises the shoulder portion 764 shown in FIG. 6 or some variation thereof.

The conducting members 765 are defined by a plurality of outer electrical contacts 780 annularly disposed on the flange 762, a plurality of inner electrical contacts 772 disposed on a portion of the substrate seating surface 768, and a plurality of embedded conducting connectors 776 which link the pads 772, 780 to one another. The conducting members 765 are isolated from one another by the insulative body 770 which may be made of a plastic such as polyvinylidenefluoride (PVDF), perfluoroalkoxy resin (PFA), TEFLON® (a trademark of the E.I. duPont de Nemoirs and Company of Wilmington, Del.), and TEFZEL® (a trademark of the E.I. duPont de Nemoirs and Company of Wilmington, Del.), or any other insulating material such as Alumina ($Al_2O_3$) or other ceramics. The outer contacts 780 are coupled to a power supply, not shown, to deliver current and voltage to the inner contacts 772 via the connectors 776 during processing. In turn, the inner contacts 772 supply the current and voltage to a substrate by maintaining contact around a peripheral portion of the substrate. Thus, in operation the conducting members 765 act as discrete current paths electrically connected to a substrate. Contact pads, contact pins, contact rods, or any other known type of electrical contacts are within the intended scope of the term "contact".

Low resistivity, and conversely high conductivity, are directly related to good plating. To ensure low resistivity, the conducting members 765 are preferably made of copper (Cu), platinum (Pt), tantalum (Ta), titanium (Ti), gold (Au), silver (Ag), stainless steel or other conducting materials. Low resistivity and low contact resistance may also be achieved by coating the conducting members 765 with a conducting material. Thus, the conducting members 765 may, for example, be made of copper that has a resistivity of approximately $2 \times 10^{-8} \Omega \cdot m$, coated with platinum that has a resistivity of approximately $10.6 \times 10^{-8} \Omega \cdot m$. Coatings such as tantalum nitride (TaN), titanium nitride (TiN), rhodium (Rh), Au, Cu, or Ag on a conductive base materials such as stainless steel, molybdenum (Mo), Cu, and Ti are also possible. Further, since the contacts 772, 780 are typically separate units bonded to the conducting connectors 776, the contacts 772, 780 may comprise one material, such as Cu, and the conducting members 765 another, such as stainless steel. Either or both of the pads 772, 180 and conducting connectors 776 may be coated with a conducting material. Additionally, because plating repeatability may be adversely affected by oxidation that acts as an insulator, the inner contacts 772 preferably comprise a material resistant to oxidation such as Pt, Ag, or Au.

Figures 8, 9:
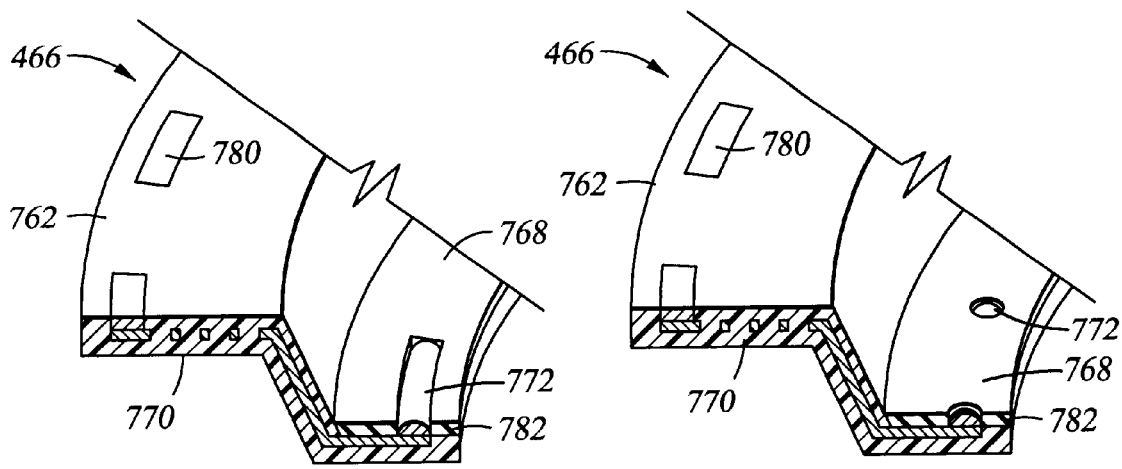
FIG. 8 is a cross sectional perspective view of the cathode contact ring showing an alternative embodiment of contacts.
FIG. 9 is a cross sectional perspective view of the cathode contact ring showing an alternative embodiment of the contacts and an isolation gasket.

In addition to being a function of the contact material, the total resistance of each circuit is dependent on the geometry, or shape, of the inner contact inner contacts 772 and the force supplied by the contact ring 466. These factors define a constriction resistance, $R_{CR}$, at the interface of the inner contacts 772 and the substrate seating surface 768 due to asperities between the two surfaces. Generally, as the applied force is increased the apparent area is also increased. The apparent area is, in turn, inversely related to $R_{CR}$ so that an increase in the apparent area results in a decreased $R_{CR}$. Thus, to minimize overall resistance it is preferable to maximize force. The maximum force applied in operation is limited by the yield strength of a substrate that may be damaged under excessive force and resulting pressure. However, because pressure is related to both force and area, the maximum sustainable force is also dependent on the geometry of the inner contacts 772. Thus, while the contacts 772 may have a flat upper surface as in FIG. 7, other shapes may be used to advantage. For example, two preferred shapes of contacts are shown in FIGS. 8 and 9. FIG. 8 shows a knife-edge contact pad and FIG. 9 shows a hemispherical contact pad. A person skilled in the art will readily recognize other shapes that may be used to advantage. A more complete discussion of the relation between contact geometry, force, and resistance is given in *Ney Contact Manual*, by Kenneth E. Pitney, The J. M. Ney Company, 1973, which is hereby incorporated by reference in its entirety.

The number of connectors 776 may be varied depending on the particular number of contacts 772 desired, shown in FIG. 7. For a 200 mm substrate, preferably at least twenty-four connectors 776 are spaced equally over 360°. However, as the number of connectors reaches a critical level, the compliance of the substrate relative to the contact ring 466 is adversely affected. Therefore, while more than twenty-four connectors 776 may be used, contact uniformity may eventually diminish depending on the topography of the contacts 772 and the substrate stiffness. Similarly, while less than twenty-four connectors 776 may be used, current flow is increasingly restricted and localized, leading to poor plating results. Since the dimensions of certain embodiments of connectors are readily altered to suit a particular application, for example, a 200 mm substrate or a 300 mm substrate. The optimal number of connectors may easily be determined for varying scales and embodiments.

Figure 10:
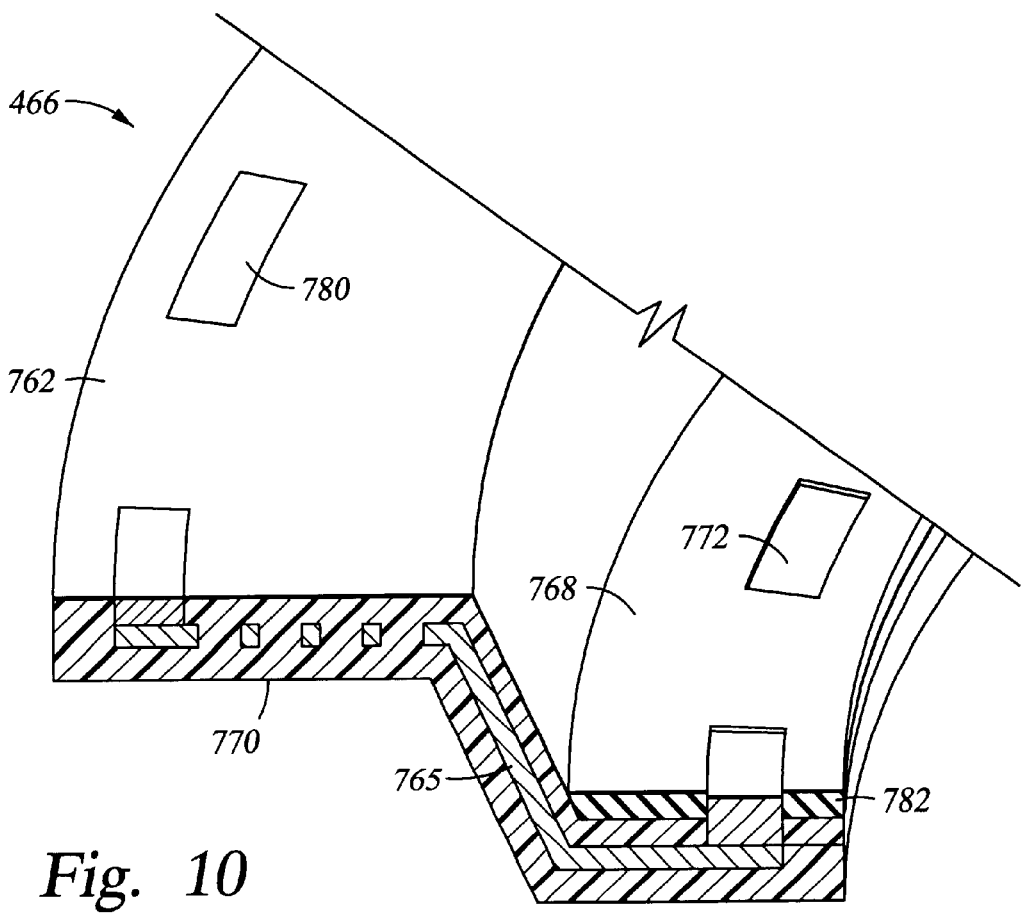
FIG. 10 is a cross sectional perspective view of the cathode contact ring showing the isolation gasket.

As shown in FIG. 10, the substrate seating surface 768 comprises an isolation gasket 782 disposed on the insulative body 770 and extending diametrically interior to the inner contacts 772 to define the inner diameter of the contact ring 466. The isolation gasket 782 preferably extends slightly above the inner contacts 772, e.g., a few mils, and preferably comprises an elastomer such as VITON® (a trademark of the E.I. duPont de Nemoirs and Company of Wilmington, Del.), TEFLON®, buna rubber and the like. Where the insulative body 770 also comprises an elastomer the isolation gasket 782 may be of the same material. In the latter embodiment, the isolation gasket 782 and the insulative body 770 may be monolithic, i.e., formed as a single piece. However, the isolation gasket 782 is preferably separate from the insulative body 770 so that it may be easily removed for replacement or cleaning.

While FIG. 10 shows a preferred embodiment of the isolation gasket 782 wherein the isolation gasket is seated entirely on the insulative body 770, FIGS. 8 and 9 show an alternative embodiment. In the latter embodiment, the insulative body 770 is partially machined away to expose the upper surface of the connecting member 776 and the isolation gasket 782 is disposed thereon. Thus, the isolation gasket 782 contacts a portion of the connecting member 776. This design requires less material to be used for the inner contacts 772 which may be advantageous where material costs are significant such as when the inner contacts 772 comprise gold.

During processing, the isolation gasket 782 maintains contact with a peripheral portion of the substrate plating surface and is compressed to provide a seal between the remaining cathode contact ring 466 and the substrate. The seal prevents the electrolyte from contacting the edge and backside of the substrate. As noted above, maintaining a clean contact surface is necessary to achieving high plating repeatability. Previous contact ring designs did not provide consistent plating results because contact surface topography varied over time. The contact ring limits, or substantially minimizes, deposits that would otherwise accumulate on the inner contacts 772 and change their characteristics thereby producing highly repeatable, consistent, and uniform plating across the substrate plating surface.

Figure 11:
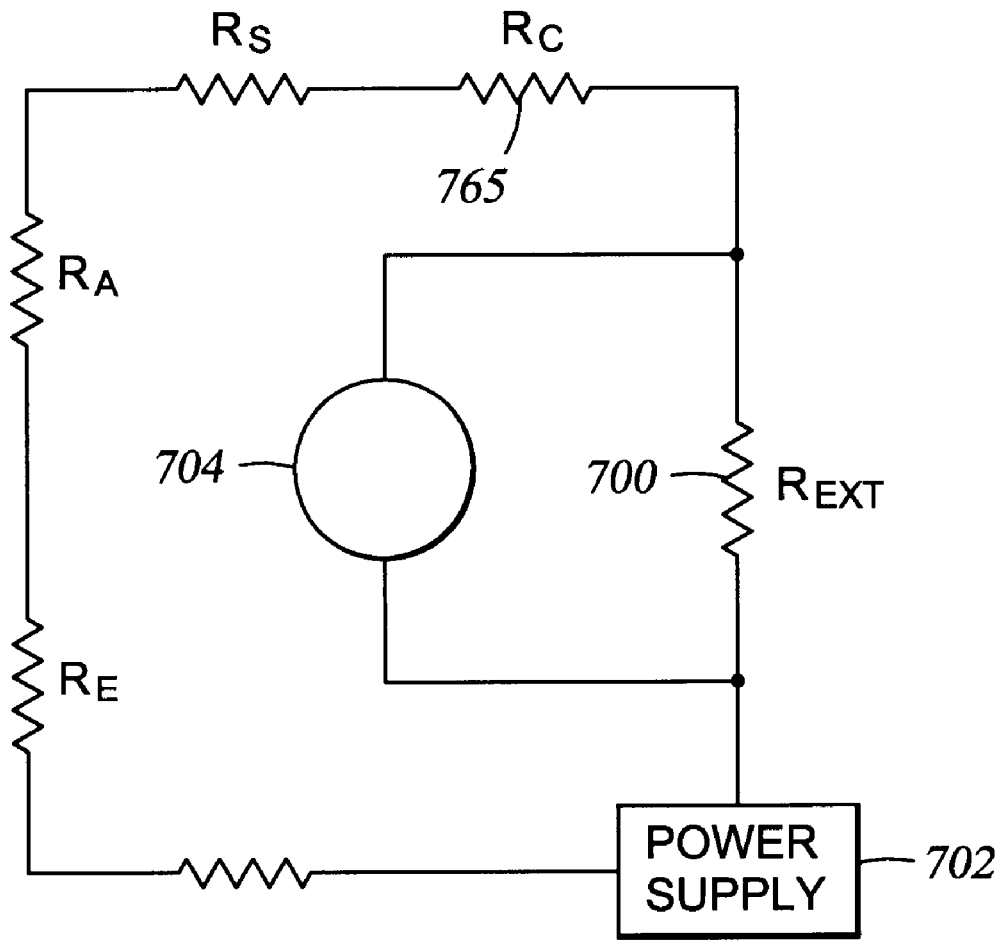
FIG. 11 is a simplified schematic diagram of the electrical circuit representing the electroplating system through each contact.

FIG. 11 is a simplified schematic diagram representing a possible configuration of the electrical circuit for the contact ring 466. To provide a uniform current distribution between the conducting members 765, an external resistor 700 is connected in series with each of the conducting members 765. Preferably, the resistance value of the external resistor 700, represented as $R_{EXT}$, is much greater than the resistance of any other component of the circuit. As shown in FIG. 11, the electrical circuit through each conducting member 765 is represented by the resistance of each of the components connected in series with the power supply 702. $R_E$ represents the resistance of the electrolyte, which is typically dependent on the distance between the anode and the cathode contact ring and the composition of the electrolyte chemistry. Thus, $R_A$ represents the resistance of the electrolyte adjacent the substrate plating surface 754. $R_S$ represents the resistance of the substrate plating surface 754, and $R_C$ represents the resistance of the cathode conducting members 765 plus the constriction resistance resulting at the interface between the inner contacts 772 and the substrate plating layer 754. Generally, the resistance value of the external resistor ($R_{EXT}$) is at least as much as $\Sigma R$ where $\Sigma R$ equals the sum of $R_E$, $R_A$, $R_S$ and $R_C$. Preferably, the resistance value of the external resistor ($R_{EXT}$) is much greater than $\Sigma R$ such that $\Sigma R$ is negligible and the resistance of each series circuit approximates $R_{EXT}$.

Typically, one power supply is connected to all of the outer contacts 780 of the cathode contact ring 466, resulting in parallel circuits through the inner contacts 772. However, as the inner contact-to-substrate interface resistance varies with each inner contact 772, more current will flow, and thus more plating will occur, at the site of lowest resistance. However, by placing an external resistor in series with each conducting member 765, the value or quantity of electrical current passed through each conducting member 765 becomes controlled mainly by the value of the external resistor. As a result, the variations in the electrical properties between each of the inner contacts 772 do not affect the current distribution on the substrate, and a uniform current density results across the plating surface which contributes to a uniform plating thickness. The external resistors also provide a uniform current distribution between different substrates of a process-sequence.

Although this embodiment of contact ring 466 is designed to resist deposit buildup on the inner contacts 772, over multiple substrate plating cycles the substrate-pad interface resistance may increase, eventually reaching an unacceptable value. An electronic sensor/alarm 704 can be connected across the external resistor 700 to monitor the voltage/current across the external resistor to address this problem. If the voltage/current across the external resistor 700 falls outside of a preset operating range that is indicative of a high substrate-pad resistance, the sensor/alarm 704 triggers corrective measures such as shutting down the plating process until the problems are corrected by an operator. Alternatively, a separate power supply can be connected to each conducting member 765 and can be separately controlled and monitored to provide a uniform current distribution across the substrate. A very smart system (VSS) may also be used to modulate the current flow. The VSS typically comprises a processing unit and any combination of devices known in the industry used to supply and/or control current such as variable resistors, separate power supplies, etc. As the physiochemical, and hence electrical, properties of the inner contacts 772 change over time, the VSS processes and analyzes data feedback. The data is compared to pre-established setpoints and the VSS then makes appropriate current and voltage alterations to ensure uniform deposition.

Figure 18:
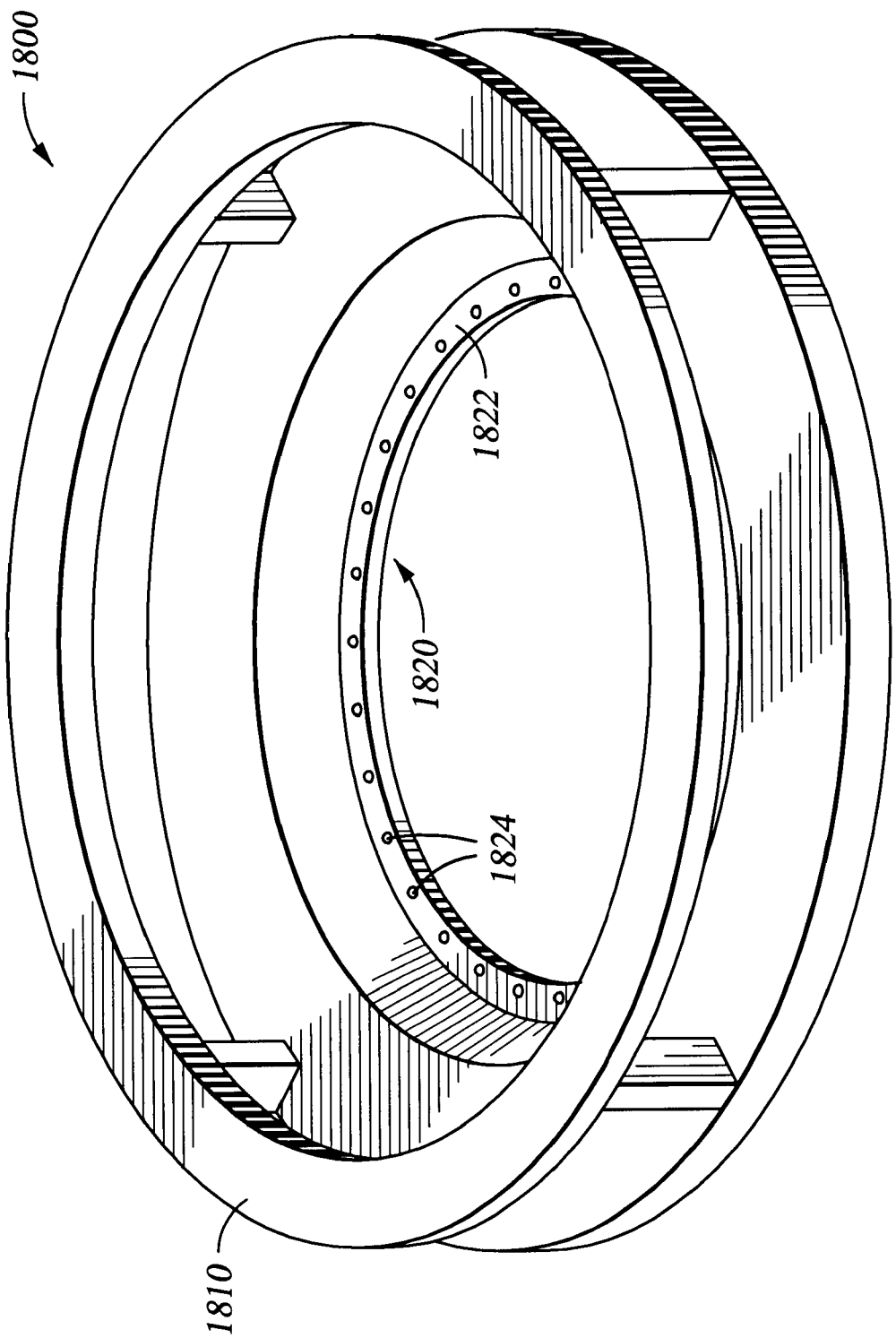
FIG. 18 is a perspective view of an alternative embodiment of a cathode contact ring.

FIG. 18 is a perspective view of an alternative embodiment of a cathode contact ring. The cathode contact ring 1800 as shown in FIG. 18 comprises a conductive metal or a metal alloy, such as stainless steel, copper, silver, gold, platinum, titanium, tantalum, and other conductive materials, or a combination of conductive materials, such as stainless steel coated with platinum. The cathode contact ring 1800 includes an upper mounting portion 1810 adapted for mounting the cathode contact ring onto the substrate holder assembly and a lower substrate receiving portion 1820 adapted for receiving a substrate therein. The substrate receiving portion 1820 includes an annular substrate seating surface 1822 having a plurality of contacts or bumps 1824 disposed thereon and preferably evenly spaced apart. When a substrate is positioned on the substrate seating surface 1822, the contacts 1824 physically contact a peripheral region of the substrate to provide electrical contact to the electroplating seed layer on the substrate deposition surface. Preferably, the contacts 1824 are coated with a noble metal, such as platinum or gold, which is resistant to oxidation.

The exposed surfaces of the cathode contact ring, except the surfaces of the contacts that come in contact with the substrate, are preferably treated to provide hydrophilic surfaces or coated with a material that exhibits hydrophilic properties. Hydrophilic materials and hydrophilic surface treatments are known in the art. One company providing a hydrophilic surface treatment is Millipore Corporation, located in Bedford, Mass. The hydrophilic surface significantly reduces beading of the electrolyte on the surfaces of the cathode contact ring and promotes smooth dripping of the electrolyte from the cathode contact ring after the cathode contact ring is removed from the electroplating bath or electrolyte. By providing hydrophilic surfaces on the cathode contact ring that facilitate run-off of the electrolyte, plating defects caused by residual electrolyte on the cathode contact ring are significantly reduced. The inventors also contemplate application of this hydrophilic treatment or coating in other embodiments of cathode contact rings to reduce residual electrolyte beading on the cathode contact ring and the plating defects on a subsequently processed substrate that may result therefrom.

Referring to FIGS. 12 and 12A, the substrate holder assembly 464 is preferably positioned above the cathode contact ring 466 and comprises a bladder assembly 470 that provides pressure to the backside of a substrate and ensures electrical contact between the substrate plating surface and the cathode contact ring 466. The inflatable bladder assembly 470 is disposed on a substrate holder plate 832. A bladder 836 disposed on a lower surface of the substrate holder plate 832 is thus located opposite and adjacent to the contacts on the cathode contact ring 466 with the substrate 821 interposed therebetween. A fluid source 838 supplies a fluid, i.e., a gas or liquid, to the bladder 836 allowing the bladder 836 to be inflated to varying degrees.

Referring now to FIGS. 12, 12A, and 13, the details of the bladder assembly 470 will be discussed. The substrate holder plate 832 is shown as substantially disc-shaped having an annular recess 840 formed on a lower surface and a centrally disposed vacuum port 841. One or more inlets 842 are formed in the substrate holder plate 832 and lead into the relatively enlarged annular mounting channel 843 and the annular recess 840. Quick-disconnect hoses 844 couple the fluid source 838 to the inlets 842 to provide a fluid thereto. The vacuum port 841 is preferably attached to a vacuum/pressure pumping system 859 adapted to selectively supply a pressure or create a vacuum at a backside of the substrate 821. The pumping system 859, shown in FIG. 12, comprises a pump 845, a cross-over valve 847, and a vacuum ejector 849, commonly known as a venturi. One vacuum ejector that may be used in this embodiment is available from SMC Pneumatics, Inc., of Indianapolis, Ind. The pump 845 may be a commercially available compressed gas source and is coupled to one end of a hose 851, the other end of the hose 851 being coupled to the vacuum port 841. The hose 851 is split into a pressure line 853 and a vacuum line 855 having the vacuum ejector 849 disposed therein. Fluid flow is controlled by the crossover valve 847 that selectively switches communication with the pump 845 between the pressure line 853 and the vacuum line 855. Preferably, the cross-over valve has an OFF setting whereby fluid is restricted from flowing in either direction through hose 851. A shut-off valve 861 disposed in hose 851 prevents fluid from flowing from pressure line 855 upstream through the vacuum ejector 849. Arrows indicate the desired direction of fluid flow.

Other modifications to the embodiments described are possible. For example, where the fluid source 838 is a gas supply it may be coupled to hose 851 thereby eliminating the need for a separate compressed gas supply, i.e., pump 845. Further, a separate gas supply and vacuum pump may supply the backside pressure and vacuum conditions. While it is preferable to allow for both a backside pressure as well as a backside vacuum, a simplified embodiment may comprise a pump capable of supplying only a backside vacuum. However, as will be explained below, deposition uniformity may be improved where a backside pressure is provided during processing. Therefore, an arrangement such as the one described above including a vacuum ejector and a cross-over valve is preferred.

Figure 14:
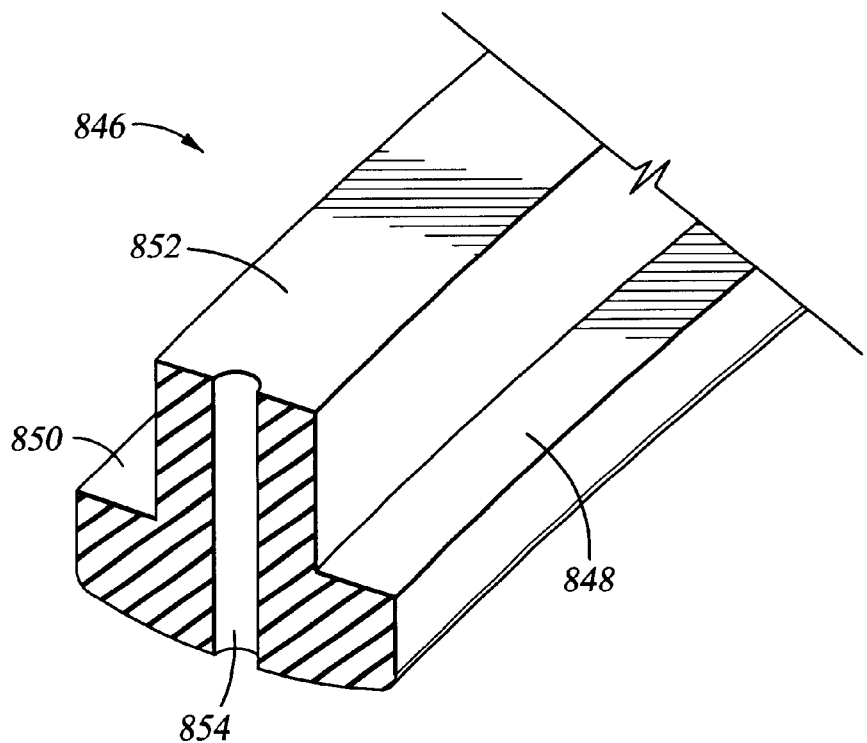
FIG. 14 is a partial cross sectional view of a manifold.

Referring now to FIGS. 12A and 14, a substantially circular ring-shaped manifold 846 is disposed in the annular recess 840. The manifold 846 comprises a mounting rail 852 disposed between an inner shoulder 848 and an outer shoulder 850. The mounting rail 852 is adapted to be at least partially inserted into the annular mounting channel 843. A plurality of fluid outlets 854 formed in the manifold 846 provide communication between the inlets 842 and the bladder 836. Seals 837, such as O-rings, are disposed in the annular manifold channel 843 in alignment with the inlet 842 and outlet 854 and secured by the substrate holder plate 832 to ensure an airtight seal. Conventional fasteners, not shown, such as screws may be used to secure the manifold 846 to the substrate holder plate 832 via cooperating threaded bores, not shown, formed in the manifold 846 and the substrate holder plate 832.

Figure 15:
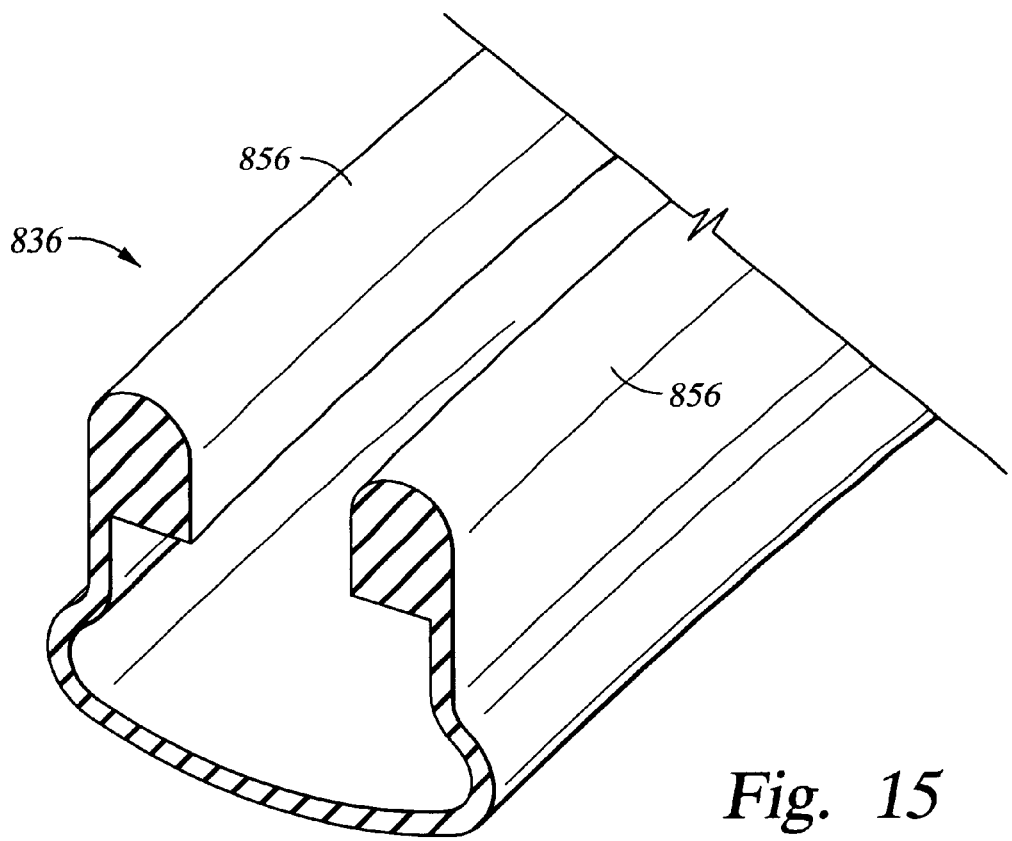
FIG. 15 is a partial cross sectional view of a bladder.

Referring now to FIG. 15, the bladder 836 is shown, in section, as an elongated substantially semi-tubular piece of material having annular lip seals 856, or nodules, at each edge. In FIG. 12A, the lip seals 856 are shown disposed on the inner shoulder 848 and the outer shoulder 850. A portion of the bladder 836 is compressed against the walls of the annular recess 840 by the manifold 846 which has a width slightly less, e.g. a few millimeters, than the annular recess 840. Thus, the manifold 846, the bladder 836, and the annular recess 840 cooperate to form a fluid-tight seal. To prevent fluid loss, the bladder 836 is preferably comprised of some fluid impervious material such as silicon rubber or any comparable elastomer which is chemically inert with respect to the electrolyte and exhibits reliable elasticity. Where needed a compliant covering 857 may be disposed over the bladder 836, as shown in FIG. 15, and secured by means of an adhesive or thermal bonding. The covering 857 preferably comprises an elastomer such as VITON®, buna rubber or the like, which may be reinforced by KEVLARE® (a registered trademark of the E.I. duPont de Nemoirs and Company of Wilmington, Del.), for example. In one embodiment, the covering 857 and the bladder 836 comprise the same material. The covering 857 has particular application where the bladder 836 is liable to rupturing. Alternatively, the bladder 836 thickness may simply be increased during its manufacturing to reduce the likelihood of puncture. Preferably, the exposed surface of the bladder 836, if uncovered, and the exposed surface of the covering 857 are coated or treated to provide a hydrophilic surface as discussed above for the surfaces of the cathode contact ring. The hydrophilic surface promotes dripping and removal of the residual electrolyte after the head assembly is lifted above the process cell.

The precise number of inlets 842 and outlets 854 may be varied according to the particular application. For example, while FIG. 12 shows two inlets with corresponding outlets, an alternative embodiment could employ a single fluid inlet that supplies fluid to the bladder 836.

In operation, the substrate 821 is introduced into the container body 802 by securing it to the lower side of the substrate holder plate 832. This is accomplished by engaging the pumping system 159 to evacuate the space between the substrate 821 and the substrate holder plate 832 via port 841 thereby creating a vacuum condition. The bladder 836 is then inflated by supplying a fluid such as air or water from the fluid source 838 to the inlets 842. The fluid is delivered into the bladder 836 via the manifold outlets 854, thereby pressing the substrate 821 uniformly against the contacts of the cathode contact ring 466. The electroplating process is then carried out. An electrolyte is then pumped into the process kit 420 toward the substrate 821 to contact the exposed substrate plating surface 820. The power supply provides a negative bias to the substrate plating surface 820 via the cathode contact ring 466. As the electrolyte is flowed across the substrate plating surface 820, ions in the electrolytic solution are attracted to the surface 820 and deposit on the surface 820 to form the desired metal film.

Because of its flexibility, the bladder 836 deforms to accommodate the asperities of the substrate backside and contacts of the cathode contact ring 466 thereby mitigating misalignment with the conducting cathode contact ring 466. The compliant bladder 836 prevents the electrolyte from contaminating the backside of the substrate 821 by establishing a fluid tight seal at a perimeter portion of a backside of the substrate 821. Once inflated, a uniform pressure is delivered downward toward the cathode contact ring 466 to achieve substantially equal force at all points where the substrate 821 and cathode contact ring 466 interface. The force can be varied as a function of the pressure supplied by the fluid source 838. Further, the effectiveness of the bladder assembly 470 is not dependent on the configuration of the cathode contact ring 466. For example, while FIG. 12 shows a pin configuration having a plurality of discrete contacts, the cathode contact ring 466 may also be a continuous surface.

Because the force delivered to the substrate 821 by the bladder 836 is variable, adjustments can be made to the current flow supplied by the contact ring 466. As described above, an oxide layer may form on the cathode contact ring 466 and act to restrict current flow. However, increasing the pressure of the bladder 836 may counteract the current flow restriction due to oxidation. As the pressure is increased, the malleable oxide layer is compromised and superior contact between the cathode contact ring 466 and the substrate 821 results. The effectiveness of the bladder 836 in this capacity may be further improved by altering the geometry of the cathode contact ring 466. For example, knife-edge geometry is likely to penetrate the oxide layer more easily than a dull rounded edge or flat edge.

Additionally, the fluid tight seal provided by the inflated bladder 836 allows the pump 845 to maintain a backside vacuum or pressure either selectively or continuously, before, during, and after processing. Generally, however, the pump 845 is run to maintain a vacuum only during the transfer of substrates to and from the electroplating process cell 400 because it has been found that the bladder 836 is capable of maintaining the backside vacuum condition during processing without continuous pumping. Thus, while inflating the bladder 836, as described above, the backside vacuum condition is simultaneously relieved by disengaging the pumping system 859, e.g., by selecting an OFF position on the cross-over valve 847. Disengaging the pumping system 859 may be abrupt or comprise a gradual process whereby the vacuum condition is ramped down. Ramping allows for a controlled exchange between the inflating bladder 836 and the simultaneously decreasing backside vacuum condition. This exchange may be controlled manually or by computer.

As described above, continuous backside vacuum pumping while the bladder 836 is inflated is not needed and may actually cause the substrate 820 to buckle or warp leading to undesirable deposition results. It may, however, be desirable to provide a backside pressure to the substrate 820 in order to cause a "bowing" effect of the substrate to be processed. Bowing of the substrate may result in superior deposition since altering the distance from any point on the substrate to the anode alters the electric current density at that point since the resistance of the electrolyte solution varies as a function of the distance from the anode to a point of the substrate through the electrolyte solution. Therefore, the bowing the substrate may result in altering the electric current density of one location on the seed layer that, prior to bowing, has a different relative electric current density than another unbowed location. The effect of the bowing may be to equalize the electric current densities at the two locations on the seed layer on the substrate. Thus, pumping system 859 is capable of selectively providing a vacuum or pressure condition to the substrate backside. For a 200 mm substrate a backside pressure up to 5 psi is preferable to bow the substrate. Because substrates typically exhibit some measure of pliability, a backside pressure causes the substrate to bow or assume a convex shape relative to the upward flow of the electrolyte. The degree of bowing is variable according to the pressure supplied by pumping system 859.

Those skilled in the art will readily recognize other embodiments. For example, while FIG. 12A shows a preferred bladder 836 having a surface area sufficient to cover a relatively small perimeter portion of the substrate backside at a diameter substantially equal to the cathode contact ring 466, the bladder assembly 470 may be geometrically varied. Thus, the bladder assembly may be constructed using more fluid impervious material to cover an increased surface area of the substrate 821.

Figure 19:
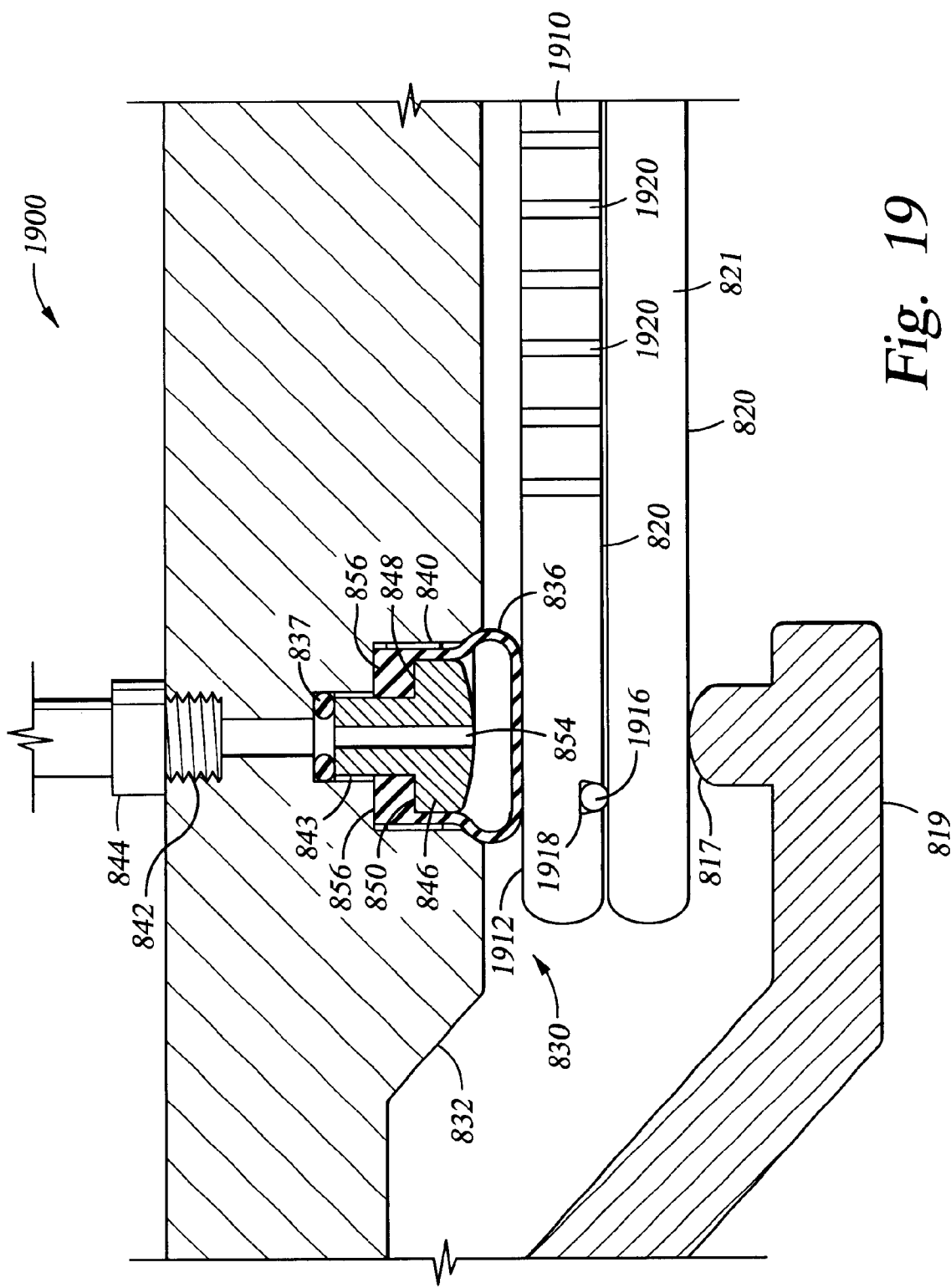
FIG. 19 is a partial cross sectional view of an alternative embodiment of a substrate holder assembly.

FIG. 19 is a partial cross sectional view of an alternative embodiment of a substrate holder assembly 1900. The alternative substrate holder assembly 1900 comprises a bladder assembly 470, as described above, having the inflatable bladder 836 attached to the back surface of an intermediary substrate holder plate 1910. Preferably, a portion of the inflatable bladder 836 is sealingly attached to the back surface 1912 of the intermediary substrate holder plate 1910 using an adhesive or other bonding material. The front surface 1914 of the intermediary substrate holder plate 1910 is adapted to receive a substrate or substrate 821 to be processed, and an elastomeric o-ring 1916 is disposed in an annular groove 1918 on the front surface 1914 of the intermediary substrate holder plate 1910 to contact a peripheral portion of the substrate back surface. The elastomeric o-ring 1916 provides a seal between the substrate back surface and the front surface of the intermediary substrate holder plate 1910. Preferably, the intermediary substrate holder plate includes a plurality of bores or holes 1920 extending through the plate that are in fluid communication with the vacuum port 841 to facilitate securing the substrate on the substrate holder plate 1910 using a vacuum force applied to the backside of the substrate. According to this alternative embodiment of the substrate holder assembly, the inflatable bladder does not directly contact a substrate being processed, and thus the risk of cutting or damaging the inflatable bladder during substrate transfers is significantly reduced. The elastomeric O-ring 1916 is preferably coated or treated to provide a hydrophilic surface, as discussed above for the surfaces of the cathode contact ring, for contacting the substrate, and the elastomeric O-ring 1916 is replaced as needed to ensure proper contact and seal to the substrate.

Figure 25:
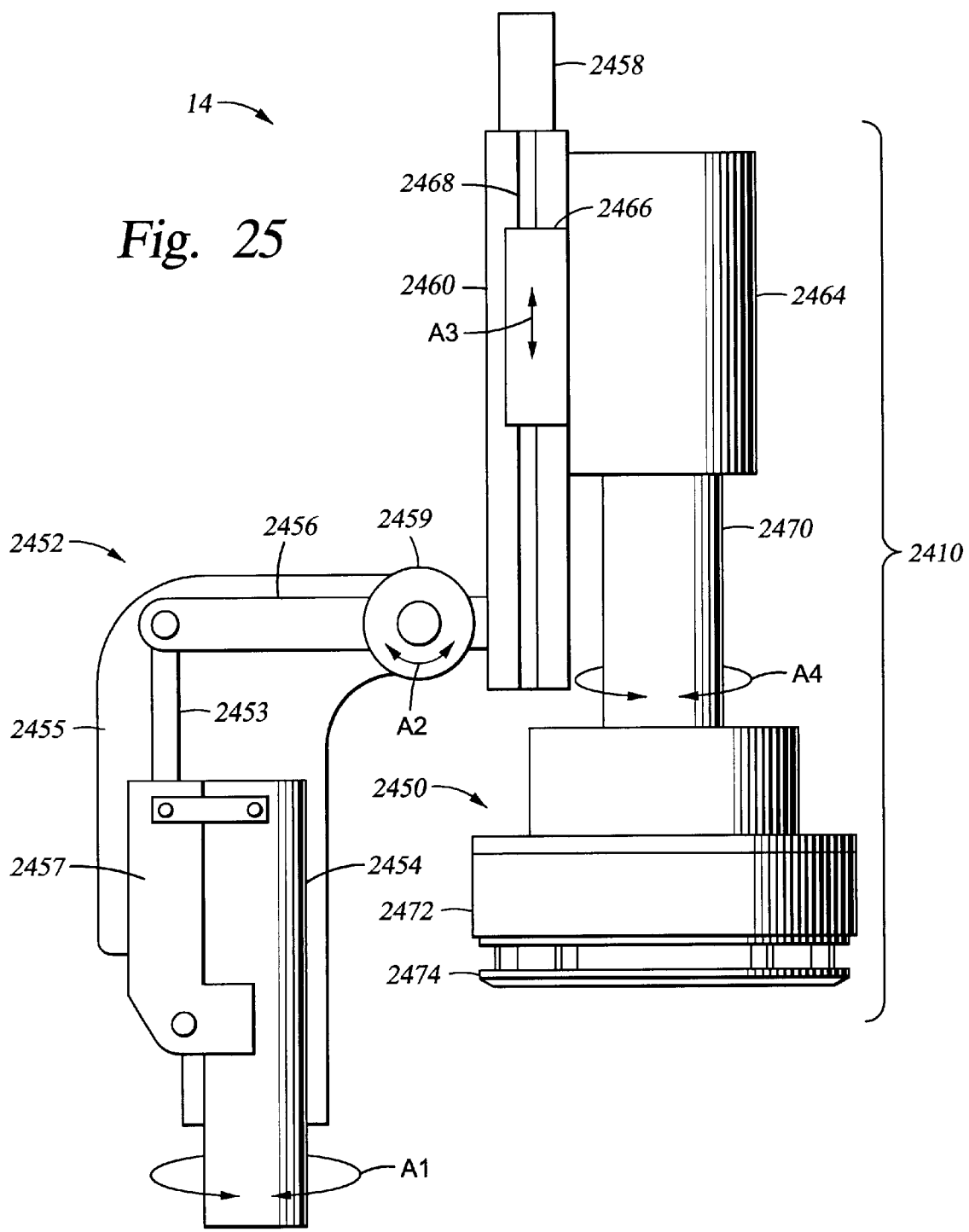
FIG. 25 is an alternative embodiment of the process head assembly having a rotatable head assembly.

FIG. 25 is an alternative embodiment of the process head assembly having a rotatable head assembly 2410. Preferably, a rotational actuator is disposed on the cantilevered arm and attached to the head assembly to rotate the head assembly during substrate processing. The rotatable head assembly 2410 is mounted onto a head assembly frame 2452. The alternative head assembly frame 2452 and the rotatable head assembly 2410 are mounted onto the mainframe similarly to the head assembly frame 452 and head assembly 410 as shown in FIG. 6 and described above. The head assembly frame 2452 includes a mounting post 2454, a post cover 2455, and a cantilever arm 2456. The mounting post 2454 is mounted onto the body of the mainframe 214, and the post cover 2455 covers a top portion of the mounting post 2454. Preferably, the mounting post 454 provides rotational movement, as indicated by arrow A1, with respect to a vertical axis along the mounting post to allow rotation of the head assembly frame 2452. The cantilever arm 2456 extends laterally from an upper portion of the mounting post 2454 and is pivotally connected to the post cover 2455 at the pivot joint 2459. The rotatable head assembly 2410 is attached to a mounting slide 2460 disposed at the distal end of the cantilever arm 2456. The mounting slide 2460 guides the linear motion of the head assembly 2410. A head lift actuator 2458 is disposed on top of the mounting slide 2460 to provide linearly extending displacement of the head assembly 2410.

The lower end of the cantilever arm 2456 is connected to the shaft 2453 of a cantilever arm actuator 2457, such as a pneumatic cylinder or a lead-screw actuator, mounted on the mounting post 2454. The cantilever arm actuator 2457 provides pivotal movement, as indicated by arrow A2, of the cantilever arm 2456 with respect to the joint 2459 between the cantilever arm 2456 and the post cover 2454. When the cantilever arm actuator 2457 is retracted, the cantilever arm 2456 moves the head assembly 2410 away from the process kit 420 to provide the spacing required to remove and/or replace the process kit 420 from the electroplating process cell 240. When the cantilever arm actuator 2457 is extended, the cantilever arm 2456 moves the head assembly 2410 toward the process kit 420 to position the substrate in the head assembly 2410 in a processing position.

The rotatable head assembly 2410 includes a rotating actuator 2464 slideably connected to the mounting slide 2460. The shaft 2468 of the head lift actuator 2458 is inserted through a lift guide 2466 attached to the body of the rotating actuator 2464. Preferably, the shaft 2468 is a lead-screw type shaft that moves the lift guide, as indicated by arrows A3, between various vertical positions. The rotating actuator 2464 is connected to the substrate holder assembly 2450 through the shaft 2470 and rotates the substrate holder assembly 2450, as indicated by arrows A4. The substrate holder assembly 2450 includes a bladder assembly, such as the embodiments described above with respect to FIGS. 12–15 and 19, and a cathode contact ring, such as the embodiments described above with respect to FIGS. 7–10 and 18.

The rotation of the substrate during the electroplating process generally enhances the deposition results. Preferably, the head assembly is rotated between about 2 rpm and about 20 rpm during the electroplating process. The head assembly can also be rotated as the head assembly is lowered to position the substrate in contact with the electrolyte in the process cell as well as when the head assembly is raised to remove the substrate from the electrolyte in the process cell. The head assembly is preferably rotated at a high speed, i.e., >20 rpm, after the head assembly is lifted from the process cell to enhance removal of residual electrolyte on the head assembly.

In one embodiment, the inventors have improved the uniformity of the deposited film to within about 2%, i.e., maximum deviation of deposited film thickness is at about 2% of the average film thickness, while standard electroplating processes typically achieves uniformity at best within about 5.5%. However, rotation of the head assembly is not necessary to achieve uniform electroplating deposition in some instances, particularly where the uniformity of electroplating deposition is achieved by adjusting the processing parameters, such as the electrolyte chemistry, electrolyte flow and other parameters.

Referring back to FIG. 6, a cross sectional view of an electroplating process cell 400, the substrate holder assembly 450 is positioned above the process kit 420. The process kit 420 generally comprises a bowl 430, a container body 472, an anode assembly 474 and a filter 476. Preferably, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, Plexiglas (acrylic), lexane, PVC, CPVC, and PVDF. Alternatively, the container body 472 can be made from a metal, such as stainless steel, nickel and titanium, which is coated with an insulating layer, such as TEFLON®, PVDF, plastic, rubber and other combinations of materials that do not dissolve in the electrolyte and can be electrically insulated from the electrodes, i.e., the anode and cathode of the electroplating system. The container body 472 is preferably sized and adapted to conform to the substrate plating surface and the shape of a substrate being processed through the system, typically circular or rectangular in shape. One preferred embodiment of the container body 472 comprises a cylindrical ceramic tube having an inner diameter that has about the same dimension as or slightly larger than the substrate diameter. The inventors have discovered that the rotational movement typically required in typical electroplating systems is not required to achieve uniform plating results when the size of the container body conforms to about the size of the substrate plating surface.

An upper portion of the container body 472 extends radially outwardly to form an annular weir 478. The weir 478 extends over the inner wall 446 of the electrolyte collector 440 and allows the electrolyte to flow into the electrolyte collector 440. The upper surface of the weir 478 preferably matches the lower surface of the cathode contact ring 466. Preferably, the upper surface of the weir 478 includes an inner annular flat portion 480, a middle inclined portion 482 and an outer declined portion 484. When a substrate is positioned in the processing position, the substrate plating surface is positioned above the cylindrical opening of the container body 472, and a gap for electrolyte flow is formed between the lower surface of the cathode contact ring 466 and the upper surface of the weir 478. The lower surface of the cathode contact ring 466 is disposed above the inner flat portion 480 and the middle inclined portion of the weir 478. The outer declined portion 484 is sloped downwardly to facilitate flow of the electrolyte into the electrolyte collector 440.

A lower portion of the container body 472 extends radially outwardly to form a lower annular flange 486 for securing the container body 472 to the bowl 430. The outer dimension, i.e., circumference, of the annular flange 486 is smaller than the dimensions of the opening 444 and the inner circumference of the electrolyte collector 440 to allow removal and replacement of the process kit 420 from the electroplating process cell 400. Preferably, a plurality of bolts 488 are fixedly disposed on the annular flange 486 and extend downwardly through matching bolt holes on the bowl 430. A plurality of removable fastener nuts 490 secure the process kit 420 onto the bowl 430. A seal 487, such as an elastomer O-ring, is disposed between container body 472 and the bowl 430 radially inwardly from the bolts 488 to prevent leaks from the process kit 420. The nutsibolts combination facilitates fast and easy removal and replacement of the components of the process kit 420 during maintenance.

Preferably, the filter 476 is attached to and completely covers the lower opening of the container body 472, and the anode assembly 474 is disposed below the filter 476. A spacer 492 is disposed between the filter 476 and the anode assembly 474. Preferably, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430.

The anode assembly 474 preferably comprises a consumable anode that serves as a metal source in the electrolyte. Alternatively, the anode assembly 474 comprises a non-consumable anode, and the metal to be electroplated is supplied within the electrolyte from the electrolyte replenishing system 220. As shown in FIG. 6, the anode assembly 474 is a self-enclosed module having a porous anode enclosure 494 preferably made of the same metal as the metal to be electroplated, such as copper. Alternatively, the anode enclosure 494 is made of porous materials, such as ceramics or polymeric membranes. A soluble metal 496, such as high purity copper for electro-chemical deposition of copper, is disposed within the anode enclosure 494. The soluble metal 496 preferably comprises a metal particles, wires or a perforated sheet. The porous anode enclosure 494 also acts as a filter that keeps the particulates generated by the dissolving metal within the anode enclosure 494. As compared to a non-consumable anode, the consumable, i.e., soluble, anode provides gas-generation-free electrolyte and minimizes the need to constantly replenish the metal in the electrolyte.

An anode electrode contact 498 is inserted through the anode enclosure 494 to provide electrical connection to the soluble metal 496 from a power supply. Preferably, the anode electrode contact 498 is made from a conductive material that is insoluble in the electrolyte, such as titanium, platinum and platinum-coated stainless steel. The anode electrode contact 498 extends through the bowl 430 and is connected to an electrical power supply. Preferably, the anode electrical contact 498 includes a threaded portion 497 for a fastener nut 499 to secure the anode electrical contact 498 to the bowl 430, and a seal 495, such as a elastomer washer, is disposed between the fastener nut 499 and the bowl 430 to prevent leaks from the process kit 420.

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. To secure the upper annular flange 506 of the bowl 430 and the lower annular flange 486 of the container body 472, the bolts 488 are inserted through the holes 508, and the fastener nuts 490 are fastened onto the bolts 488. Preferably, the outer dimension, i.e., circumference, of the upper annular flange 506 is about the same as the outer dimension, i.e., circumference, of the lower annular flange 486. Preferably, the lower surface of the upper annular flange 506 of the bowl 430 rests on a support flange of the mainframe 214 when the process kit 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502 to force a substantial portion of the electrolyte to flow through the anode assembly 474 first before flowing through the filter 476. The bottom portion 504 of the bowl 430 includes an electrolyte inlet 510 that connects to an electrolyte supply line from the electrolyte replenishing system 220. Preferably, the anode assembly 474 is disposed about a middle portion of the cylindrical portion 502 of the bowl 430 to provide a gap for electrolyte flow between the anode assembly 474 and the electrolyte inlet 510 on the bottom portion 504.

The electrolyte inlet 510 and the electrolyte supply line are preferably connected by a releasable connector that facilitates easy removal and replacement of the process kit 420. When the process kit 420 needs maintenance, the electrolyte is drained from the process kit 420, and the electrolyte flow in the electrolyte supply line is discontinued and drained. The connector for the electrolyte supply line is released from the electrolyte inlet 510, and the electrical connection to the anode assembly 474 is also disconnected. The head assembly 410 is raised or rotated to provide clearance for removal of the process kit 420. The process kit 420 is then removed from the mainframe 214, and a new or reconditioned process kit is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

Figure 20:
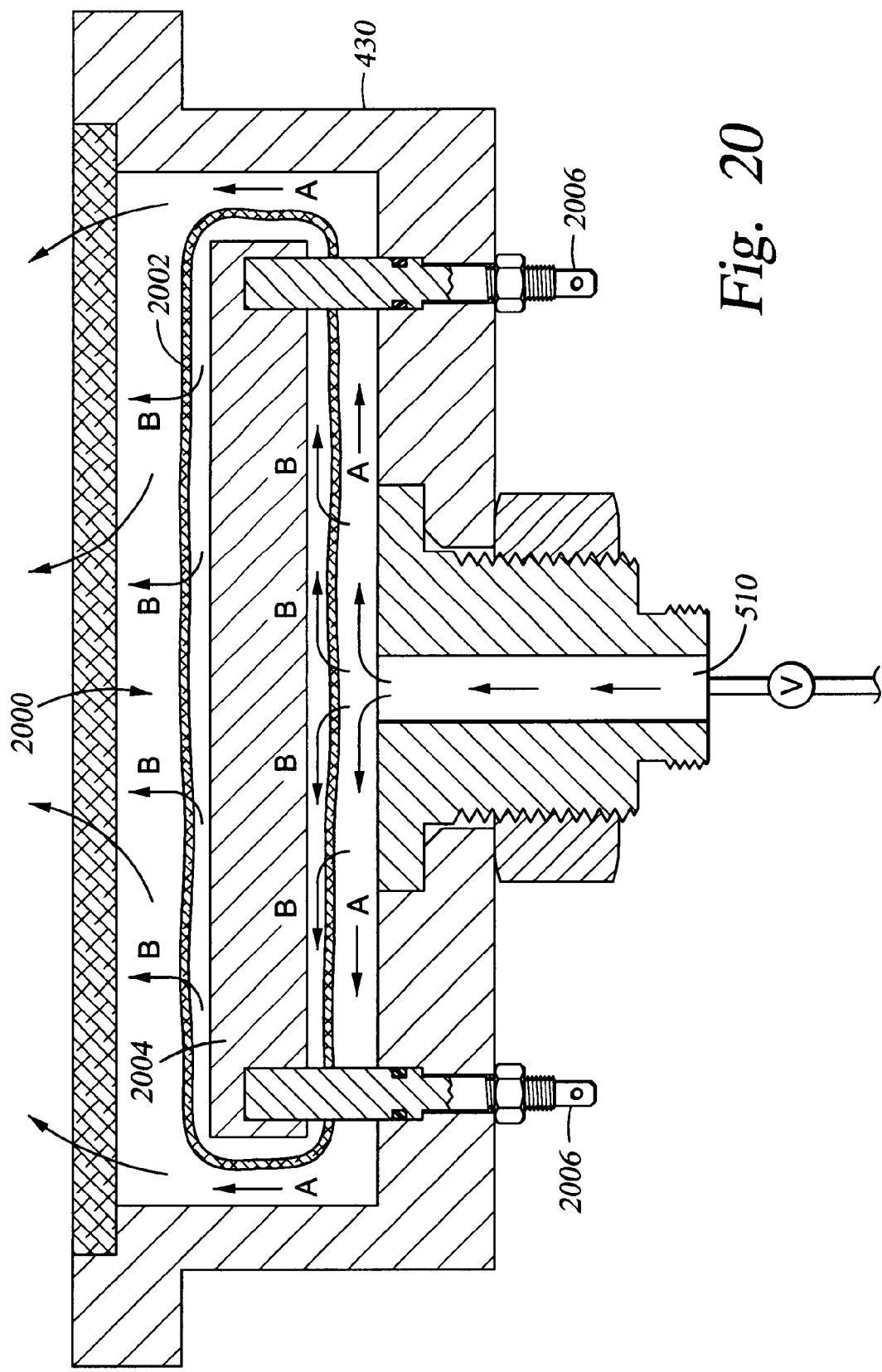
FIG. 20 is a cross sectional view of a first embodiment of an encapsulated anode.

FIG. 20 is a cross sectional view of a first embodiment of an encapsulated anode. The encapsulated anode 2000 includes a permeable anode enclosure that filters or traps "anode sludge" or particulates generated as the metal is dissolved from the anode plate 2004. As shown in FIG. 20, the consumable anode plate 2004 comprises a solid piece of copper. Preferably the anode is formed from high purity, oxygen free copper that is enclosed in a hydrophilic anode encapsulation membrane 2002. The anode plate 2004 is secured and supported by a plurality of electrical contacts or feed-throughs 2006 that extend through the bottom of the bowl 430. The electrical contacts or feed-throughs 2006 extend through the anode encapsulation membrane 2002 into the bottom surface of the anode plate 2004. The flow of the electrolyte is indicated by the arrows A from the electrolyte inlet 510 disposed at the bottom of the bowl 430 through the gap between the anode and the bowl sidewall. The electrolyte also flows through the anode encapsulation membrane 2002 by permeation into and out of the gap between the anode encapsulation membrane and the anode plate, as indicated by the arrows B. Preferably, the anode encapsulation membrane 2002 comprises a hydrophilic porous membrane, such as a modified polyvinyllidene fluoride membrane, having porosity between about 60% and 80%, more preferably about 70%, and pore sizes between about 0.025 $\mu$m and about 1 $\mu$m, more preferably between about 0.1 $\mu$m and about 0.2 $\mu$m. One example of a hydrophilic porous membrane is the Durapore Hydrophilic Membrane, available from Millipore Corporation, located in Bedford, Mass. As the electrolyte flows through the encapsulation membrane, anode sludge and particulates generated by the dissolving anode are filtered or trapped by the encapsulation membrane. Thus, the encapsulation membranes improve the purity of the electrolyte during the electroplating process, and defect formations on the substrate during the electroplating process caused by anode sludge and contaminant particulates are significantly reduced.

Figure 21:
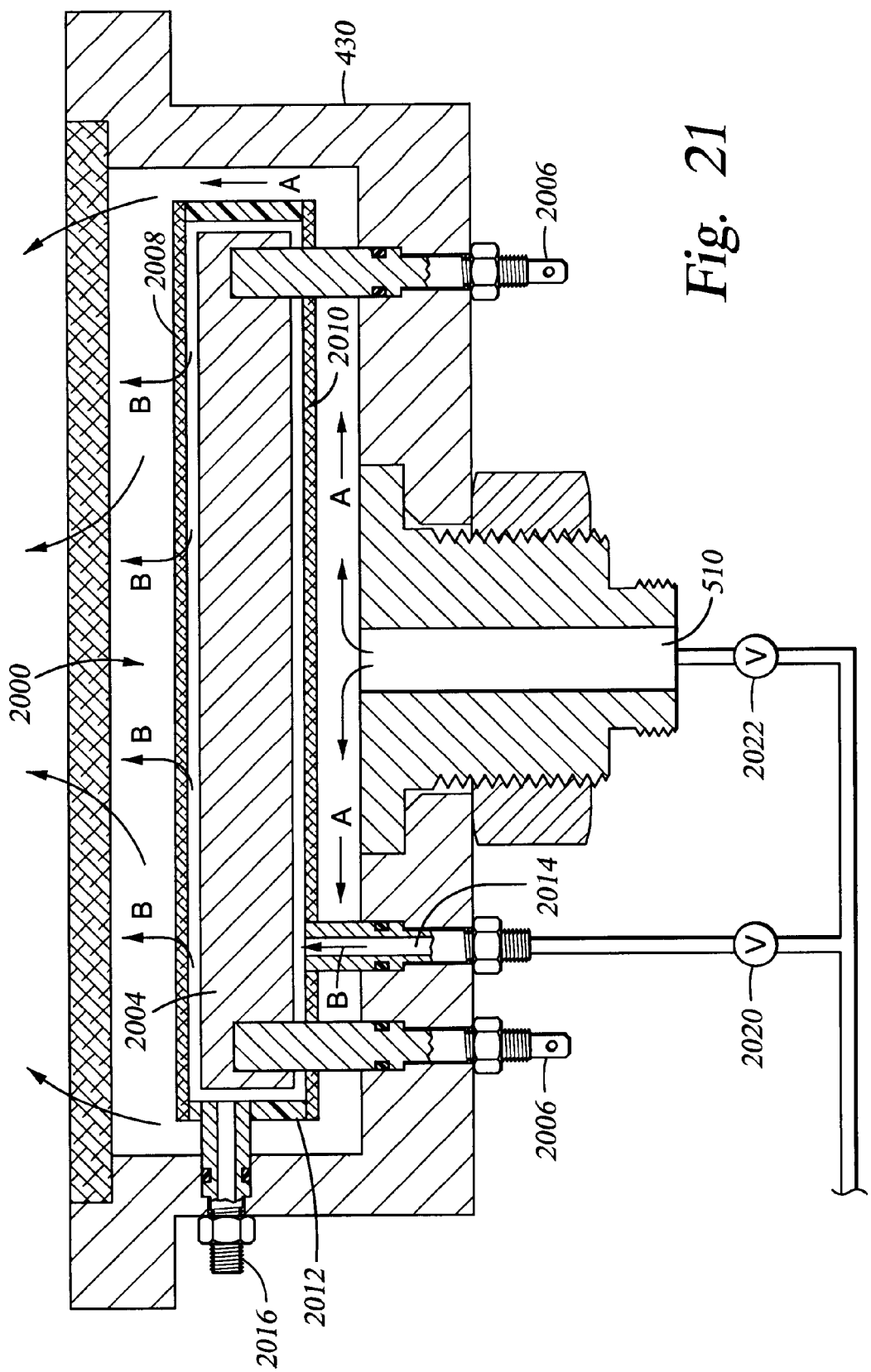
FIG. 21 is a cross sectional view of a second embodiment of an encapsulated anode.

FIG. 21 is a cross sectional view of a second embodiment of an encapsulated anode. Similar to the first embodiment of an encapsulated anode, the anode plate 2004 is secured and supported on the electrical feed-throughs 2006. A top encapsulation membrane 2008 and a bottom encapsulation membrane 2010, disposed respectively above and below the anode plate 2004, are attached to a membrane support ring 2012 that is disposed around the anode plate 2004. The top and bottom encapsulation membranes 2008, 2010 comprise a material from the list above for encapsulation membrane of the first embodiment of the encapsulated anode. The membrane support ring 2012 preferably comprises a relatively rigid material as compared to the encapsulation membrane, such as plastic or other polymers. A bypass fluid inlet 2014 is disposed through the bottom of the bowl 430 and through the bottom encapsulation membrane 2010 to introduce electrolyte into the gap between the encapsulation membranes and the anode plate. A bypass outlet 2016 is connected to the membrane support ring 2012 and extends through the bowl 430 to facilitate flow of excess electrolyte with the anode sludge or generated particulates out of the encapsulated anode into a waste drain, not shown.

Preferably, the flow of the electrolyte within the bypass fluid inlet 2014 and the main electrolyte inlet 510 are individually controlled by flow control valves 2020, 2022, respectively placed along the fluid lines connected to the inlets, and the fluid pressure in the bypass fluid inlet 2014 is preferably maintained at a higher pressure than the pressure in the main electrolyte inlet 510. The flow of the electrolyte inside the bowl 430 from the main electrolyte inlet 510 is indicated by arrows A, and the flow of the electrolyte inside the encapsulated anode 2000 is indicated by the arrows B. A portion of the electrolyte introduced into the encapsulated anode flows out of the encapsulated anode through the bypass outlet 2016. By providing a dedicated bypass electrolyte supply into the encapsulated anode, the anode sludge or particulates generated from the dissolving consumable anode is continually removed from the anode, thereby improving the purity of the electrolyte during the electroplating process.

Figure 22:
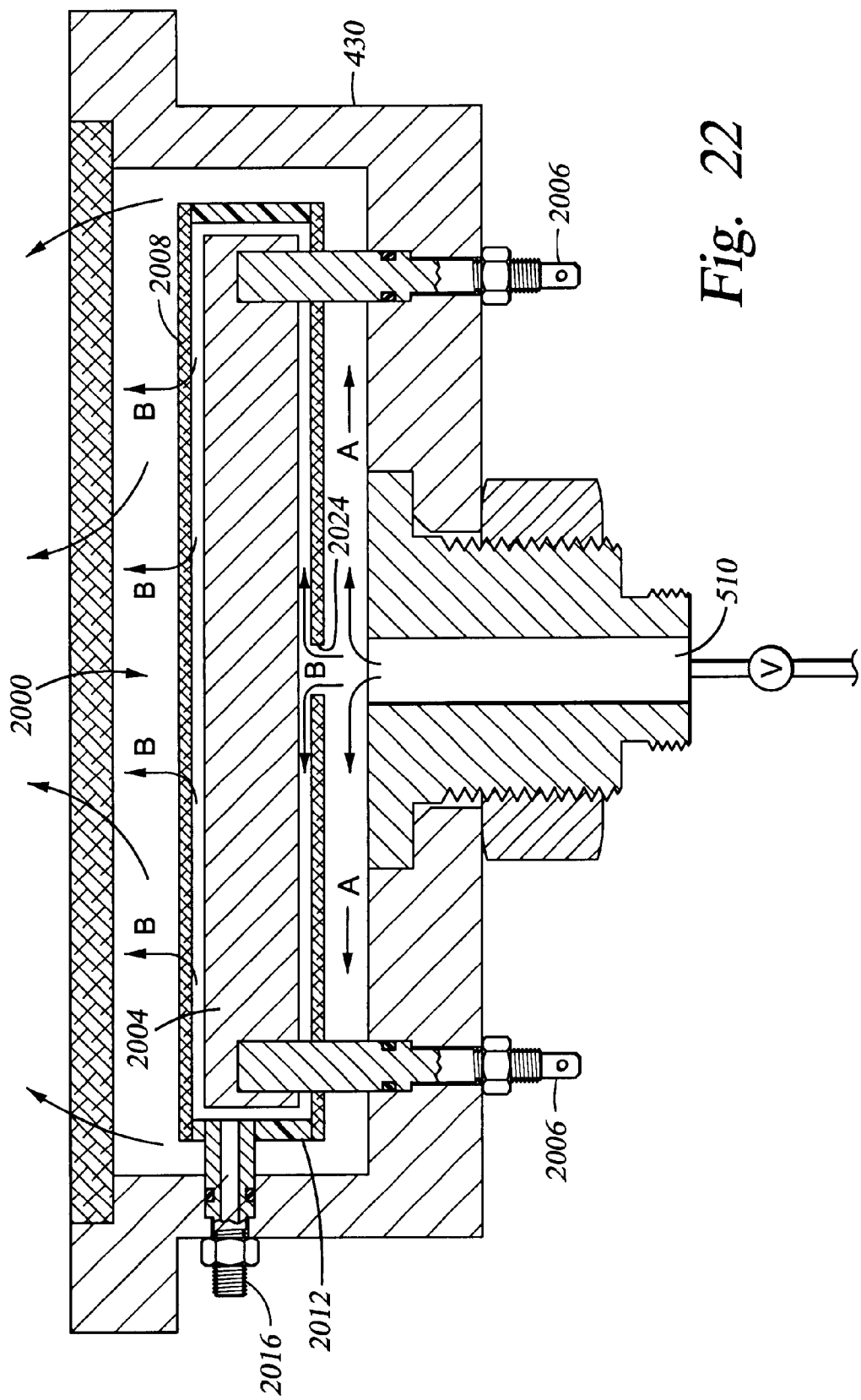
FIG. 22 is a cross sectional view of a third embodiment of an encapsulated anode.

FIG. 22 is a cross sectional view of a third embodiment of an encapsulated anode. The third embodiment of an encapsulated anode 2000 includes an anode plate 2004 secured and supported on a plurality of electrical feed-throughs 2006, a top and a bottom encapsulation membrane 2008, 2010 attached to a membrane support ring 2012, and a bypass outlet 2016 connected to the membrane support ring 2012 and extending through the bowl 430. This third embodiment of an encapsulated anode preferably comprises materials as described above for the first and second embodiments of an encapsulated anode. The bottom encapsulation membrane 2010 according to the third embodiment includes one or more openings 2024 disposed substantially above the main electrolyte inlet 510. The opening 2024 is adapted to receive flow of electrolyte from the main electrolyte inlet 510 and is preferably about the same size as the internal circumference of the main electrolyte inlet 510. The flow of the electrolyte from the main electrolyte inlet 510 is indicated by the arrows A and the flow of the electrolyte within the encapsulated anode is indicated by the arrows B. A portion of the electrolyte flows out of the encapsulated anode through the bypass outlet 2016, carrying a portion of the anode sludge and particulates generated from anode dissolution.

Figure 23:
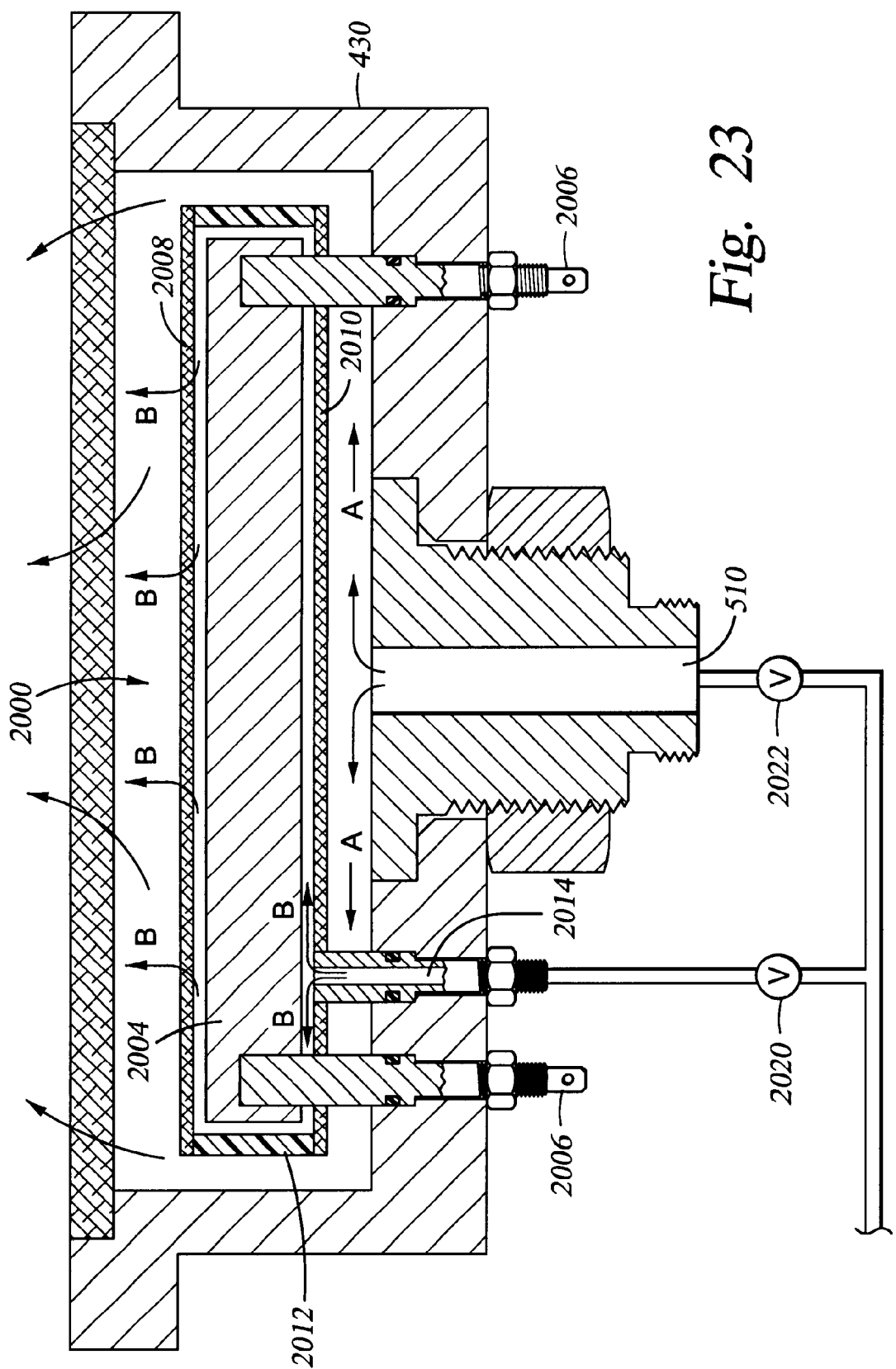
FIG. 23 is a cross sectional view of a fourth embodiment of an encapsulated anode.

FIG. 23 is a cross sectional view of a fourth embodiment of an encapsulated anode. The fourth embodiment of an encapsulated anode 2000 includes an anode plate 2002 secured and supported on a plurality of electrical feed-throughs 2006, a top and a bottom encapsulation membrane 2008, 2010 attached to a membrane support ring 2012, and a bypass fluid inlet 2014 disposed through the bottom of the bowl 430 and through the bottom encapsulation membrane 2010 to introduce electrolyte into the gap between the encapsulation membranes and the anode plate. This fourth embodiment of an encapsulated anode preferably comprises materials as described above for the first and second embodiments of an encapsulated anode. Preferably, the flow of the electrolyte through the bypass fluid inlet 2014 and the main electrolyte inlet 510 are individually controlled by control valves 2020, 2022, respectively. The arrows A indicate the flow of the electrolyte from the main electrolyte inlet 510 while arrows B indicate the flow of the electrolyte through the encapsulated anode. For this embodiment, the anode sludge and particulates generated by the dissolving anode plate are filtered and trapped by the encapsulation membranes as the electrolyte passes through the membrane.

Figure 16:
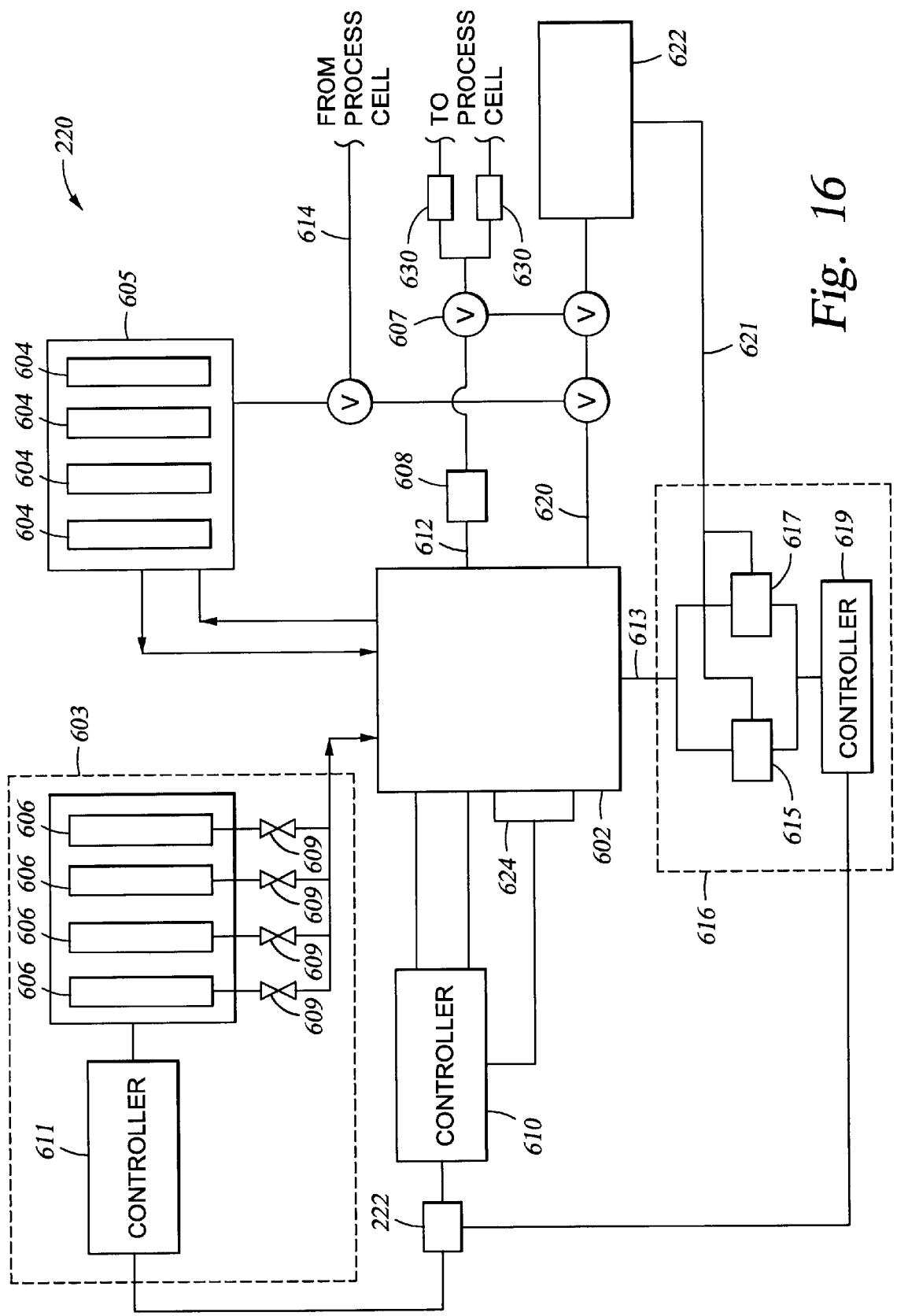
FIG. 16 is a schematic diagram of an electrolyte replenishing system.

FIG. 16 is a schematic diagram of an electrolyte replenishing system 220. The electrolyte replenishing system 220 provides the electrolyte to the electroplating process cells for the electroplating process. The electrolyte replenishing system 220 generally comprises a main electrolyte tank 602, a dosing module 603, a filtration module 605, a chemical analyzer module 616, and an electrolyte waste disposal system 622 connected to the analyzing module 616 by an electrolyte waste drain 620. One or more controllers 222 control the composition of the electrolyte in the main tank 602 and the operation of the electrolyte replenishing system 220. Preferably, the controllers 222 are independently operable but integrated with the control system 222 of the electroplating system platform 200.

The main electrolyte tank 602 provides a reservoir for electrolyte and includes an electrolyte supply line 612 that is connected to each of the electroplating process cells through one or more fluid pumps 608 and valves 607. A heat exchanger 624 or a heater/chiller disposed in thermal connection with the main tank 602 controls the temperature of the electrolyte stored in the main tank 602. The heat exchanger 624 is connected to and operated by the controller 610.

The dosing module 603 is connected to the main tank 602 by a supply line and includes a plurality of source tanks 606, or feed bottles, a plurality of valves 609, and a controller 611. The source tanks 606 contain the chemicals needed for composing the electrolyte and typically include a deionized water source tank and copper sulfate ($CuSO_4$) source tank for composing the electrolyte. Other source tanks 606 may contain hydrogen sulfate ($H_2SO_4$), hydrogen chloride (HCl) and various additives such as glycol. Each source tank is preferably color coded and fitted with a unique mating outlet connector adapted to connect to a matching inlet connector in the dosing module. By color coding the source tanks and fitting the source tanks with unique connectors, errors caused by human operators when exchanging or replacing the source tanks are significantly reduced.

The deionized water source tank preferably also provides deionized water to the system for cleaning the system during maintenance. The valves 609 associated with each source tank 606 regulate the flow of chemicals to the main tank 602 and may be any of numerous commercially available valves such as butterfly valves, throttle valves and the like. Activation of the valves 609 is accomplished by the controller 611 that is preferably connected to the system controller 222 to transmit signals thereto, and receive signals therefrom.

The electrolyte filtration module 605 includes a plurality of filter tanks 604. An electrolyte return line 614 is connected between each of the process cells and one or more filter tanks 604. The filter tanks 604 remove the undesired contents in the used electrolyte before returning the electrolyte to the main tank 602 for re-use. The main tank 602 is also connected to the filter tanks 604 to facilitate re-circulation and filtration of the electrolyte in the main tank 602. By re-circulating the electrolyte from the main tank 602 through the filter tanks 604, the undesired contents in the electrolyte are continuously removed by the filter tanks 604 to maintain a consistent level of purity. Additionally, re-circulating the electrolyte between the main tank 602 and the filtration module 605 allows the various chemicals in the electrolyte to be thoroughly mixed.

The electrolyte replenishing system 220 also includes a chemical analyzer module 616 that provides real-time chemical analysis of the chemical composition of the electrolyte. The analyzer module 616 is fluidly coupled to the main tank 602 by a sample line 613 and to the waste disposal system 622 by an outlet line 621. The analyzer module 616 generally comprises at least one analyzer and a controller 619 to operate the analyzer. The number of analyzers required for a particular processing tool depend on the composition of the electrolyte. For example, while a first analyzer may be used to monitor the concentrations of organic substances, a second analyzer is needed for inorganic chemicals. In the specific embodiment shown in FIG. 16 the chemical analyzer module 616 comprises an auto titration analyzer 615 and a cyclic voltametric stripper (CVS) 617. Both analyzers are commercially available from various suppliers. An auto titration analyzer that may be used to advantage is available from Parker Systems and a cyclic voltametric stripper is available from ECI. The auto titration analyzer 615 determines the concentrations of inorganic substances such as copper chloride and acid. The CVS 617 determines the concentrations of organic substances such as the various additives which may be used in the electrolyte and by-products resulting from the processing which are returned to the main tank 602 from the process cells.

The analyzer module shown FIG. 16 is merely illustrative. In another embodiment each analyzer may be coupled to the main electrolyte tank by a separate supply line and be operated by separate controllers 619. Persons skilled in the art will recognize other embodiments.

In operation, a sample of electrolyte is flowed to the analyzer module 616 via the sample line 613. Although the sample may be taken periodically, preferably a continuous flow of electrolyte is maintained to the analyzer module 616. A portion of the sample is delivered to the auto titration analyzer 615 and a portion is delivered to the CVS 617 for the appropriate analysis. The controller 619 initiates command signals to operate the analyzers 615, 617 in order to generate data. The information from the chemical analyzers 615, 617 is then communicated to the control system 222. The control system 222 processes the information and transmits signals that include user-defined chemical dosage parameters to the dosing controller 611. The received information is used to provide real-time adjustments to the source chemical replenishment rates by operating one or more of the valves 609 thereby maintaining a desired, and preferably constant, chemical composition of the electrolyte throughout the electroplating process. The waste electrolyte from the analyzer module is then flowed to the waste disposal system 622 via the outlet line 621.

Although a preferred embodiment utilizes real-time monitoring and adjustments of the electrolyte, various alternatives may be employed. For example, the dosing module 603 may be controlled manually by an operator observing the output values provided by the chemical analyzer module 616. Preferably, the system software allows for both an automatic real-time adjustment mode as well as an operator (manual) mode. Further, although multiple controllers are shown in FIG. 16, a single controller may be used to operate various components of the system such as the chemical analyzer module 616, the dosing module 603, and the heat exchanger 624. Each of the controllers 610, 611, and 619 may be integrated in the overall system controller 222 using the appropriate digital signal processing (DSP), data acquisition and control (DAC) and other suitable equipment generally known in the art. Other embodiments will be apparent to those skilled in the art.

The electrolyte replenishing system 220 also includes an electrolyte waste drain 620 connected to an electrolyte waste disposal system 622 for safe disposal of used electrolytes, chemicals and other fluids used in the electroplating system. Preferably, the electroplating cells include a direct line connection to the electrolyte waste drain 620 or the electrolyte waste disposal system 622 to drain the electroplating cells without returning the electrolyte through the electrolyte replenishing system 220. The electrolyte replenishing system 220 preferably also includes a bleed off connection to bleed off excess electrolyte to the electrolyte waste drain 620.

Preferably, the electrolyte replenishing system 220 also includes one or more degasser modules 630 adapted to remove undesirable gases from the electrolyte. The degasser module generally comprises a membrane that separates gases from the fluid passing through the degasser module and a vacuum system for removing the released gases. The degasser modules 630 are preferably placed in line on the electrolyte supply line 612 adjacent to the process cells 240. The degasser modules 630 are preferably positioned as close as possible to the process cells 240 so that most of the gases from the electrolyte replenishing system are removed by the degasser modules before the electrolyte enters the process cells. Preferably, each degasser module 630 includes two outlets to supply degassed electrolyte to the two process cells 240 of each processing station 218. Alternatively, a degasser module 630 is provided for each process cell. The degasser modules can be placed at many other alternative positions. For example, the degasser module can be placed at other positions in the electrolyte replenishing system, such as along with the filter section or in a closed-loop system with the main tank or with the process cell. As another example, one degasser module is placed in line with the electrolyte supply line 612 to provide degassed electrolyte to all of the process cells 240 of the electrochemical deposition system. Additionally, a separate degasser module is positioned in-line or in a closed-loop with the deionized water supply line and is dedicated for removing oxygen from the deionized water source. Because deionized water is used to rinse the processed substrates, free oxygen gases are preferable removed from the deionized water before reaching the SRD modules so that the electroplated copper is less likely to become oxidized by the rinsing process. Degasser modules are well known in the art and commercial embodiments are generally available and adaptable for use in a variety of applications. A commercially available degasser module is available from Millipore Corporation, located in Bedford, Mass.

Figure 26A:
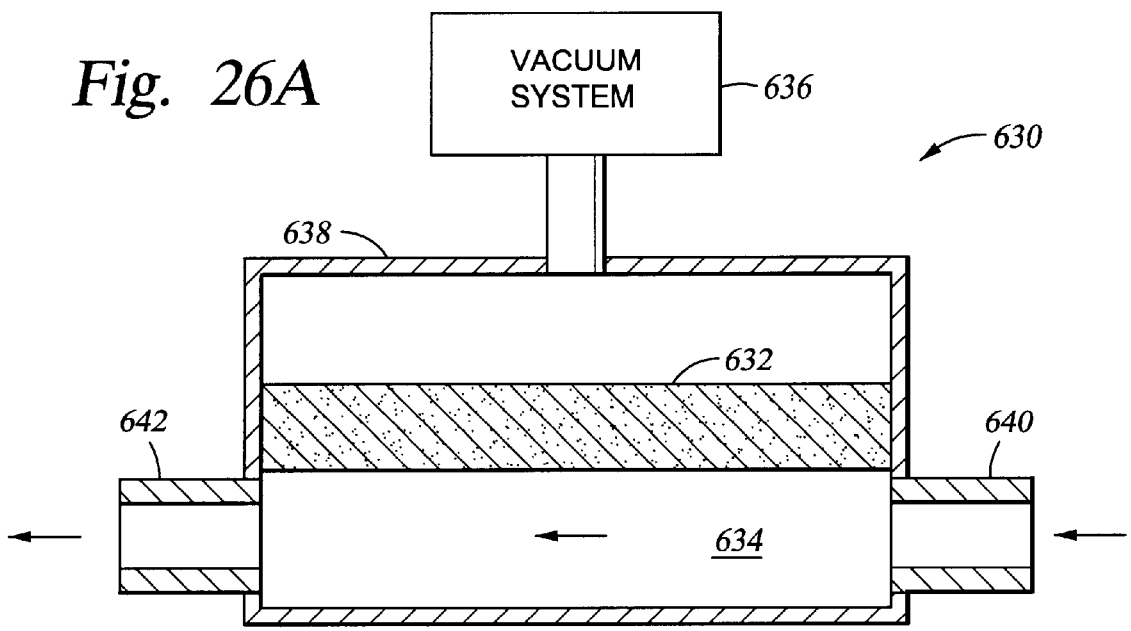
FIG. 26a and 26b are cross sectional views of embodiments of a degasser module.
Figure 26B:
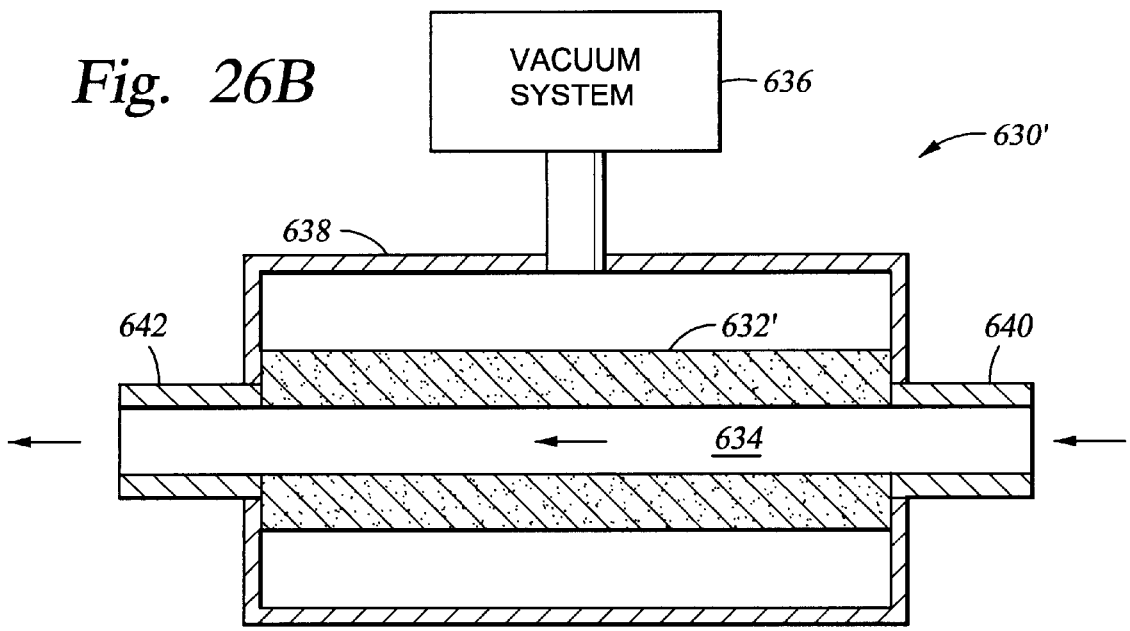

One embodiment of the degasser module 630, as shown in FIG. 26*a*, includes a hydrophobic membrane 632 having a fluid, i.e., electrolyte, passage 634 on one side of the membrane 632 and a vacuum system 636 disposed on the opposite side of the membrane. The enclosure 638 of the degasser module includes an inlet 640 and one or more outlets 642. As the electrolyte passes through the degasser module 630, the gases and other microbubbles in the electrolyte are separated from the electrolyte through the hydrophobic membrane and removed by the vacuum system. Another embodiment of the degasser module 630', as shown in FIG. 26*b*, includes a tube of hydrophobic membrane 632' and a vacuum system 636 disposed around the tube of hydrophobic membrane 632'. The electrolyte is introduced inside the tube of hydrophobic membrane, and as the electrolyte passes through the fluid passage 634 in the tube, gases and other micro-bubbles in the electrolyte are separated from the electrolyte through the tube of hydrophobic membrane 632' and removed by the vacuum system 636 surrounding the tube. More complex designs of degasser modules may be provided, including designs having serpentine paths of the electrolyte across the membrane and other multi-sectioned designs of degasser modules.

Although not shown in FIG. 16, the electrolyte replenishing system 220 may include a number of other components. For example, the electrolyte replenishing system 220 preferably also includes one or more additional tanks for storage of chemicals for a substrate cleaning system, such as the SRD station. Double-contained piping for hazardous material connections may also be employed to provide safe transport of the chemicals throughout the system. Optionally, the electrolyte replenishing system 220 includes connections to additional or external electrolyte processing system to provide additional electrolyte supplies to the electroplating system.

Figure 17:
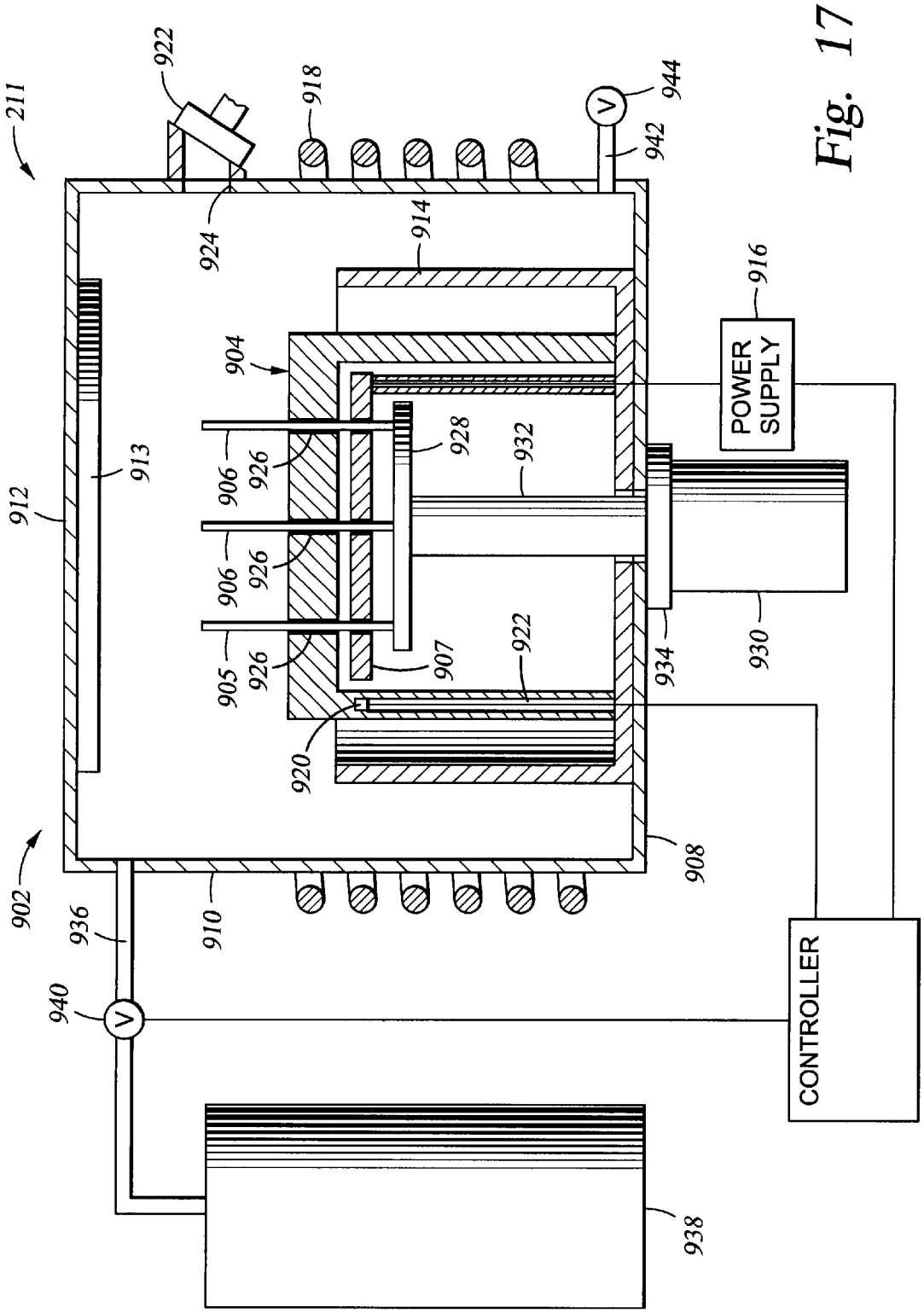
FIG. 17 is a cross sectional view of a rapid thermal anneal chamber.

FIG. 17 is a cross sectional view of one embodiment of a rapid thermal anneal chamber. The rapid thermal anneal (RTA) chamber 211 is preferably connected to the loading station 210, and substrates are transferred into and out of the RTA chamber 211 by the loading station transfer robot 228. The electroplating system, as shown in FIGS. 2 and 3, preferably comprises two RTA chambers 211 disposed on opposing sides of the loading station 210, corresponding to the symmetric design of the loading station 210. Thermal anneal process chambers are generally well known in the art, and rapid thermal anneal chambers are typically utilized in substrate processing systems to enhance the properties of the deposited materials. A variety of thermal anneal chamber designs may be utilized, including hot plate designs and heat lamp designs, to enhance the electroplating results. One particular thermal anneal chamber that may be used is the WxZ chamber available from Applied Materials, Inc., located in Santa Clara, Calif. Although the embodiment is described using a hot plate rapid thermal anneal chamber, other thermal anneal chambers are contemplated.

The RTA chamber 211 generally comprises an enclosure 902, a heater plate 904, a heater 907 and a plurality of substrate support pins 906. The enclosure 902 includes a base 908, a sidewall 910 and a top 912. Preferably, a cold plate 913 is disposed below the top 912 of the enclosure. Alternatively, the cold plate is integrally formed as part of the top 912 of the enclosure. Preferably, a reflector insulator dish 914 is disposed inside the enclosure 902 on the base 908. The reflector insulator dish 914 is typically made from a material such as quartz, alumina, or other material that can withstand high temperatures, i.e., greater than about 500° C., and act as a thermal insulator between the heater 907 and the enclosure 902. The dish 914 may also be coated with a reflective material, such as gold, to direct heat back to the heater plate 906.

The heater plate 904 preferably has a large mass compared to the substrate being processed in the system and is preferably fabricated from a material such as silicon carbide, quartz, or other materials that do not react with any ambient gases in the RTA chamber 211 or with the substrate material. The heater 907 typically comprises a resistive heating element or a conductive/radiant heat source and is disposed between the heated plate 906 and the reflector insulator dish 914. The heater 907 is connected to a power source 916 that supplies the energy needed to heat the heater 907. Preferably, a thermocouple 920 is disposed in a conduit 922, disposed through the base 908 and dish 914, and extends into the heater plate 904. The thermocouple 920 is connected to a controller, i.e., the system controller 222 described below, and supplies temperature measurements to the controller.

The controller 222 then increases or decreases the heat supplied by the heater 907 according to the temperature measurements and the desired anneal temperature.

The enclosure 902 preferably includes a cooling member 918 disposed outside of the enclosure 902 in thermal contact with the sidewall 910 to cool the enclosure 902. Alternatively, one or more cooling channels, not shown, are formed within the sidewall 910 to control the temperature of the enclosure 902. The cold plate 913 disposed on the inside surface of the top 912 cools a substrate that is positioned in close proximity to the cold plate 913.

The RTA chamber 211 includes a slit valve 922 disposed on the sidewall 910 of the enclosure 902 for facilitating transfers of substrates into and out of the RTA chamber. The slit valve 922 selectively seals an opening 924 on the sidewall 910 of the enclosure that communicates with the loading station 210. The loading station transfer robot 228 shown in the embodiment of FIG. 2 transfers substrates into and out of the RTA chamber through the opening 924.

The substrate support pins 906 preferably comprise distally tapered members constructed from quartz, aluminum oxide, silicon carbide, or other high temperature resistant materials. Each substrate support pin 906 is disposed within a tubular conduit 926, preferably made of a heat and oxidation resistant material, that extends through the heater plate 904. The substrate support pins 906 are connected to a lift plate 928 for moving the substrate support pins 906 in a uniform manner. The lift plate 928 is attached to an to an actuator 930, such as a stepper motor, through a lift shaft 932 that moves the lift plate 928 to facilitate positioning of a substrate at various vertical positions within the RTA chamber. The lift shaft 932 extends through the base 908 of the enclosure 902 and is sealed by a sealing flange 934 disposed around the shaft.

To transfer a substrate into the RTA chamber 211, the slit valve 922 is opened, and the loading station transfer robot 228 extends its robot blade having a substrate positioned thereon through the opening 924 into the RTA chamber. The robot blade of the loading station transfer robot 228 positions the substrate in the RTA chamber above the heater plate 904, and the substrate support pins 906 are extended upwards to lift the substrate above the robot blade. The robot blade then retracts out of the RTA chamber, and the slit valve 922 closes the opening. The substrate support pins 906 are then retracted to lower the substrate to a desired distance from the heater plate 904. Optionally, the substrate support pins 906 may retract fully to place the substrate in direct contact with the heater plate.

Preferably, a gas inlet 936 is disposed through the sidewall 910 of the enclosure 902 to allow selected gas flow into the RTA chamber 211 during the anneal treatment process. The gas inlet 936 is connected to a gas source 938 through a valve 940 for controlling the flow of the gas into the RTA chamber 211. A gas outlet 942 is preferably disposed at a lower portion of the sidewall 910 of the enclosure 902 to exhaust the gases in the RTA chamber and is preferably connected to a relief/check valve 944 to prevent backstreaming of atmosphere from outside of the chamber. Optionally, the gas outlet 942 is connected to a vacuum pump, not shown, to exhaust the RTA chamber to a desired vacuum level during an anneal treatment.

According to one embodiment, a substrate is annealed in the RTA chamber 211 after the substrate has been electroplated in the electroplating cell and cleaned in the SRD station. Preferably, the RTA chamber 211 is maintained at about atmospheric pressure, and the oxygen content inside the RTA chamber 211 is controlled to less than about 100 PPM during the anneal treatment process. Preferably, the ambient environment inside the RTA chamber 211 comprises nitrogen ($N_2$) or a combination of nitrogen ($N_2$) and less than about 4% hydrogen ($H_2$), and the ambient gas flow into the RTA chamber 211 is maintained at greater than 20 liters/min to control the oxygen content to less than 100 PPM. The electroplated substrate is preferably annealed at a temperature between about 200° C. and about 450° C. for between about 30 seconds and 30 minutes, and more preferably, between about 250° C. and about 400° C. for between about 1 minute and 5 minutes. Rapid thermal anneal processing typically requires a temperature increase of at least 50° C. per second. To provide the required rate of temperature increase for the substrate during the anneal treatment, the heater plate is preferably maintained at between about 350° C. and about 450° C., and the substrate is preferably positioned at between about 0 mm, i.e., contacting the heater plate, and about 20 mm from the heater plate for the duration of the anneal treatment process. Preferably, a control system 222 controls the operation of the RTA chamber 211, including maintaining the desired ambient environment in the RTA chamber and the temperature of the heater plate.

After the anneal treatment process is completed, the substrate support pins 906 lift the substrate to a position for transfer out of the RTA chamber 211. The slit valve 922 opens, and the robot blade of the loading station transfer robot 228 is extended into the RTA chamber and positioned below the substrate. The substrate support pins 906 retract to lower the substrate onto the robot blade, and the robot blade then retracts out of the RTA chamber. The loading station transfer robot 228 then transfers the processed substrate into the cassette 232 for removal out of the electroplating processing system as shown in the embodiment of FIGS. 2 and 3.

Referring back to FIG. 2, the electroplating system platform 200 includes a control system 222 that controls the functions of each component of the platform. Preferably, the control system 222 is mounted above the mainframe 214 and comprises a programmable microprocessor. The programmable microprocessor is typically programmed using software designed specifically for controlling all components of the electroplating system platform 200. The control system 222 also provides electrical power to the components of the system and includes a control panel 223 that allows an operator to monitor and operate the electroplating system platform 200. The control panel 223, as shown in FIG. 2, is a stand-alone module that is connected to the control system 222 through a cable and provides easy access to an operator. Generally, the control system 222 coordinates the operations of the loading station 210, the RTA chamber 211, the SRD station 212, the mainframe 214 and the processing stations 218. Additionally, the control system 222 coordinates with the controller 222 of the electrolyte replenishing system 220 to provide the electrolyte for the electroplating process.

The following is a description of a typical substrate electroplating process sequence through the electroplating system platform 200 as shown in FIG. 2. A substrate cassette containing a plurality of substrates is loaded into the substrate cassette receiving areas 224 in the loading station 210 of the electroplating system platform 200. A loading station transfer robot 228 picks up a substrate from a substrate slot in the substrate cassette and places the substrate in the substrate orientor 230. The substrate orientor 230 determines and orients the substrate to a desired orientation for processing through the system. The loading station transfer robot 228 then transfers the oriented substrate from the substrate orientor 230 and positions the substrate in one of the substrate slots in the substrate pass-through cassette 238 in the SRD station 212. The mainframe transfer robot 242 picks up the substrate from the substrate pass-through cassette 238 and positions the substrate for transfer by the flipper robot 248. The flipper robot 248 rotates its robot blade below the substrate and picks up substrate from mainframe transfer robot blade. The vacuum suction gripper on the flipper robot blade secures the substrate on the flipper robot blade, and the flipper robot flips the substrate from a face up position to a face down position. The flipper robot 248 rotates and positions the substrate face down in the substrate holder assembly 450. The substrate is positioned below the substrate holder 464 but above the cathode contact ring 466. The flipper robot 248 then releases the substrate to position the substrate into the cathode contact ring 466. The substrate holder 464 moves toward the substrate and the vacuum chuck secures the substrate on the substrate holder 464. The bladder assembly 470 on the substrate holder assembly 450 exerts pressure against the substrate backside to ensure electrical contact between the substrate plating surface and the cathode contact ring 466.

The head assembly 452 is lowered to a processing position above the process kit 420. At this position the substrate is below the upper plane of the weir 478 and contacts the electrolyte contained in the process kit 420. The power supply is activated to supply electrical power, i.e., voltage and current, to the cathode and the anode to enable the electroplating process. The electrolyte is typically continually pumped into the process kit during the electroplating process. The electrical power supplied to the cathode and the anode and the flow of the electrolyte are controlled by the control system 222 to achieve the desired electroplating results. Preferably, the head assembly is rotated as the head assembly is lowered and also during the electroplating process.

After the electroplating process is completed, the head assembly 410 raises the substrate holder assembly and removes the substrate from the electrolyte. Preferably, the head assembly is rotated for a period of time to enhance removal of residual electrolyte from the substrate holder assembly. The vacuum chuck and the bladder assembly of the substrate holder then release the substrate from the substrate holder, and the substrate holder is raised to allow the flipper robot blade to pick up the processed substrate from the cathode contact ring. The flipper robot rotates the flipper robot blade above the backside of the processed substrate in the cathode contact ring and picks up the substrate using the vacuum suction gripper on the flipper robot blade. The flipper robot rotates the flipper robot blade with the substrate out of the substrate holder assembly, flips the substrate from a face-down position to a face-up position, and positions the substrate on the mainframe transfer robot blade. The mainframe transfer robot then transfers and positions the processed substrate above the SRD module 236. The SRD substrate support lifts the substrate, and the mainframe transfer robot blade retracts away from the SRD module 236. The substrate is cleaned in the SRD module using deionized water or a combination of deionized water and a cleaning fluid as described in detail above. The substrate is then positioned for transfer out of the SRD module. The loading station transfer robot 228 picks up the substrate from the SRD module 236 and transfers the processed substrate into the RTA chamber 211 for an anneal treatment process to enhance the properties of the deposited materials. The annealed substrate-is then transferred out of the RTA chamber 211 by the loading station robot 228 and placed back into the substrate cassette for removal from the electroplating system. The above-described sequence can be carried out for a plurality of substrates substantially simultaneously in the electroplating system platform 200. Also, the electroplating system can be adapted to provide multi-stack substrate processing.

The controller 222 controls the operation of the loading station transfer robot 228, the mainframe transfer robot 242, the cassettes 238, the pedestal actuator in the SRI) module 236, as well as the remainder of the operation of any cassettes, robots, robot platform lifts, and processing in the electroplating system platform 200. The controller 222 comprises central processing unit (CPU) 260, memory 262, input output interface (I/O) 279, circuit portion 265, and a bus, not shown. The controller 222 may be a general-purpose computer, a microprocessor, a microcontroller, or any other known suitable type of computer or controller. The CPU 260 performs the processing and arithmetic operations for the controller 222, and controls the operation of the robots, cassettes, robot lifts, etc. plus the internal operation of the process chambers.

The memory 262 includes random access memory (RAM) and read only memory (ROM) that together store the computer programs, operands, operators, dimensional values, system processing temperatures and configurations, and other parameters that control the electroplating operation. The bus provides for digital information transmissions between CPU 260, circuit portion 265, memory 262, and I/O 279, and also connects I/O 279 to the cluster tool 100 that either receive digital information from, or transmit digital information to, controller 222.

I/O 279 provides an interface to control the transmissions of digital information between each of the components in controller 222. I/O 279 also provides an interface between the components of the controller 222 and different portions of the electrolyte solution-dispensing system 100. Circuit portion 265 comprises all of the other user interface devices such as display and keyboard, system devices, and other accessories associated with the controller 222. While one embodiment of digital controller 222 is described herein, other digital controllers as well as analog controllers could function well in this application, and are within the intended scope of the invention.

2. Substrate Lift Configuration

The above description of the exemplary embodiment of electroplating system platform 200 is provided to indicate the variety of robots that position or transfer substrates, such as semiconductor wafers, robots that transfer the substrate between multiple parallel planes. These robots position robots in position for processing, to process substrates, to store substrates, and to retrieve substrates from process, metrology, or other cells following processing.

The embodiment of FIG. 3 shows three devices (the loading station transfer robot 228, the mainframe transfer robot 242, the cassettes 238) that may each be provided with a level substrate lift as described below, to provide significant substantially linear motion to one or more substrates 128. The mainframe transfer robot 242 is capable of the necessary linear displacement during transfer of substrates to the mainframe transfer station 216, an SRD station 212, and a plurality of processing stations 218. The loading station transfer robot 228 is capable of linear displacement during loading the substrate into, or unloading the substrate from, the substrate orientor 230, a substrate metrology station not shown but used for measurement and/or inspection of substrates, the substrate cassette receiving areas 224, the handling platform 162, the loading pod 166, and/or the load lock chamber 120. The substrate pass-through cassette 238 is configured with multiple vertically spaced substrate slots, each substrate shelf is configured to hold a substrate. The substrate pass-through cassette 238 can be vertically displaced to align different ones of the substrate shelves holding different substrates with either the loading station transfer robot 228 and/or the mainframe transfer robot 242. There is a considerable amount of linear motion associated with the different robots 228 or 242, as well as the cassette 238, in the electroplating system platform 200.

Although the level substrate lift is described as being applied to the mainframe transfer robot 242, the loading station transfer robot 228, or the substrate pass-through cassette 238 in this disclosure, it is envisioned that any substrate transfer mechanism that requires displacement in the Z direction could utilize the level substrate lift, and is therefore within the intended scope of the present disclosure.

One technique by which linear motion can be imparted into a robot is embodied by the mainframe transfer robot 242. The mainframe transfer robot 242, including a variety of robot links and a robot blade, is secured to a robot platform 2704. The linear, substantially vertical, motion is imparted by a robot platform linearly raising or lowering the entire mainframe transfer robot 242. The mainframe transfer robot 242 can undergo horizontal robot motion in a substantially horizontal plane utilizing either the translational horizontal or rotational horizontal plane robot motion independently of any vertical motion imparted to the robot platform. Any type of known robot device can be rotatably mounted on the robot platform to provide the horizontal robot motion. In the case of a cassette holder, no horizontal robot motion is provided, but access is permitted to robot assemblies transporting substrates to or from the substrate cassettes.

Figure 27:
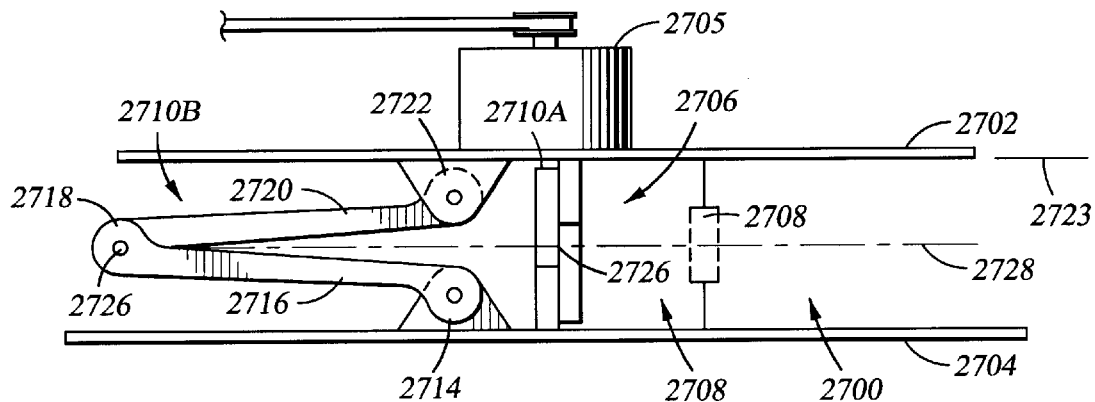
FIG. 27 shows a side view of one embodiment of robot lift in a lowered position.
Figure 28:
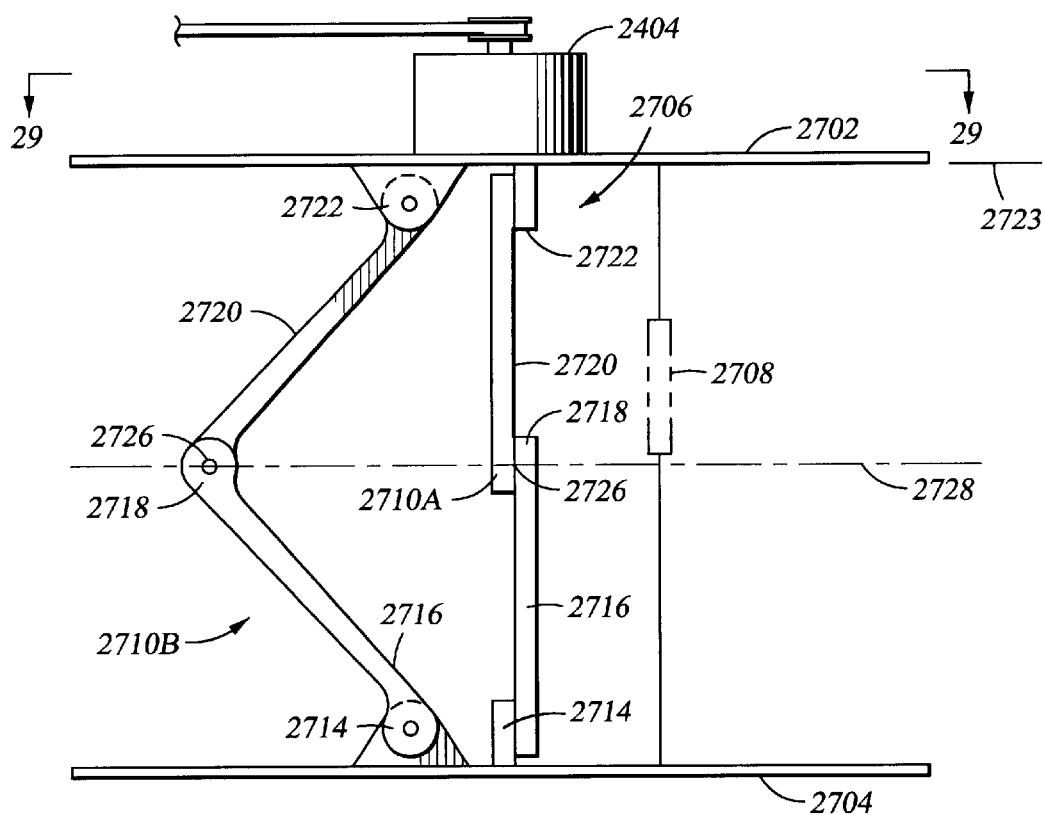
FIG. 28 shows a side view the FIG. 27 embodiment of robot lift in a raised position.

FIG. 27 and 28 respectively show the lowered and raised position of one embodiment of a robot lift 2700 that extends between, and is connected at opposite ends to each of, a robot platform 2702 and a base 2704. The base 2704 is configured to be stationary and stable to limit undesired vibrations and movements imparted to the robot device. The robot device, not shown, is rotatably mounted to the upper surface of the robot platform 2702. The lift 2700 comprises a lift guide 2706 and a lift actuator 2708. The lift actuator 2708 may be fashioned as a piston, a lead screw, a rotary actuator coupled to the lift guide 2706 as described below, or any other ones of a variety of known actuator designs. One embodiment of lift actuator 2708 is shown as a block in the embodiment of FIGS. 27 and 28, since the details of the lift actuator is not necessarily, but might be, related to the structure of the lift guide 2706. In certain embodiments, the lift actuator is integrated into the lift guide 2706. In other embodiments, the lift actuator is structurally separate from the lift guide. A variety of lift actuator configurations are described below.

The lift guide 2706 comprises a first guide 2710a and a second guide 2710b, each of which are preferably similarly structured and extend between and are connected to each of the base 2704 and the robot platform 2702. A robot 2705 is shown supported on the robot platform 2702. Each guide 2710a, 2710b comprise a lower rotary mount 2714, a lower linkage member 2716, a rotary segment 2718, an upper linkage member 2720, and an upper rotary mount 2722. The lower rotary mount 2714 rotatably connects the lower linkage member 2716 to the base 2704. The upper rotary mount 2722 rotatably connects the upper linkage member 2720 to the robot platform 2702. The rotary segment 2718 rotatably connects the lower linkage member 2716 to the upper linkage member 2720 in a manner that permits relative rotation of the linkage members 2716 and 2720 about a guide pivot axis 2726. Considering the base 2704 as a substantially fixed reference, as the lift actuator 2708 rises, the level of each guide pivot axis 2726 also rises and remain within an instantaneous linkage plane 2728. Also the robot platform 2702 rises and remains in an instantaneous robot plane 2723. The plane of the base 2704, the instantaneous robot plane 2723, and the instantaneous linkage plane 2728 remain substantially horizontal and substantially parallel to each other as a result of the interaction between, and the relative motions of, the first guide 2710a and the second guide 2710b.

The guide pivot axis 2726 of the first guide 2710a and the guide pivot axis 2726 of the second guide 2710a both remain within an instantaneous linkage plane 2720. Each one of the lower rotary mount 2714, the rotary segment 2718, and the upper rotary mount 2722 are configured to provide rotation of the relative connecting members about the axis in which each is designed to pivot.

Figure 29:
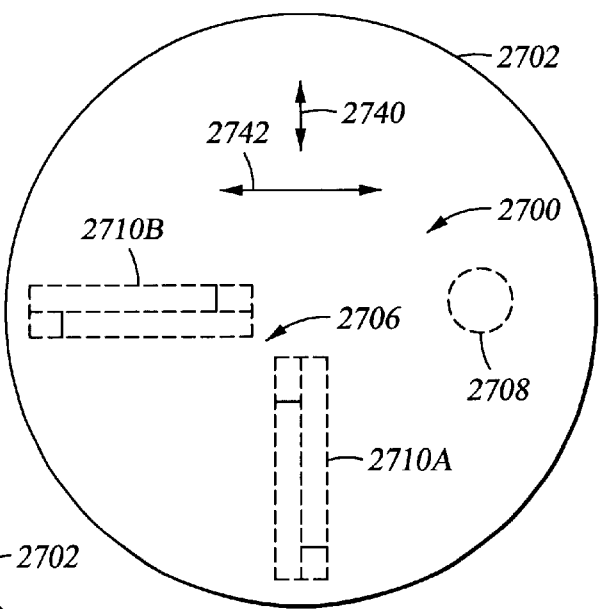
FIG. 29 a top sectional view of the robot lift as taken through section lines 29—29 of FIG. 28.

The following analysis is provided to indicate the embodiment shown in FIGS. 27 to 29 will not allow relative lateral displacements or tipping about any horizontal axis between the robot platform 2702 relative to the base 2704. Assume that only the first guide 2710a is attached between the robot platform 2702 and the base 2701 in the embodiment in FIGS. 27 to 29. That is, the second guide 2710b is assumed disconnected from between the robot platform and the base for the purpose of this analysis. The first guide 2710a permits movement of the robot platform in a direction parallel to the direction in which the first guide 2710a is oriented as indicated by arrow 2740 shown in FIG. 29, while restricting movement of the robot platform in a direction transverse to the direction in which the first guide 2710a is oriented as indicated by arrow 2742. The direction that the first guide can extend in is based upon the orientation of the lower rotary mount 2714, the rotary segment 2718, and the upper rotary mount 2722 of the first guide 2710a. By comparison, second guide 210b alone, with first guide 2710a not connected, is configured to permit movement of the robot platform in a direction parallel to the direction in which the second guide 2710b is oriented as indicated by arrow 2742, while restricting movement of the robot platform in a direction transverse to the direction in which the second guide 2710b is oriented as indicated by arrow 2740. The direction that the second guide can extend in is based upon the orientation of the lower rotary mount 2714, the rotary segment 2718, and the upper rotary mount 2722 of the first guide 2710a. With both the first guide 2710a and the second guide 2710b connected between the base 2704 and the robot platform, the robot platform 2702 is not permitted to move relative to the base 2704 in either directions indicated by arrows 2740 or 2742. However, both guides 2710a and 2710b can be expanded or retracted simultaneously to provide respective raising and lowering of the robot platform 2702 relative to the base 2704.

In addition, tilting of the robot platform 2702 relative to the base 2704 is not permitted in the embodiment shown in FIGS. 27–29. This tilting is restricted since the first guide 2710a, with the second guide 2710b not connected, will not permit tilting of the robot platform 2702 in a clockwise of counter-clockwise direction as shown in FIG. 28. In addition, the second guide 2710b, with the second guide 2710a not connected, will not permit tilting of the robot platform 2702 in a direction parallel to guide pivot axis 2726 of the first guide 2710a. The horizontal direction that first guide 2710a restricts tilting is opposed to the horizontal direction that the second guide 2710b restricts tilting. Therefore, relative tilting of the robot platform 2702 relative to the base 2704 is not permitted about any horizontal axis when both the first guide 2710a and the second guide 2710b are connected.

As described above, relative lateral displacements of the robot platform 2702 relative to the base 2704 are not permitted, and relative tilting of the robot platform 2702 relative to the base 2704 along any axis is not permitted. Therefore, the only relative motion between the robot platform 2702 and the base 2704 is these two elements moving closer to each other, as when the robot platform is lowered, and the two elements moving further away from each other, as when the robot platform is raised. In this manner, the robot lift 2700 including only two guide elements perpendicularly oriented will maintain the robot platform in a level (horizontal) orientation as the robot lift is raised and lowered.

Figure 30:
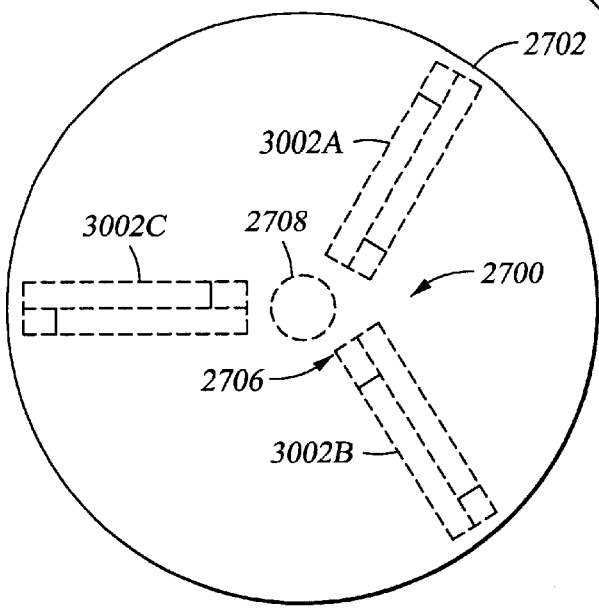
FIG. 30 is a similar view as FIG. 29 of an alternate embodiment of robot lift including three lift guides.

The concept of maintaining the robot platform 2702 level and aligned with the base 2704 as described above relative to the embodiment shown in FIGS. 27–29 may be expanded to robot lifts having different numbers of guides. For example, FIG. 30 shows another embodiment of robot lift 2700 having three guides 3002a, 3002b, and 3002c. Each guide 3002a, 3002b, and 3002c is structurally and functionally identical to the first guide 2710a or the second guide 2710a in the prior embodiment. However, one of the three guides must be located at three spaced positions that are separated from each other by an angle of 120 degrees. In the embodiment shown in FIG. 27, each pair of guides 2710a and 2710b is positioned to limit relative tilting and relative motion of the robot platform 2702 relative to the base 2704. For example, if guide 3002a alone were attached between the robot platform 2702 and the base 2704, then tilting of the robot platform about axis 3004 as well as motion of the robot platform in the direction 3008 relative to the base would be permitted. The combined effects of the guides 3002b and 3002c limit the tilting of the robot platform about axis 3004 as well as the motion of the robot platform in the direction 3008 for the reasons described above relative to the embodiment shown in FIGS. 27–29. The same motion opposing concepts apply so that the combined effects of the guides 3002a and 3002b limit the relative angular tilting of the robot platform as well as the motion of the robot platform in the direction permitted by guide 3002c. Finally, the combined effects of the guides 3002a and 3002c limit the relative angular tilting of the robot platform as well as the motion of the robot platform in the direction permitted by guide 3002b.

Figure 31:
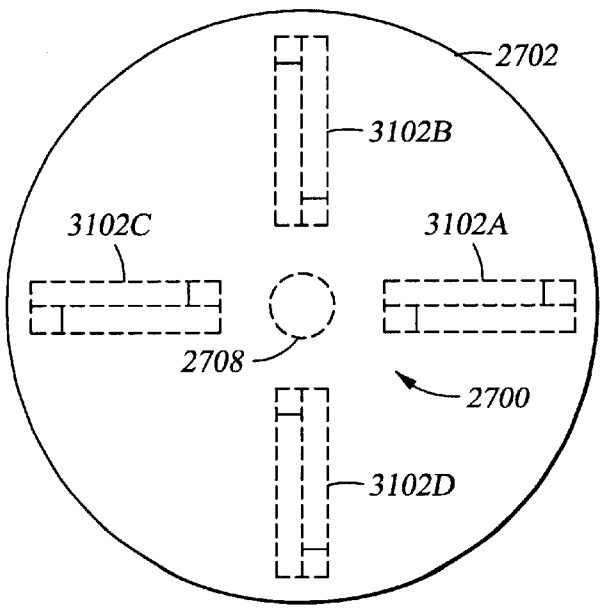
FIG. 31 is a similar view as FIG. 29 of an alternate embodiment of robot lift including four lift guides.

FIG. 31 shows an embodiment of robot lift 2700 having four guides 3102a, 3102b, 3102c, and 3102d. Each guide 3102a, 3102b, 3102c, and 3102d is structurally and functionally identical to the first guide 2710a or the second guide 2710a in the prior embodiment shown in FIGS. 27–29. However, one of the three guides must be located at four spaced positions that are separated from each other by an angle of 90 degrees. Each pair of adjacent guides that are spaced from each other by 90 degrees may be viewed as structurally identical to the first guide 2710a and the second guide 2710b that were separated from each other by 90 degrees. Therefore, each pair of robot guides acts to maintain the robot platform parallel to, and aligned with, the base 2704. The general equation that applies to the embodiments shown in FIGS. 29 to 33 (and can be applied to any number of guides greater than or equal to 2) to determine the angle between guides within the instantaneous robot plane 2723 that limits both horizontal motion and tipping about a horizontal axis between the robot platform 2702 and the base 2702 is:

$$\theta = 360/N$$

where θ is the angle between each pair of adjacent guides, and N is the number of guides provided in the robot lift 2700.

The lift actuator 2708 is shown as a block element in the embodiment of FIGS. 27 to 29. Each embodiment of robot lift 2700 has a lift actuator, but the lift actuators are not shown in certain of the embodiments for simplicity of display. It is noted that any type of lift mechanism may be applied to the robot lift 2700. Certain embodiments of the lift mechanisms are structurally independent of the lift guides 2710a, 2170b, while other embodiments of lift mechanisms are structurally included in the lift guides. Such lift mechanisms are now described.

3. Substrate Lift Drive

The above section describes guides that are designed and oriented to permit the robot lift to lift a robot platform while maintaining the robot platform 2702 in a level orientation relative to the base 2704. There are a variety of drives 3200 that are now described that can be used to interact with the guides to provide motive force to lift or lower the robot platform. The drives 3200 can be subdivided into two basic categories. First, there are drives that are structurally connected to the guides that cause the guides to expand/contract that results in the robot platform respectively rising/lowering. Second, there are drives 3200 that are connected independently of the guides. For example, the lift actuator 2708 in FIGS. 27 and 28 is a drive that expands/contracts independently of the guides to effect respective raising/lowering of the robot platform. These two categories of drives 3200 are now described in detail.

Figure 32:
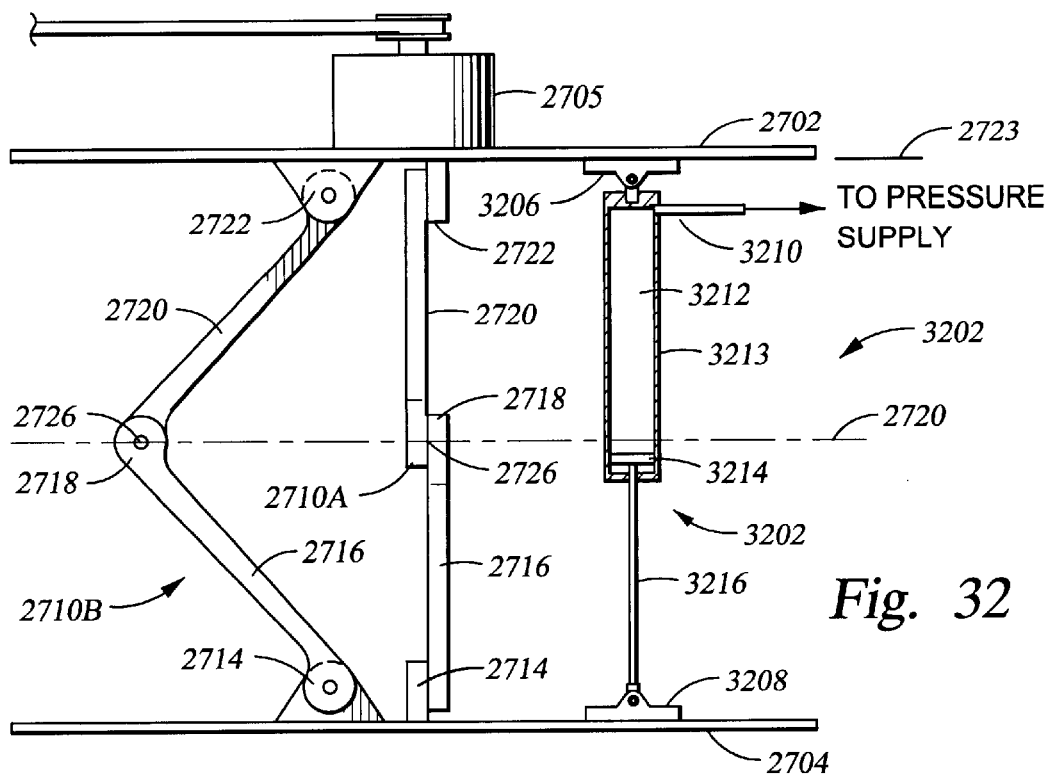
FIG. 32 is a side view of one embodiment of lift actuator.

An example of an embodiment of lift drive 3200 that is structurally independent of the lift guide 2710a, 2710b is a piston arrangement as shown in FIG. 32. A piston 3202 extends between the base 2704 and the robot platform 2702.

The piston 3202 is pivotably connected to robot platform 2702 by connector 3206. The piston 3202 is pivotably connected to base 2704 by connector 3208. The piston 3202 comprises conduit 3210, a cylinder 3213 enclosing a cylinder cavity 3212, a piston plunger 3214, and a connecting rod 3216. The conduit fluidly communicates fluid such as air from a pressure source, not shown, to the cylinder cavity 3212. The pressure applied from the pressure source to the pressure cavity is under the control of the controller 222. The piston plunger 3214 is in fluid communication with the fluid, e.g. air, pressure contained in the cylinder cavity 3212 in a manner to be controllably linearly displaceable within the cylinder 3213. The connecting rod 3216 is connected between piston plunger 3214 and connector such that linear displacement of the piston plunger relative to the cylinder will result is linear displacement of the robot platform 2702 relative to the base 2704. Such pistons are generally known, however in the robot arts relating to semiconductor substrates and will not be further described. It is desired to keep the piston as clean from impurities as possible to limit contamination to the substrate and the processing equipment. The piston 3202 may be expanded, by liquid of gas pressure, to raise the robot platform 2702 relative to the base 2704, and the piston may be contracted to lower the robot platform 2702 relative to the base 2704.

Figure 33:
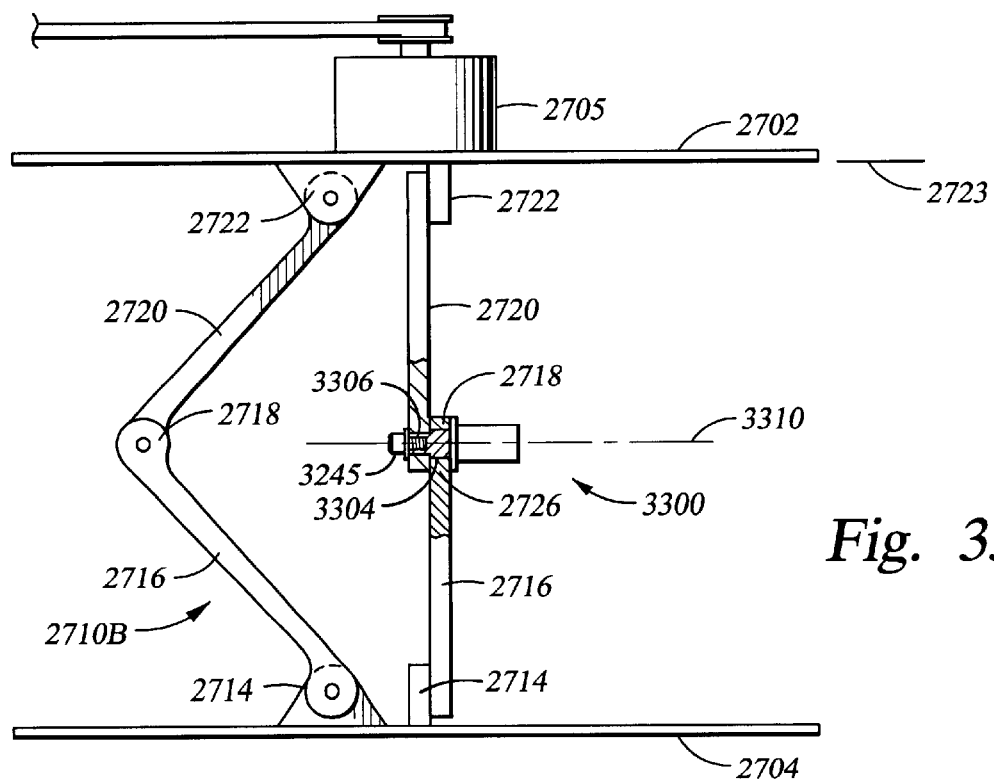
FIG. 33 is a side view of another embodiment of lift actuator.
Figure 34:
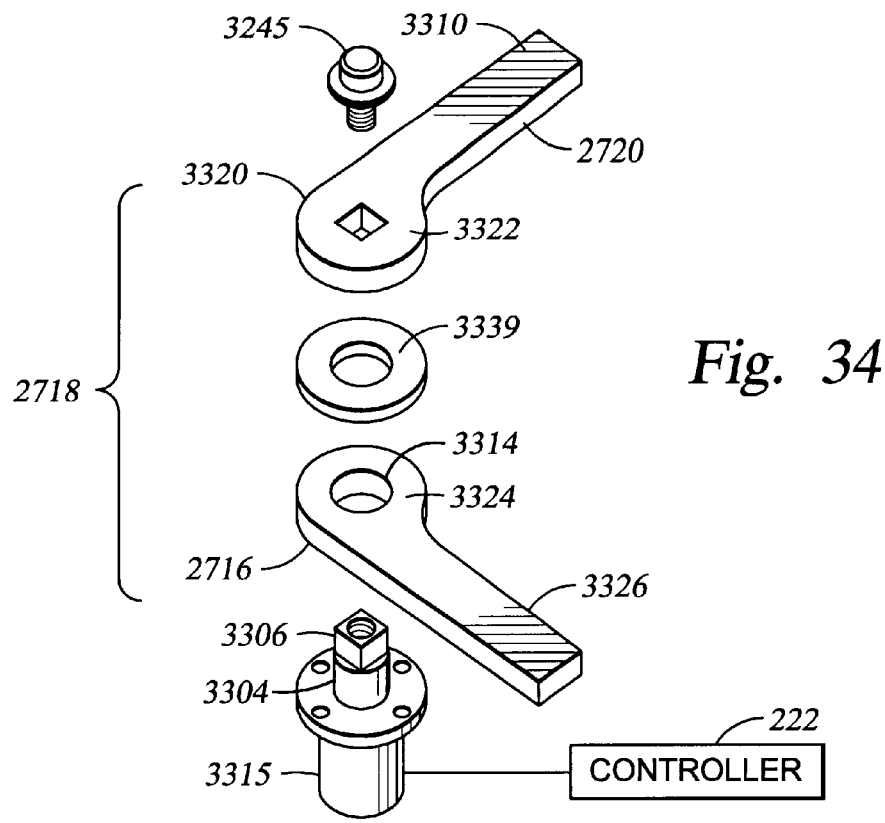
FIG. 34 is an exploded view of the lift actuator components shown in FIG. 33.

One embodiment of drive 3300 that is structurally integrated in a guide used in the embodiment of robot lift shown in FIG. 28 is shown in FIG. 33, and is illustrated in exploded detail in FIG. 34. The embodiment of drive 3300 shown in FIG. 33 is applied to the rotary segment 2718 that is positioned between the lower linkage number 2716 and the upper linkage member 2720 of guide 2710a in the embodiment shown in FIG. 27. The drive 3300 comprises a first mating body member 3304 connected to the linkage member 2716, a second mating body member 3306 connected to the linkage member 2740, and a motive element 3315. The first mating body member 3304 is mounted relative to the second mating body member 3306 in a manner to provide rotation therebetween about the axis shown by dotted line 3310. The mating body member 3306 is attached by a bolt 3245, adhesive, weld, rivet, or other known connector within a mating recess 3312 that is formed in the upper linkage member 2720. The mating configuration of the body member 3306 and the mating recess 3312 ensures that these two members rotate as a unit about an axis shown by arrow 3310 when assembled. The mating body member 3304 is attached within a mating recess 3314 that is formed in the lower linkage member 2716 by a bolt, adhesive, weld, rivet, or other similar fastener.

The mating configuration of the mating body member 3304 and the mating recess 3314 ensures that these two members rotate as a unit about the axis indicated by arrow 3310 when assembled. In this manner, any rotational motion of the mating body member 3306 about axis 3310 will be transmitted directly to the upper linkage member 2720. Additionally, any rotational motion of the mating body member 3304 about axis 3310 will be transmitted directly to the lower linkage member 2716. Surface configurations provide the mating connections between both the mating body member 3306 and the upper linkage member 2720 as well as the mating body member 3306 and the lower linkage member 2718. Alternatively, threaded configurations, notches, oblong configurations, cams, welds, bolts, adhesives, and/or any other known type of connections that is known to rigidly connect one element to another may be selected to provide such mating connections.

The motive element 3315 that provides motion between the mating body member 3304 and the mating body member 3306 may be a servo motor, a stepper motor, a controllable hydraulic motor, or any type of motive device that can effect translation between the mating body members 3304, 3306. The motive element provides smooth translation, i.e. lifting motion, of the robot platform 2702 relative to the base 2704. The controller 222 controls the operation of the motive element.

The mating recess 3312 of the upper linkage member 2720 extends from the lower surface 3320 of the upper linkage member 2720 a sufficient distance to contain the mating body member 3304. The mating recess 3312 does not extend to an upper surface 3322 of the upper linkage member 2720. The mating recess 3314 of the lower linkage member 2716 extends from an upper surface 3324 of the lower linkage member 2716 a sufficient distance to contain the mating body member 3306. The mating recess 3314 does not extend to a lower surface 3326 of the upper linkage member 2720.

A sealing gasket member 3339 is sealably attached to, and extends between, the lower surface 3320 of the upper linkage member 2720 and the upper surface 3324 of the lower linkage member 2716. The drive 3300 is enclosed within a sealed volume defined by the sealing gasket member 3330, the upper surface 3324 of the lower linkage member 2716, and the lower surface 3320 of the upper linkage member 2720. The sealed volume limits any impurities, lubricants, metal shaving, etc. produced by or contained within the drive 3300 from passing outside of the volume to contaminate any areas within the cluster tool or fountain plater 10. The embodiments of guides 2710a or 2710b containing the drive 330 provide a simplified, clean environment that is especially applicable to semiconductor substrate processes. The sealing gasket member 3330 is provided with sufficient resiliency to allow relative motion between the lower linkage member 2716 and the upper linkage member 2720 about the axis 3310. Though one embodiment envisions a sealed connection between the sealing gasket member 3330 and each of the linkage members 2716 and 2720, it is envisioned that a sliding sealing contact, for example as provided by a labyrinth seal, may be provided between the sealing gasket member 3330 and the lower linkage members 2716 and/or the sealing gasket member 3330 and the upper linkage members 2720. The thickness of the sealing gasket member 3330 can be relatively small since the upper surface 3324 of the lower linkage member 2716 is not separated by a large distance from the lower surface 3320 of the upper linkage member 2720, when the guide 2710 is in its assembled position.

Rotary guide mechanisms are relatively clean in operation because rotary elements have a small surface area that is exposed, and because the rotary elements are easily lubricated. The lubricated area is exposed to a clean or vacuum system so it is significant that the rotary guide mechanism is clean. A rotary system is structurally simple because it contains just the rotary joint.

When the drive 3300 is applied to the guide 2710a, the lift actuator 2708 can be removed. It is preferred that the drive 3300 be applied to only one guide 2710a or 2710b, but not both, to limit the possibility of drives coupled to different drives 3300 acting in opposed directions. However, one of a plurality of drives may be coupled to each one of a plurality of guides 2710c, 2710b, etc.

Figure 35:
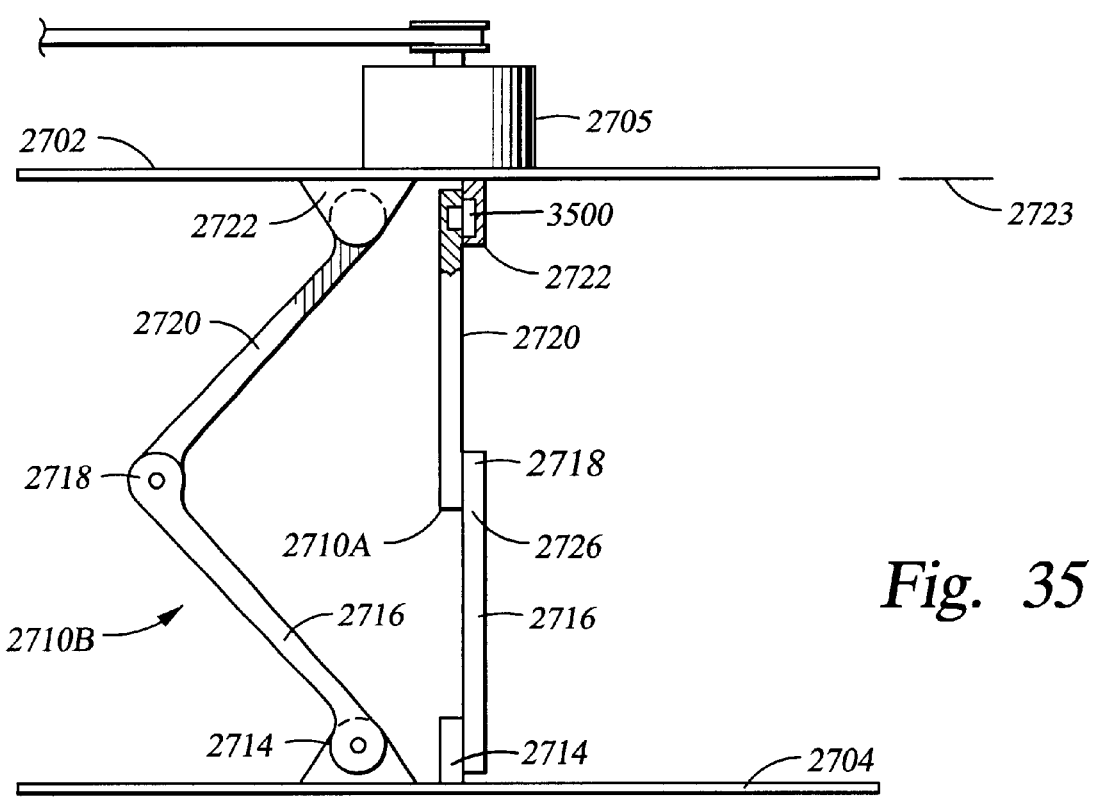
FIG. 35 shows one embodiment of a drive that is applied to a robot lift as shown in FIG. 30.

The embodiment shown in FIG. 33 applies the drive 3202 between the lower linkage member 2716 and the upper linkage member 2720. An embodiment such as FIG. 35 may be provided in which the drive 3202 is applied to the lower rotary mount 2714 or the upper rotary mount 2722. FIG. 35 shows an embodiment of guide 2710 positioned between a base 2704 and a robot platform 2702 including a drive 3500. The drive 3500 is structurally similar to the drive 3300 described above relative to FIGS. 33 and 34, however the drive 3500 is positioned between the upper rotary mount 2722 and the upper linkage member 2720. In an alternate embodiment, the drive 3500 is positioned between the lower rotary mount 2714 and the lower linkage member 2716. The actuation of one drive 3202 in one guide can effect extension, or retraction, of the lift guide 2706. Alternatively, more than one lift guides connected between the same robot platform and base may be provided.

The above embodiments shown relative to FIGS. 27 to 35 have been described in relation to a robot lift 2700 that is configured to lift a robot platform. It is envisioned that the structure and the operation described in the embodiments shown in FIGS. 27 to 35 may be applied to a robot lift device that lifts a cassette. In the cassette lift embodiment, the robot 2705 shown in the figures is replaced by a cassette.

4. Robot Extension Device

Figure 36:
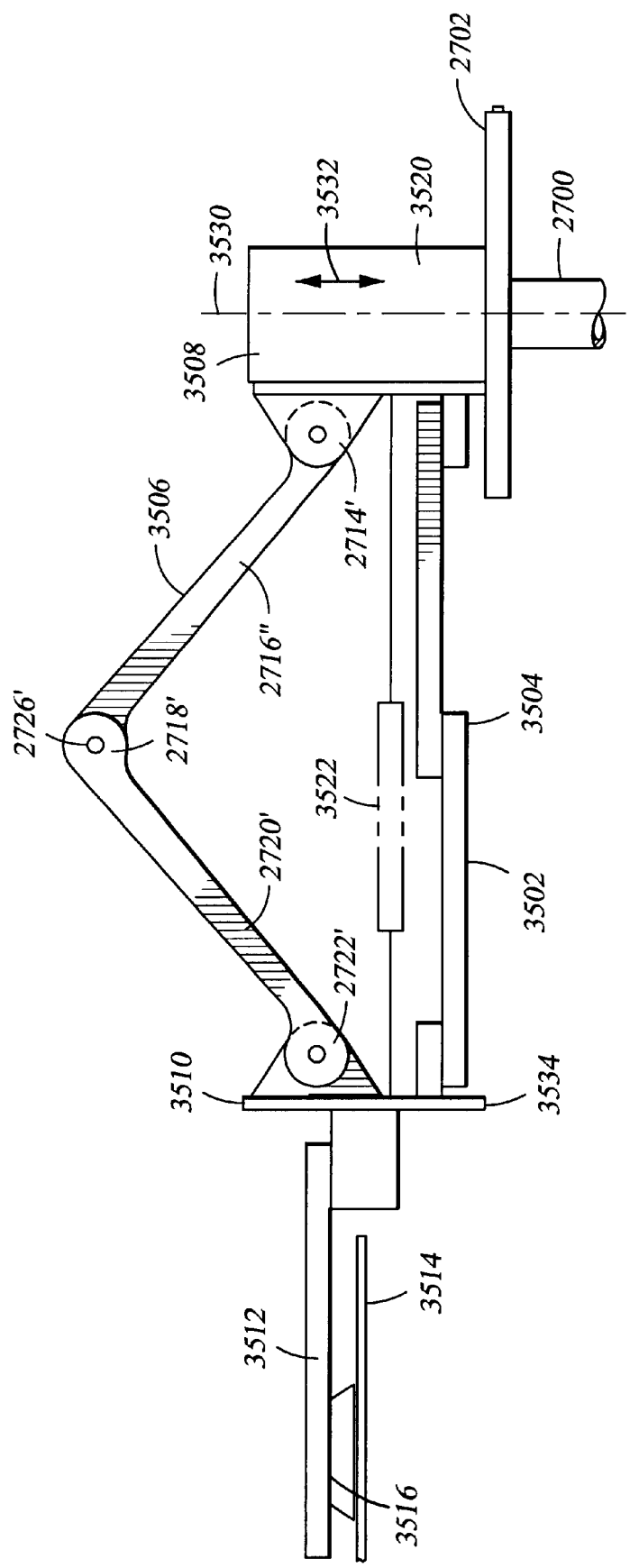
FIG. 36 shows one embodiment of robot extension device.

One embodiment of robot extension device 3502 is shown in FIG. 36. The robot extension device 3502 is preferably positioned on a robot platform 2702 of the type shown in FIGS. 27 to 35. Though the robot platform is shown being raised by a robot lift 2700 of a type described relative to FIGS. 27 to 35, any known type of robot lift may be used in conjunction with the robot extension device 3502. The robot extension device comprises a robot arm base 3508, a first robot arm 3504, a second robot arm 3506 that is perpendicular to the first robot arm, a distal platform 35100, and a robot extension actuator 3522. The structure and general operation of the robots arms 3504 and 3506 are identical to that of the guides 2710a and 2710b shown in FIGS. 27 to 35, and are provided with similar reference characters except with a primed notation. The robot arms 3504 and 3506 extend between, and are mounted on, both the robot arm base 3508 and the distal platform 3510 at an angle that is defined by the θ=360/N equation as described above.

The robot arm base 3508 is mounted to a robot hub 3520, that is in turn mounted to the robot platform 2702. The robot hub is configured to provide rotation of the robot arm base 3508, the robot extension device 3502, an end effector 3512, and a substrate 3514 supported by the end effector about a vertical axis shown as 3530. In certain embodiments, the robot hub can also provide displacement of the robot arm base 3508, the robot extension device 3502, an end effector 3512, and a substrate 3514 supported by the end effector in a vertical direction as indicated by arrow 3532.

The robot extension actuator displaces the distal platform 3510, the end effector 3514, and any substrate 3514 attached to the end effector in a direction towards, or away from, the robot arm base 3508 as shown by arrow 3534. During the displacement of the distal platform 3510 from the robot arm base 3508, the distal platform remains parallel to the robot hub 3520 due to the resistance of the first robot arm 3504 to lateral horizontal displacements relative to the robot hub. During the displacement of the distal platform 3510 from the robot arm base 3508, the distal platform extends in the same angle relative to the robot hub 3520 due to the resistance of the second robot arm 3506 to any motion about robot hub 3520 relative to axis 3530.

During operation of the robot extension device 3502, the robot extension actuator 3522 is extended or retracted to displace the distal platform 3510 respectively further from, or closer to, the robot arm base 3508. During travel of the distal platform 3510 from the robot arm base, both the first robot arm 3504 and the second robot arm 3506 extend, or retract, at the same rate. The distal platform 3510 therefore extends through, and remains within, parallel planes that remain substantially vertically aligned. Provided that the end effector 3512 maintains the substrate substantially perpendicular to the distal platform, the substrate will be maintained in the parallel planes during extension or retraction of the robot extension device 3502.

Although various embodiments that incorporate the teachings of the present invention have been shown and described in detail herein, those skilled in the art can readily devise many other varied embodiments that still incorporate these teachings.

What is claimed is:

1. A guide apparatus comprising a plurality of guide linkages, each one of the plurality of guide linkages comprises a pair of linkage members, each pair of the linkage members are rotatably connected about a guide pivot axis, wherein the guide pivot axis of each guide linkage is arranged in a direction opposed to the direction of the guide pivot axis of the remainder of the guide linkages.

2. The guide apparatus of claim 1, further comprising a robot device that is capable of robot motions within an instantaneous robot plane, wherein each guide pivot axis is located in an instantaneous linkage plane that extends substantially parallel to the instantaneous robot plane.

3. The guide apparatus of claim 2, wherein at least one of the plurality of guide linkages has a direction of instantaneous resistance to rotation that extends perpendicular to the instantaneous linkage plane.

4. The guide apparatus of claim 2, wherein the plurality of guide linkages comprises a first guide linkage and a second guide linkage, wherein the guide pivot axis of the first guide linkage is oriented within the instantaneous linkage plane in a direction perpendicular to the direction of the guide pivot axis of the second guide linkages.

5. A guide apparatus comprising:
a plurality of guide linkages, wherein each one of the plurality of guide linkages comprises a pair of linkage members, wherein each pair of linkage members is rotatably connected about a guide pivot axis, wherein the guide pivot axis of each guide linkage is arranged in a direction opposed to the direction of the guide pivot axis of the remainder of the guide linkages, wherein the plurality of guide linkages comprises a first guide linkage, a second guide linkage, and a third guide linkage, wherein the guide pivot axis of the first guide linkage, the second guide linkage, and the third guide linkage are each spaced from each other, within the instantaneous linkage-plane, by angles of 120 degrees; and
a robot device that is capable of robot motions within an instantaneous robot plane, wherein each guide pivot axis is located in an instantaneous linkage plane that extends substantially parallel to the instantaneous robot plane.

6. A guide apparatus comprising:
a plurality of guide linkages, wherein each one of the plurality of guide linkages comprises a pair of linkage members, wherein each pair of linkage members is rotatably connected about a guide pivot axis, wherein the guide pivot axis of each guide linkage is arranged in a direction opposed to the direction of the guide pivot axis of the remainder of the guide linkages, wherein the plurality of guide linkages comprises a first guide linkage, a second guide linkage, a third guide linkage, and a fourth guide linkage, wherein the guide pivot axis of the first guide linkage, the second guide linkage, the third guide linkage, and the fourth guide linkage are each spaced from each other, within the instantaneous linkage plane, by angles of 90 degrees; and a robot device that is capable of robot motions within an instantaneous robot plane, wherein each guide pivot axis is located in an instantaneous linkage plane that extends substantially parallel to the instantaneous robot plane.

7. A guide apparatus comprising:

a plurality of guide linkages, wherein each one of the plurality of guide linkages comprises a pair of linkage members, wherein each pair of linkage members is rotatably connected about a guide pivot axis, wherein the guide pivot axis of each guide linkage is arranged in a direction opposed to the direction of the guide pivot axis of the remainder of the guide linkages, wherein the plurality of guide linkages comprises N guide linkage, wherein the guide pivot axis of each one of the N guide linkages are each spaced from each other, within the instantaneous linkage plane, by angles of 360/N degrees; and a robot device that is capable of robot motions within an instantaneous robot plane, wherein each guide pivot axis is located in an instantaneous linkage plane that extends substantially parallel to the instantaneous robot plane.

8. A guide apparatus comprising a plurality of guide linkages, wherein each one of the plurality of guide linkages comprises a pair of linkage members, wherein each pair of linkage members is rotatably connected about a guide pivot axis, wherein the guide pivot axis of each guide linkage is arranged in a direction opposed to the direction of the guide pivot axis of the remainder of the guide linkages, wherein at least one of the plurality of guide linkages is a rotary guide linkage.

9. A guide apparatus comprising:

a plurality of guide linkages, wherein each one of the plurality of guide linkages comprises a pair of linkage members, wherein each pair of linkage members is rotatably connected about a guide pivot axis, wherein the guide pivot axis of each guide linkage is arranged in a direction opposed to the direction of the guide pivot axis of the remainder of the guide linkages, wherein a robot is rotationally mounted to the robot platform having an instantaneous robot plane.

10. The guide apparatus of claim 9, wherein the robot is rotationally mounted to the robot platform in a manner to allow travel of the robot within a plane substantially parallel to the instantaneous robot plane.

11. The guide apparatus of claim 9, wherein the guide linkages permit travel of the robot platform in a direction that is substantially perpendicular to the instantaneous robot plane.

12. A robot lift comprising: a plurality of guide linkages, wherein each one of the plurality of guide linkages comprises a pair of linkage members, wherein each pair of linkage members is rotatably connected about a guide pivot axis, wherein the guide pivot axis of each guide linkage is arranged in a direction opposed to the direction of the guide pivot axis of the remainder of the guide linkages.

13. A cassette lift comprising: a plurality of guide linkages, wherein each one of the plurality of guide linkages comprises a pair of linkage members, wherein each pair of linkage members is rotatably connected about a guide pivot axis, wherein the guide pivot axis of each guide linkage is arranged in a direction opposed to the direction of the guide pivot axis of the remainder of the guide linkages.

14. A robot extension device comprising: a plurality of guide linkages, wherein each one of the plurality of guide linkages comprises a pair of linkage members, wherein each pair of linkage members is rotatably connected about a guide pivot axis, wherein the guide pivot axis of each guide linkage is arranged in a direction opposed to the direction of the guide pivot axis of the remainder of the guide linkages.

15. A guide apparatus comprising:

a robot platform having an instantaneous robot plane; and a plurality of guide linkages, each one of the plurality of guide linkages comprises a pair of linkage members, each pair of the linkage members are rotatably connected about a guide pivot axis, each guide pivot axis is located in an instantaneous linkage plane that extends substantially parallel to the instantaneous robot plane, wherein the guide pivot axis of each guide linkage is arranged in a direction opposed to the direction of the guide pivot axis of the remainder of the guide linkages.

16. The guide apparatus of claim 15, wherein at least one of the plurality of guide linkages has a direction of instantaneous resistance to rotation that extends perpendicular to the instantaneous linkage plane.

17. The guide apparatus of claim 15, wherein the plurality of guide linkages comprises a first guide linkage and a second guide linkage, wherein the guide pivot axis of the first guide linkage is oriented within the instantaneous linkage plane in a direction perpendicular to the direction of the guide pivot axis of the second guide linkages.

18. The guide apparatus of claim 15, wherein the plurality of guide linkages comprises a first guide linkage, a second guide linkage, and a third guide linkage, wherein the guide pivot axis of the first guide linkage, the second guide linkage, and the third guide linkage are each spaced from each other, within the instantaneous linkage plane, by angles of 120 degrees.

19. The guide apparatus of claim 15, wherein the plurality of guide linkages comprises a first guide linkage, a second guide linkage, a third guide linkage, and a fourth guide linkage, wherein the guide pivot axis of the first guide linkage, the second guide linkage, the third guide linkage, and the fourth guide linkage are each spaced from each other, within the instantaneous linkage plane, by angles of 90 degrees.

20. The guide apparatus of claim 15, wherein the plurality of guide linkages comprises N guide linkage, wherein the guide pivot axis of each one of the N guide linkages are each spaced from each other, within the instantaneous linkage plane, by angles of 360/N degrees.

21. The guide apparatus of claim 15, wherein at least one of the plurality of guide linkages is a rotary guide linkage.

22. The guide apparatus of claim 15, wherein a robot is rotationally mounted to the robot platform.

23. The guide apparatus of claim 22, wherein the robot is rotationally mounted to the robot platform in a manner to allow travel of the robot within a plane parallel to the instantaneous robot plane.

24. The guide apparatus of claim 15, wherein the guide linkages permit travel of the robot platform in a direction that is substantially perpendicular to the instantaneous robot plane.

25. A method of assembling a plurality of guide linkages, each of the guide linkages comprising a pair of linkage members rotatably connected about a guide pivot axis, the method comprising:

mounting each guide pivot axis of each guide linkage in a direction that is opposed to the direction of the guide pivot axis of the remainder of the guide linkages.

26. The method of claim 25, wherein each of the guide linkages is secured between a robot platform and a base.

27. The method of claim 26, further comprising extending each of the plurality of guide linkages acts to raise the robot platform relative to the base while maintaining the robot platform in a level orientation.

28. The method of claim 26, further comprising retracting each of the plurality of guide linkages acts to lower the robot platform relative to the base while maintaining the robot platform in a level orientation.

29. The method of claim 25, further comprising positioning the assembled guide linkages in a robot lift.

30. The method of claim 25, further comprising positioning the assembled guide linkages in a cassette lift.

31. The method of claim 25, further comprising positioning the assembled guide linkages in a robot extension device.

* * * * *